(12) United States Patent
Henrichs

(10) Patent No.: US 6,879,615 B2
(45) Date of Patent: Apr. 12, 2005

(54) FCSEL THAT FREQUENCY DOUBLES ITS OUTPUT EMISSIONS USING SUM-FREQUENCY GENERATION

(76) Inventor: Joseph Reid Henrichs, 641 NE. Swann Cir., Lee's Summit, MO (US) 64088-8464

( * ) Notice: Subject to any disclaimer, the term of this patent is extended or adjusted under 35 U.S.C. 154(b) by 72 days.

(21) Appl. No.: 10/350,512

(22) Filed: Jan. 24, 2003

(65) Prior Publication Data

US 2003/0160254 A1 Aug. 28, 2003

Related U.S. Application Data

(63) Continuation-in-part of application No. 09/765,554, filed on Jan. 19, 2001, now abandoned.
(60) Provisional application No. 60/176,964, filed on Jan. 19, 2000.

(51) Int. Cl.$^7$ .............................. H01S 3/14; H01S 5/00
(52) U.S. Cl. ............................. 372/45; 372/68; 372/43; 372/44; 372/93; 372/100
(58) Field of Search ............................ 372/22, 43–46, 372/50, 68, 93, 99, 100

(56) References Cited

U.S. PATENT DOCUMENTS

| | | |
|---|---|---|
| 4,941,744 A | 7/1990 | Yokokura et al. |
| 4,942,585 A | 7/1990 | Ungar |
| 5,117,433 A | 5/1992 | Tatsuno et al. |
| 5,172,384 A | 12/1992 | Goronkin et al. |
| 5,206,872 A | 4/1993 | Jewell et al. |
| 5,208,800 A | 5/1993 | Isobe et al. |
| 5,335,300 A | 8/1994 | Hartman et al. |
| 5,341,390 A * | 8/1994 | Yamada et al. ................ 372/45 |
| 5,568,499 A | 10/1996 | Lear |
| 5,784,507 A | 7/1998 | Holm-Kennedy et al. |
| 5,832,017 A | 11/1998 | Ramdani et al. |
| 5,903,586 A | 5/1999 | Ramdani et al. |
| 5,943,359 A | 8/1999 | Ramdani et al. |
| 5,978,398 A | 11/1999 | Ramdani et al. |
| 6,081,542 A | 6/2000 | Scaggs |
| 6,252,896 B1 * | 6/2001 | Tan et al. ...................... 372/50 |
| 6,327,280 B1 | 12/2001 | Ducellier et al. |
| 6,350,997 B1 | 2/2002 | Saeki |
| 6,424,669 B1 | 7/2002 | Jiang et al. |
| 6,625,195 B1 | 9/2003 | Henrichs |
| 6,704,336 B1 | 3/2004 | Henrichs |
| 2003/0160254 A1 | 8/2003 | Henrichs |
| 2003/0185265 A1 | 10/2003 | Henrichs |
| 2003/0185266 A1 | 10/2003 | Henrichs |
| 2004/0066821 A1 | 4/2004 | Henrichs |

* cited by examiner

Primary Examiner—George Eckert
Assistant Examiner—Matthew Landau
(74) Attorney, Agent, or Firm—Kirkpatrick & Lockhart LLP

(57) ABSTRACT

A "Folded Cavity Surface Emitting Laser" (FCSEL) sum frequency generating device capable of generating a second harmonic at room temperatures with high efficiency and output power, while having a small size, low energy consumption, and a low manufacturing cost. A FCSEL sum frequency generating semiconductor diode laser has a multilayered structure that comprises a mode discriminating polyhedral shaped prism waveguide, which is located at one end of two light emitting diodes, a partial photon reflecting mirror, which is located at the opposite end of the two light emitting diodes, and a phase-matching sum-frequency generating superlattice, which is located between the polyhedral shaped prism waveguide and the partial photon reflecting mirror.

33 Claims, 20 Drawing Sheets

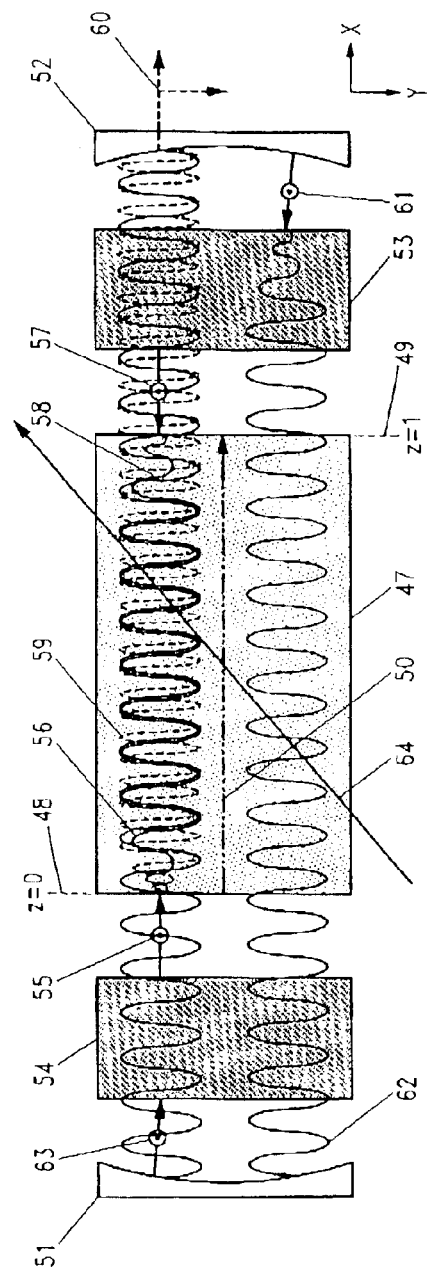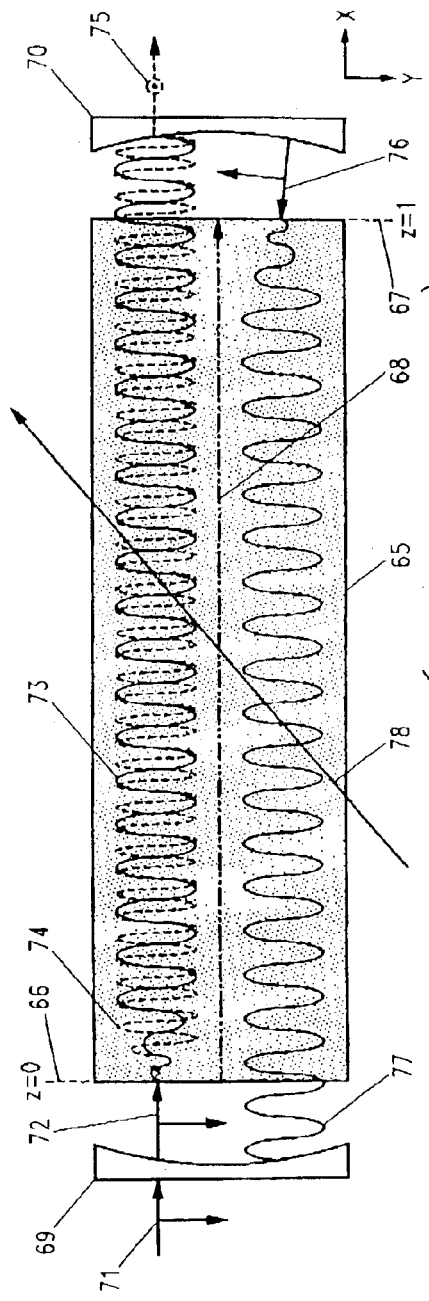
FIG. 16 (Prior Art)
FIG. 17 (Prior Art)

FCSEL THAT FREQUENCY DOUBLES ITS OUTPUT EMISSIONS USING SUM-FREQUENCY GENERATION

CROSS-REFERENCE TO RELATED APPLICATIONS

This application claims priority under 35 U.S.C. § 120 as a continuation-in-part application of my Non-provisional Patent Application Ser. No. 09/765,554, filed Jan. 19, 2001 now abandoned, which claims priority to Provisional Patent Application, Ser. No. 60/176,964, which was filed in the U.S. Patent and Trademark Office 2000, January 19th.

This patent application uses, as the preferred embodiment of the polyhedral prism waveguide, the corner-cube prism waveguide of my Provisional Patent Application, Ser. No. 60/208,988, which was filed in the U.S. Patent and Trademark Office Jun. 1, 2000.

This patent application uses, as the preferred embodiment of the polyhedral prism waveguide, the corner-cube prism waveguide of my Non-provisional Patent Application, Ser. No. 09/357,685, which was filed in the U.S. Patent and Trademark Office on Jul. 20, 2000, now U.S. Pat. No. 6,625,195.

TECHNICAL FIELD OF INVENTION

The present invention relates to semiconductor laser-diodes, or more specifically to frequency-doubled surface emitting semiconductor laser-diodes. Typically, these laser-diodes have multilayered vertically oriented optical cavity structures that comprise a substrate, a double-heterostructure (LED) "Light Emitting Diode", a zinc-blend semiconductor material comprised superlattice, and two feedback providing contra-reflecting mirror structures. Further, these multilayered structures altogether are used to provide for an optical cavity capable of producing a frequency doubled laser emission output. More specifically, the present invention relates to a frequency-doubled (FCSEL) "Folded Cavity Surface Emitting Laser" that is capable of a highly efficient extraction of a second harmonic (i.e., especially monochromatic light, such as monochromatic violet, blue, or green light) in a predetermined direction perpendicular to a substrate.

BACKGROUND OF THE INVENTION

Light-emitting devices that introduce high-power solid-state laser light or high-power semiconductor laser light into a non-linear optical crystal (e.g., crystalline substances, such as $LiNbO_3$ and $KNbO_3$, compound semiconductor material, such as GaAs, or non-linear organic substances, etc.) to generate a second harmonic emission are well known (e.g., refer to A. Yariv: Introduction to Optical Electronics, 4th ed.; Saunders College Publishing, (Holt, Rinehart and Winston, 1991)). Further, it is also well known that when laser emissions from diode-pumped high power solid-state lasers are introduction of into birefringent uniaxial crystalline materials; e.g., such as ($LiNbO_3$) "Lithium-Niobium-Trioxide", ($KNbO_3$) "Potassium-Niobium-Trioxide", (GaAs) "Gallium-Arsenide", and/or (ZnSSe) "Zinc-Sulfur-Selenium" the result is the emission of a frequency-doubled wavelength-halved laser emission.

In addition, it is also well known that by using the simultaneous application of the two second-order nonlinear optical processes generally termed (SFG) "Sum Frequency Generation" and (SHG) "Second Harmonic Generation" within uniaxial birefringent crystalline materials, because the birefringent crystalline materials offer large nonlinear coefficients, the results will be a frequency-doubled laser emission at normal room temperatures.

Furthermore, to construct this kind of solid-state laser device, the before mentioned birefringent uniaxial crystal has to be arranged between a pair of optical reflectors, while a single or multiple source of red-light laser emission is projected through the previously mentioned uniaxial birefringent crystal, generating therein a nonlinear second-order harmonic (i.e., a process whereby two incident photons are converted into a single photon at the second harmonic) exhibited as a frequency-doubled laser emission. These high-frequency laser emissions are then extracted from a single reflector that is transparent to the frequency-doubled emission. It is, however, the large size of these solid-state lasers, being composed of multiple components, that makes their production very costly, and their emission output very difficult to control.

Furthermore, this type of nonlinear second-order solid-state laser device takes advantage of an optical phenomenon, known generally as birefringence, to accomplish what is normally called velocity matching (i.e., sometimes called by those well versed in the art as phase-matching). Moreover, the double-refracting effects (i.e., birefringence) exhibited by most crystals can be used to phase-match both the extraordinary polarized (i.e., sometimes called E-wave polarized light) and the ordinary polarized (i.e., sometimes called O-wave polarized light) light-rays as they, upon incidence, travel through the crystalline striations that typically exist within uniaxial crystals.

For example, using an uniaxial birefringent crystal it is possible to make the ray velocity of the fundamental (corresponding to an ordinary ray or O-ray) equal (equal meaning to become phase matched) the ray velocity of the second harmonic (corresponding to an extraordinary ray or E-ray), by making sure that the birefringent uniaxial crystal was been grown from a non-congruent melt that exhibits an internal growth direction that corresponds to its optical propagation direction (the direction of phase matched ray velocities) for both the fundamental and second-harmonic emission that will propagate along a common optical axis through its structure.

Consequently, this construct will produce a phase-match between the fundamental and the second-harmonic emission; removing what normally causes the formation of interference patterns that are destructive to the generation of nonlinear second-order harmonics. However, it is very difficult and costly to execute phase-matching within the birefringent crystalline materials; e.g., such as ($LiNbO_3$) "Lithium-Niobium-Trioxide", ($KNbO_3$) "Potassium-Niobium-Trioxide", (GaAs) "Gallium-Arsenide", and/or (ZnSSe) "Zinc-Sulfur-Selenium", while working with the micron-sized architectures of VCSEL and related laser-diode technologies. Further, as illustrated in FIGS. 16, and 17, this type of device comprises a laser source 55, 57, 71 and non-linear optical crystals 47, 65 as being arranged between a pair of optical reflectors 51, 52, 69, 70 and where laser light is launched through the non-linear optical crystals 55, 72 to generate a second harmonic of the fundamental pump and extracted using the reflector 52, 70, which has the higher transmission for the second harmonic emission. However, the larger the device the greater is its cost of manufacturing, and since this type of laser comprises a multitude of components, it can become extremely difficult control; resulting in unstable second-harmonic emission.

In addition, other devices are well known, which extract a second harmonic from the end surface of what is normally striped GaAs or AlGaAs semiconductor lasers (see, e.g., N. Ogasawara, R. Ito, H. Rokukawa and W. Katsurashima: Jpn. J. Appl. Phys., Vol. 26 (1987) 1386), but the power of the fundamental wave occurring inside these devices is low due to a low end facet reflectivity. Additionally, the absorption loss is also large due to a stripped-laser's long cavity. These devices have even greater difficulty in achieving a phase-matching structure. Consequently, these disadvantages make it impossible to generate the second-harmonic with high efficiency. Therefore, further thought was directed towards the extraction of a second harmonic in the direction perpendicular to the cavity. See, e.g., D. Vakhshoori, R. J. Fisher, M. Hong, D. L. Sivco, G. J. Zydzik, G. N. S. Chu and A. Y. Cho: Appl. Phys. Lett., Vol. 59 (1991) 896. However, a device of the type disclosed in the above publication, the output power of the second harmonic was small, due to the fundamental emission being distributed over to wide a range, the condensing of the fundamental light was to difficult to achieve and therefore, at present the practical application for this device has yet to be realized.

Moreover, Semiconductor laser-diodes, specifically semiconductor laser-diodes with a multilayered vertical cavity (vertical orientation that is perpendicular to the substrate of the semiconductor diode) have become widely known as (VCSELs) "Vertical Cavity Surface Emitting Lasers". Moreover, VCSEL light sources have been adopted for gigabit-Ethernet applications in a remarkably short amount of time. Further, due to their reduced threshold current, circular output beam, inexpensive and high-volume manufacture VCSELs are particularly suitable for multimode optical-fiber local-area networks (i.e., LANs).

Moreover, prior art teaches the a typical VCSEL is selectively oxidized, and therefore will contain an oxide aperture within its vertical cavity that produces strong electrical and optical confinement, enabling high electrical-to-optical conversion efficiency and minimal modal discrimination; allowing emission into multiple transverse optical-modes. Moreover, such multi-mode VCSEL lasers make ideal local area network laser light sources. VCSELs that emit in a single optical transverse mode are ever increasingly being sought-out for emerging applications including data-communication using single-mode optical fiber, barcode scanning, laser printing, optical read/write data-heads, and modulation spectroscopy.

Consequently, achieving single-mode operation in selectively oxidized VCSELs is a challenging task, because the inherent index confinement within these high-performance lasers is very large. VCSELs have optical-cavity lengths approximately one-wavelength and therefore, operate within a single longitudinal optical-mode. However, because of their relatively large cavity diameters (i.e., 5.0- to 20.0-$\mu$m diameters), these lasers usually operate in multiple transverse modes. Wherein, each transverse mode will possess a unique wavelength and what is sometimes called a transverse spatial intensity-profile (i.e., intensity pattern). Moreover, for applications requiring a small spot size or high spectral purity, lasing in a single transverse mode, usually the lowest-order fundamental mode ($TEM_{00}$) is most desired.

In general, pure fundamental mode emission within a selectively oxidized VCSEL can be attained by increasing the optical loss to higher-order transverse modes relative to that of the fundamental mode. By selectively creating optical loss for any particular mode, we increase modal discrimination, which consequently leads to a frequency-doubled FCSELs operation in a single transverse optical-mode as well. Moreover, strategies for producing VCSELs that operate in single transverse optical-mode have recently been developed. Further, the previously mentioned strategies are based either on introducing loss that is relatively greater for high-order optical-modes and, thereby relatively increasing gain for the fundamental transverse optical-mode, or on creating greater gain for the fundamental transverse optical-mode; whereby increased modal loss for higher-order optical-modes has been demonstrated by three different techniques.

Moreover, the first approach to modal discrimination uses an etched-surface relief on the periphery of the top facet that selectively reduces the reflectivity of the top mirror for the higher-order transverse optical-modes. The advantage of this technique is that the etched ring around the edge of the cavity in the top quarterwave mirror-stack assembly can be produced during the VCSEL's fabrication by conventional dry-etching, or it can be post processed on a completed VCSEL die using focused ion-beam etching. A disadvantage, however, of etched-surface relief is that it requires careful alignment to the oxide aperture and can increase the optical scattering loss of the fundamental transverse optical-mode, as manifested by the relatively low (i.e., less than 2.0-mW) single-mode output powers that have been reported. Therefore, it would be more desirable to introduce mode-selective loss into the VCSEL epitaxial structure to avoid extra fabrication steps and to provide self-alignment.

Moreover, two such techniques are the use of tapered oxide apertures and extended optical cavities within VCSELs. The first approach pursued at Sadia National Laboratories (i.e., Albuquerque, N.Mex.) is predicated on designing the profile of the oxide aperture tip to preferentially increase loss to higher-order transverse optical-modes. The aperture-tip profile is produced by tailoring the composition of the (AlGaAs) "Aluminum-Gallium-Arsenide" layers, which are oxidized to create the aperture within the before mentioned VCSEL. A VCSEL containing a tapered oxide whose tip is vertically positioned at a null in the longitudinal optical standing wave can produce greater than 3.0-mW of single-mode output, and greater than 30-dB of side-mode suppression. Creating this structure, however, requires a detailed understanding of the oxidation process, and produces additional loss for the previously mentioned fundamental transverse optical-mode as well.

In addition, a second way to increase modal discrimination is to extend the optical cavity length of VCSELs and, thus increase the diffraction loss for the higher-order transverse optical-modes. Researchers at the University of Ulm (i.e., Ulm, Germany) have reported single-mode operation up to 5-mW using a VCSEL with a 4.0-$\mu$m thick cavity spacer inserted within the optical-cavity. The problem, however, is that by using even-longer cavity spacers can introduce multiple longitudinal optical-modes (i.e., causing what is sometimes called spatial hole burning), but single-transverse-optical-mode operation up to nearly 7-mW has been demonstrated. It is interesting to note that VCSELs containing multiple wavelength cavities do not appear to suffer any electrical penalty, although careful design is required to balance the trade-offs between the modal selectivity of the transverse and longitudinal optical-modes.

Finally, manipulating the modal gain rather than loss also can also produce single-mode VCSELs. A technique to spatially aperture laser gain independently of the oxide aperture has been developed at Sadia National Laboratories. The essential aspect of these VCSELs is the lithographically defined gain region, which is produced by intermixing of quantum-well active regions at the lateral periphery of the laser cavity. Typically, fabrication processes for the previously mentioned VCSELs begins with the growth of the VCSEL's bottom DBR Bragg quarterwave mirror-stack assembly onto an optical or semiconductor substrate material, the VCSEL's active-region containing the multiple quantum-well, and the VCSEL's top DBR based quarterwave mirror-stack assembly.

Moreover, the VCSEL's quantum-wells are homogenized by ion-implantation around masked regions that form laser cavities and, moreover using an epitaxial process of material deposition, like MBE or MOCVD, a second DBR quarterwave mirror-stack assembly epitaxially deposited. The resultant VCSEL has a central quantum-well active-region that preferentially provides gain for the fundamental mode. Consequently, for this approach a single-mode output of more than 2-mW with a side-mode-suppression ratio greater than 40-dB is obtained. Although, this approach requires greater fabrication complexity, it is anticipated that higher performance can be reached with further refinement of process parameters. Because of the new and greater demands of VCSEL applications, new types of single-mode VCSELs are currently under development at numerous laboratories around the world. Further, the techniques demonstrated to date introduce modal discrimination by increasing the optical loss for the higher-order modes or by increasing the relative gain of the fundamental optical-mode.

Moreover, lasers and (LEDs) "Light Emitting Diodes" are currently being used as sources of blue-light in various fields of optoelectronics, such as optical measurement, optical transmission, and optical displays. Light-emitting devices, which use LEDs (i.e., particularly those that Light-emitting devices, which use LEDs (i.e., particularly those that emit blue-light) utilizing like (GaN) "Gallium-Nitride" based semiconductors are well known (see, e.g., refer to S. Nakamura, T. Mukai and M. Senoh: Jpn. J. Appl. Phys., Vol. 30 (1991) L1998). However, since the line width of LED light is wide (i.e., a single wavelength cannot be created) lasers have in recent years been more widely used than LEDs in the field of optoelectronics. For example, with some (ZnCdSSe) "Zinc-Cadmium-Sulfur-Selenium" based semiconductor lasers, an acceptable blue-light output is obtainable (see, e.g., M. A. Hasse, J. Qiu, J. M. DePuydt and H. Cheng: Appl. Phys. Lett, Vol. 59 (1991) 1272). Nevertheless, under the present circumstances such devices can only be used upon cooling to extremely low temperatures and, therefore are impractical as light sources at a room temperature.

Moreover, semiconductor lasers and LEDs have been widely used as sources of blue light in various fields of optoelectronics; moreover, fields such as optical datastorage, optical data-transmission, optical displays, and optical measuring technologies. For example, LEDs constructed from binary semiconductor materials like GaN have been used to produce non-coherent blue-light emissions for various optoelectronic applications. However, since the before mentioned LEDs produce non-coherent light emissions, which often display wide line-width properties, the more complex semiconductor lasers, over recent years, have become more widely used than the previously mentioned LEDs in the before mentioned field of optoelectronics. For example, quaternary ZnCdSSe based semiconductor lasers can produce an acceptable output of coherent blue-light laser emissions, but only when operated at extremely low-temperatures. The problem is that they will not presently operate at the room temperatures commonly used in every day life of human beings; therefore, they have no practical application in the real world (i.e., real world meaning a world outside an environmentally controlled laboratory environment).

Typically, for a VCSEL the main photon producing structure is a double-heterostructure semiconductor Light Emitting Diode, which is often constructed from latticed-matched extrinsic semiconductor binary materials; e.g., such as (GaAs) "Gallium-Arsenide" and (GaSb) "Gallium-Antimonide", or from latticed-matched extrinsic semiconductor ternary materials; e.g., such as (AlGaAs) "Aluminum-Gallium-Arsenide" and (InGaAs) "Indium-Gallium-Arsenide", or from latticed-matched extrinsic semiconductor quaternary materials; e.g., such as (InGaAsP) "Indium-Gallium-Arsenic-Phosphide" and (InGaAsSb) "Indium-Gallium-Arsenide-Antimonide".

Furthermore, prior art also teaches that a VCSEL's double-heterostructure active-region will typically contain either a (SQW) "Single Quantum Well" active-area (i.e., sometimes called a SQW laser), or a (MQW) "Multiple Quantum Well" active-area (i.e., sometimes called a MQW laser). In addition, a prior-art VCSEL will often have contra-reflecting mirrors deposited onto each of the two sides of its light emitting active-region. Typically, a prior-art VCSEL's first mirror-stack assembly, while being totally reflecting, circular in shape, and planar-flat in its deposition is deposited onto a prior-art VCSEL's reflective-base substrate layer (e.g., the substrate being typically constructed from highly reflective corundum or a nickel-aluminum alloy). While, a prior-art VCSEL's second mirror-stack assembly, being only partially reflecting, circular in shape, and planar-flat in its deposition is deposited as a prior-art VCSEL's top-most and final light reflecting structure.

Moreover, prior-art also teaches that a VCSEL will have one contra-reflecting dielectric or conductive mirror-stack assembly deposited onto each of its active-region's two opposing sides, or more succinctly, the previously mentioned prior-art VCSEL's first mirror-stack assembly would be deposited at and onto its before mentioned reflective-base substrate layer, while its second mirror-stack assembly would be deposited at the top of a prior art VCSEL's vertical cavity creating therein an optically resonate structure that amplifies into laser emissions photons, which were produced by the before mentioned prior-art VCSEL's double-heterostructure active-region's active-area.

In addition, to better understand the structural differences that lie between the present frequency doubling frequency-doubled FCSEL invention and prior art VCSEL technology, an example of a prior art VCSEL design is described below. Moreover, prior art as illustrated in FIGS. 1, 2, and 3 shows a typical example of a high frequency VCSEL design that uses the well known process of recombining 'electron/hole' radiation (i.e., what is sometimes called 'radiative recombination') to produce fundamental intra-cavity light, which is amplified into laser emissions within the VCSEL's optical-cavity. Prior art, as illustrated in FIGS. 1, 2, and 3, shows an example of a high-frequency VCSEL, which uses a metallic supporting substrate 22 (FIG. 1) as both a base-reflecting mirror structure 22 (FIG. 2), and a substrate for the subsequent growth of its multilayered structures. This is where VCSELs typically begin the epitaxial growth of multilayered materials using a well-known form of deposition such as (MBE) "Molecular Beam Epitaxy" or (MOCVD) "Metal Organic Chemical Vapor Deposition".

Furthermore, as illustrated in FIGS. 1, 2, and 3, prior art teaches as an alternative embodiment that VCSELs using a metallic substrate 22 (FIG. 3), when made conductive, also serve as the VCSEL(s) negative electrode. The metallic substrate 22 if it comprises a (Ni—Al) "Nickel-Aluminum" alloy-mixture exhibits between 8% to 12% material lattice mismatch, or more specifically a 10% material lattice mismatch to binary GaN, which is the principal semiconductor material deposited later in many subsequent layers. Nevertheless, despite the lattice mismatch exhibited by Ni—Al it is still the preferred metallic alloy-mixture for this kind of electron conducting metallic substrate 22. Moreover, the Ni—Al metallic substrate 22 (FIG. 3) also needs to exhibit a highly reflective property as well, and should have a surface roughness less than 15 Å.

In addition, as illustrated in FIGS. 1, 2, and 3, prior art also teaches that several layers of (AlN) "Aluminum-Nitride" material can be successfully grown layer-upon-layer using MBE or MOCVD to altogether create a buffer-layer 23 (FIG. 3) having a thickness of only a few atoms, which is used for facilitating the epitaxial growth of subsequent semiconductor layers that will entirely comprise the VCSEL's structure. Further, as illustrated in FIGS. 1, 2, and 3, prior art also teaches that a VCSEL device such as the one described above has its first Bragg quarterwave mirror-stack assembly 24 grown epitaxially onto the top outermost surface of AlN comprised buffer-layers 23A, 23B, 23C, 23D (FIG. 3) using any well known epitaxial crystal growing method such as MBE or MOCVD.

In addition, as illustrated in FIGS. 1, 2, and 3, prior art also teaches a VCSEL's first quarterwave mirror-stack assembly 24 as being made from a plurality of alternating layers comprised as mirror pairs; or more precisely, a multitude of single pairs of alternating layers 24A, 24B (FIG. 3), which are constructed from (GaN/AlGaN) semiconductor materials to complete a single mirror pair. Further, a plurality of alternating layers, which will include one or more layers of N doped (GaN) "Gallium-Nitride" 24A, 24C, 24E, 24G, 24I (FIG. 3) a high-refractive semiconductor material and N doped (AlGaN) "Aluminum Gallium Nitride" 24B, 24D, 24F, 24H, 24J (FIG. 3) a low-refractive semiconductor material.

For example, as illustrated in FIGS. 1, 2, and 3, prior art teaches that a layer 24A of N doped GaN is epitaxially deposited onto the top and outermost surface of a VCSEL's last buffer-layer 23 (FIG. 3), while a layer 24B (FIG. 3) of N doped AlGaN is subsequently and epitaxially deposited onto the top and outermost surface of the VCSEL's first N doped GaN layer 24A (FIG. 3). Further, if additional mirror-pairs are required, several more layers that make-up additional mirror-pairs can be deposited onto the existing and previously deposited layers of GaN and AlGaN materials 24A, 24B, 24C, 24D, 24E, 24F, 24H, 24I (FIG. 3). Additionally, prior art also teaches that in order to increase the reflectivity of a VCSEL's first quarterwave mirror-stack assembly 24 (FIG. 3) to the required amount of total-reflectance, many additional mirror-pairs will be required, and depending on the frequency of light being reflected, as many as several hundred mirror-pairs might be needed.

In addition, prior art teaches that it should be understood that the thickness and doping levels of each deposited layer used within any VCSEL is precisely controlled. Wherein, any deviation from designed parameters, no matter how slight, would affect the performance of any VCSEL (i.e., frequency range, flux intensity). For example, as illustrated in FIGS. 1, 2, and 3, prior art teaches that a VCSEL's emitter-layer 33, if designed to emit laser-light having a wavelength of 200-nm, should have the same material thickness as each of the other remaining alternated layers that comprise both of the VCSEL's quarterwave mirror-stack assemblies 24, 32 (FIG. 3), and that this thickness dimension is to be one-quarter of one wavelength of the VCSEL's laser emission. Therefore, as illustrated in FIGS. 1, 2, and 3, a device like the one described above, having an emission wavelength of 200-nm, the thickness dimension for all layers used to comprise a VCSEL's first and second quarterwave mirror-stack assemblies 24, 32 (FIG. 3) must equal 50-nm; moreover, this dimension being equal to one-quarter of the VCSEL's emission wavelength.

In addition, prior art also teaches that the doping of the VCSEL is accomplished by the addition of various dopant materials (e.g., n-type electron donating dopants like Phosphorus and p-type electron accepting dopants like Boron) to construction material during a MBE or a MOCVD process of epitaxial deposition. Typically, a VCSEL will use many different dopant concentrations of specific dopant materials within the several different extrinsic semiconductor layers that make-up its various planar structures.

For example, the alternating layers of GaN 23A (FIG. 3) and N doped AlGaN 23B (FIG. 3), which are used to facilitate the construction of a high-frequency VCSEL's first quarterwave mirror-stack assembly 24 (FIG. 3), can be made n-type and therefore, conductive when doped with either Selenium or Silicon, using a dopant concentration ranging from 1E15- to 1E20-cm.$^{-3}$, while a preferred range of doping would be from 1E17- to 1E19-cm.$^{-3}$, and a nominal concentration range of doping would be from 5E17- to 5E18-cm.$^{-3}$. The percentage of dopant composition exhibited by a VCSEL's first quarterwave mirror-stack assembly 24 (FIG. 3) could be stated as $(Al_{1-x}Ga_xN/GaN)$, where x represents a variable of 0.05 to 0.96, while in a preferred embodiment x would represent an amount greater than 0.8.

Therefore, as illustrated in FIGS. 1, 2, and 3, prior art teaches that once the plurality of alternating layers used in a VCSEL's first quarterwave mirror-stack assembly 24 have been deposited onto the top and outermost surface of the VCSEL's AlN buffer-layers 23, then the VCSEL's first contact-layer 25 (FIG. 3), comprising a highly $n^+$ doped (GaN) "Gallium-Nitride" binary semiconductor material, can be epitaxially grown onto the top and outermost surface of the last alternating layer of the VCSEL's first quarterwave mirror-stack assembly 24 (FIG. 3). Further, prior art also teaches that a VCSEL's first contact-layer 25, while providing for connectivity to the VCSEL's n-metal contact 27 (FIG. 3) and to the VCSEL's n-metal contact-ring 26 (FIG. 1), also enhances the reliability of the VCSEL's design by preventing the migration of carrier-dislocations and the like to the VCSEL's active-region 28 (FIG. 3).

Furthermore, as illustrated in FIGS. 1, 2, and 3, in order to prevent overcrowding that can occur within the drawing figures, each cladding-layer is illustrated as being a single layer 28A, 28C (FIG. 3). It should also be understood that each cladding-layer could comprise a multitude of layers. Wherein, each cladding-layer 28A, 28C (FIG. 3) is epitaxially deposited upon the top outmost surface of a previously deposited layer, with each cladding-layer 28A, 28C being comprised from an N doped or P doped AlGaN ternary semiconductor material.

In addition, as illustrated in FIGS. 1, 2, and 3, prior art teaches that a VCSEL's active-region 28 (FIG. 3), which is illustrated here as being represented by a single layer, should be comprised with ether a (SQW) "Single Quantum Well", a (MQW) "Multiple Quantum Well", and/or some other epitaxially deposited gain-medium, all of which are well known by those well versed in the art. However, the active-region structure, regardless its form is to be epitaxially deposited upon the top and outermost surface of the VCSEL's first cladding-layer 28A (FIG. 3). The VCSEL's first cladding-layer 28A is epitaxially constructed from N doped AlGaN extrinsic ternary semiconductor material, using MBE or MOCVD to deposit the N doped AlGaN material upon the top outmost surface of the VCSEL's first contact-layer 25.

However, prior art also teaches that a VCSEL's active-region 28 (FIG. 3) could also be comprised as having one or more quantum-well cladding-layers and one or more quantum-well layers, as is typical for a MQW structure. In particular, having a first quantum-well cladding-layer and a second quantum-well cladding-layer with a quantum-well layer positioned therein, between the first quantum-well cladding-layer and the second quantum-well cladding-layer.

Furthermore, as illustrated in FIGS. 1, 2, and 3, prior art shows that a VCSEL's active-area 28B (FIG. 3) can also be comprised as having a SQW, which is constructed from (InGaN) "Indium-Gallium-Nitride" extrinsic ternary semiconductor material, using MBE or MOCVD to epitaxially deposit the InGaN material upon the top outermost surface of the VCSEL's first cladding layer 28A. While, as illustrated in FIGS. 1, 2, and 3, a VCSEL's second cladding-layer 28C (FIG. 3) is constructed from P doped (AlGaN) "Aluminum-Gallium-Nitride" extrinsic ternary semiconductor material, using MBE or MOCVD to epitaxially deposit the AlGaN material upon the top outermost surface of the VCSEL's active-area 28B.

In addition, as illustrated in FIGS. 1, 2, and 3, prior art also teaches that a VCSEL's second contact-layer 29 (FIG. 3), which is comprised from a highly p$^+$ doped GaN extrinsic binary material, is epitaxially grown upon the top outermost surface of the VCSEL's second cladding-layer 28C (FIG. 3). Further, the VCSEL's second contact-layer 29, while providing connectivity to the VCSEL's p-metal contact 31 (FIG. 3), and to the VCSEL's p-metal contact-ring 30 (FIG. 1), will also enhance the reliability of the VCSEL's design by preventing the migration of carrier-dislocations and the like to the VCSEL's active-region 28 (FIG. 3).

Furthermore, as illustrated in FIGS. 1, 2, and 3, prior art also shows that a VCSEL's second quarterwave mirror-stack assembly 32 is also made from a plurality of alternating layers, or more precisely a multitude of mirror-pairs comprised from alternatively deposited layers 32A, 32B (FIG. 3), which are constructed from ($Al_2O_3$/ZnO) dielectric material, and used to comprise a single mirror-pair. The plurality of alternating layers, which include one or more layers of undoped ($Al_2O_3$) "Aluminum-Oxide", being a high-refractive dielectric material (i.e., sometimes called Corundum or manufactured Sapphire) 32A, 32C, 32E, 32G, 32I (FIG. 3), and one or more layers of undoped (ZnO) "Zinc-Oxide", being a low-refractive dielectric material 32B, 32D, 32F, 32H (FIG. 3).

For example, as illustrated in FIG. 1, FIG. 2, and FIG. 3, prior art teaches that a layer of $Al_2O_3$ 32A is deposited upon the top outmost surface of a VCSEL's second contact-layer 29 (FIG. 3), while a layer of ZnO 32B (FIG. 3) is subsequently deposited upon the top outmost surface of the VCSEL's first $Al_2O_3$ layer 32A (FIG. 3). Further, if additional mirror-pairs are required several more layers can be used to make-up additional mirror-pairs by depositing them onto the existing layers of $Al_2O_3$ and ZnO material 32A, 32B, 32C, 32D, 32E, 32F, 32G, 32H, 32I (FIG. 3). Moreover, in order to increase the reflectivity of a VCSEL's second quarterwave mirror-stack assembly 32 (FIG. 3) to the required amount of partial-reflectance, many additional mirror-pairs may be required, and depending upon the frequency of light being reflected, as many as several hundred might be used to create a single mirror-stack assembly. Additionally, as illustrated in FIGS. 1, 2, and 3, prior art also teaches that a VCSEL's last layer to be deposited is an emitter layer 33, which is constructed from a high-refractive dielectric material such as undoped ZnO, using any well known method deposition, such as MBE or MOCVD to deposit the material.

In addition, as illustrated in FIGS. 1, 2, and 3, prior art also shows that a VCSEL's p-metal contact 31 (FIG. 3), and the VCSEL's p-metal contact-ring 30 (FIG. 3) are both formed upon the top outermost surface of the VCSEL's second contact-layer 29 (FIG. 3), by disposing any suitable conductive material, such as Indium-Tin-Oxide, Gold, Zinc, Platinum, Tungsten, or Germanium metallic alloys. Further, as illustrated in FIGS. 1, 2, and 3, prior art continues to show that a VCSEL's n-metal contact 27 (FIG. 1), and the VCSEL's n-metal contact-ring 26 (FIG. 2) are both formed upon the top outermost surface of the VCSEL's first contact-layer 25 (FIG. 3), by disposing any suitable conductive material, such as Indium-Tin-Oxide, Gold, Zinc, Platinum, Tungsten, or Germanium metallic alloys thereon. Further, it should be understood that a chosen method of material deposition depends upon the material being selected for a VCSEL's electrical contacts 26, 27, 30, 31 (FIG. 3) and therefore, specific methods of disposition, disposing, and patterning onto the VCSEL's first and second contact-layers 25, 29 (FIG. 3) for any specific material, must be considered in the construction of the VCSEL's electrical contacts 26, 27, 30, 31 (FIG. 3).

Furthermore, as illustrated in FIGS. 1, 2, and 3, prior art also teaches that a VCSEL's second contact-layer 29 (FIG. 3), a VCSEL's second cladding-region 28C, a VCSEL's active-area 28B, and a VCSEL's first cladding-layer 28A (FIG. 3) are shown as being mesa-etched, which defines the overall shape and structure of the VCSEL, while displaying the VCSEL's diameter dimensions to be substantially larger than the VCSEL's topmost deposited emitter layer 33 (FIG. 1) and second Bragg quarterwave mirror-stack assembly 32 (FIG. 2). Further, after completing a mesa-etching process a VCSEL's p-metal contact 31 (FIG. 3), and the VCSEL's p-metal contact-ring 30 are deposited upon the top outermost surface of the VCSEL's second contact-layer 29, leaving the VCSEL's emitter-layer area open 33 (FIG. 3). Additionally, prior art also teaches an alternative embodiment, where the deposition of a VCSEL's n-metal contact 27 is made upon the top outermost surface of the VCSEL's NiAl based metallic substrate 22 (FIG. 3). Moreover, deposition of a VCSEL's n-metal contact 27 will provide for a metallic substrate 22 that functions additionally as an electrically negative contact-layer.

Furthermore, as illustrated in FIGS. 1, 2, and 3, prior art also teaches that a VCSEL's metallic substrate 22 (FIG. 3), when used in conjunction with a highly reflective AlGaN/GaN quarterwave mirror-stack assembly 24 provides approximately 99.99% of the VCSEL's total reflectivity. Further, prior art teaches further that a group of VCSELs can also be configured and manufactured as an array of laser-diodes. For example, as illustrated in FIGS. 4, 5, and 6, a group of VCSELs are shown as being grouped together into a single file linear configuration.

In addition, prior art also teaches a frequency-doubled second-harmonic generating VCSEL laser-diode, which is constructed from compound semiconductor material that comprise elements listed in columns III–V of the 'Periodic Table of Elements'. For example, using a method of epitaxial deposition, a compound semiconductor material such as GaAs, AlGaAs, GaInAsP, AlGaInP, GaInAsP, etc. may be utilized as construction material during the deposition of a VCSEL's active-region. Further, a compound semiconductor material, such as GaAs, GaAsP, etc. may be utilized as material that provides for a lattice matched substrate wafer. Further, prior art also teaches that a frequency-doubled second-harmonic generating VCSEL laser-diode will be comprised as a multitude of layered structures; e.g., a cavity, the reflectors, etc. Wherein, the multitude of layered structures are epitaxially deposited layer-upon-layer onto the top outermost surface of a GaAs comprised substrate wafer exhibiting the necessary crystalline orientation of [111].

Moreover, a first electrode is typically formed upon the bottom surface of the wafer substrate, while a first reflector, comprising a multitude of semiconductor layers is epitaxially grown upon the upper surface of the previously formed first electrode. Typically, any semiconductor crystalline material used to form a VCSEL's cavity, as a result of epitaxial growth, will have the same crystalline orientation exhibited by the wafer substrate the material was grown upon. Therefore, the crystalline orientation of the latter determines that of the former.

In addition, what is formed upon the upper surface of the first reflector is typically a spacer-layer, an active-layer and a second spacer-layer. Further, an insulation layer is typically formed between the first electrode and the spacer-layer. Further, a second electrode is formed upon the upper surface of the substrate, and the substrate is finally etched to form a second harmonic output port on the side of the second electrode. Further, in the second harmonic output-port, a phase-matching layer is formed on the upper side of the second spacer-layer, and a reflector for output of the second harmonic on the upper surface of the phase-matching layer is paired with the reflector.

Moreover, a frequency-doubled second-harmonic generating VCSEL will comprise two DBR reflectors and the layers formed between them will comprise a first spacer-layer, an active-layer, a second spacer-layer, and a phase-matching layer. Typically, a frequency-doubled second-harmonic generating VCSEL laser-diode has a phase-matching layer that does not lie between the two electrodes, but in a section through which no current flows. Therefore, due to an increase in electric resistance, disadvantages such as a decrease in the power exhibited by the fundamental wave do not arise.

In addition, prior art also teaches that a frequency-doubled second-harmonic generating VCSEL's second DBR reflector is constructed by depositing in succession, two dielectric materials (e.g., alternating layers of $TiO_2$ and $SiO_2$) that exhibit diametrically opposed refractive indices and used to form the second DBR reflector at the output emission side of a frequency-doubled second-harmonic generating VCSEL laser-diode. The dielectric thin films are used to construct about 10 mirror-pairs (or more depending on the process used) by depositing in succession, each dielectric thin film layer upon the other; alternating the deposition from the material with a high index of refraction to the material with a low index of refraction (e.g., alternating from $TiO_2$ to $SiO_2$). Further, the layers (alternating $TiO_2$ and $SiO_2$ layers) used to form a top DBR based reflector would have a thickness t that can be expressed as—Equation 1:

$$t_{d1}=\lambda_1/[4n_{d1}(\lambda_1)], \text{ and}$$

$$t_{d2}=\lambda_1/[4n_{d2}(\lambda_1)], \text{ respectively.}$$

Wherein, $n(\lambda)$ is the refractive index at the wavelength $\lambda$, while $\lambda_1$ is the wavelength of the fundamental wave. Further, the subscript $_{d1}$ denotes the film thickness and refractive index for $SiO_2$, while the subscript $_{d2}$ denotes the film thickness and refractive index for $TiO_2$.

In addition, prior art also teaches that a frequency-doubled second-harmonic generating VCSEL laser-diode has a phase-matching layer that is also configured as a superlattice comprising of two layers of AlGaAs, but each layer having different amounts of Al each layer represented by subscript $_{s1}$ and subscript $_{s2}$, respectfully (content of Al for $_{s1}$ equals 50–90%, while content of Al for $_{s2}$ equals 10–50%). Moreover, the thickness $t_{s1}$, $t_{s2}$ of each layer $_{s1}$, $_{s2}$ is determined using each layer's respective reflective indice $n_{s1}(\lambda)$ and $n_{s2}(\lambda)$, as demonstrated in the following equation—Equation 2:

$$t_{s1}=[n_{s1}(\lambda_2)/\lambda_2-2_{s1}(\lambda_1)/\lambda_1]^{-1/2}$$

$$t_{s2}=[n_{s2}(\lambda_2)/\lambda_2-2n_{s2}(\lambda_1)/\lambda_1]^{-1/2}$$

Wherein, the total thickness of the phase-matching layer is but a few times greater than the reciprocal of the average absorption constant; i.e., having a deposition thickness that lies somewhere between 2- to 20-$\mu$m. In the above example, the substrate orientation was [111] (i.e., a substrate having a One-One-One crystalline orientation). The present invention is not limited, however, to the crystalline orientation of [111].

Furthermore, by using a first non-linear process, which is sometimes called sum-frequency generation by those well versed in the art, a second-harmonic emission of two fundamental waves may be generated, albeit with a difference inefficiency, using a III–V comprised substrate wafer that exhibits a crystalline orientation of [100] (i.e., a substrate having a One-Zero-Zero crystalline orientation that differs greatly from that of the One-One-One crystalline orientation previously mentioned). Consequently, to maintain phase-matching for the present invention the crystalline orientation exhibited by its substrate wafer must not exceed an angle of more than 5° with respect to the crystalline orientation of [100].

Alternatively, prior art also teaches that the active-layer may be composed of AlGaAs, etc., its composition being determined according to the wavelength of the fundamental wave. The composition of the two DBR reflectors is not necessarily restricted to dielectric multi-layered films, and may be based upon semiconductor multi-layered films, metallic films, or a combination of metallic and dielectric films. The second DBR reflector on the output end needs only to have a reflectivity high enough to cause lasing of the fundamental wave, and a transmissivity high enough to extract the generated second harmonic. The first DBR reflector on the non-output end need only have a reflectivity high enough to cause lasing of the fundamental wave.

Moreover, a semiconductor multi-layered film base reflector may be used as the second DBR reflector because its electrical resistance is lower than that of the dielectric multi-layered film. For example, the superlattice of the phase-matching layer was composed of an AlGaAs compound semiconductor, but it may be composed of any III–V compound semiconductor, such as InGaAs, AlGaInP, GaInAsP, etc.

Alternatively, prior art also teaches that the VCSEL's second DBR reflector may also be composed of an II–VI group compound semiconductor such as ZnCdSSe, ZnSSe, ZnCdS, etc. Prior art teaches, when the phase-matching layer is formed utilizing elements from columns II–VI of the 'Periodic Table of Elements' the width of the phase-matching layer may be increased to a degree which is allowed by the fabrication process and which will support the lasing of the fundamental wave within a VCSEL. Prior art also teaches that besides the above embodiments, any well-known method (see, for example, those shown in the reference by A. Yariv and the reference by D. Vahkshoori referred previously) may be employed to realize phase matching. For example, the second harmonic may also be effectively generated even where the thickness of layers corresponding to Equation 2 takes the following values—Equation 3:

$$t_{s1} = [n_{s1}(\lambda_2)/\lambda_2]^{1/2}$$

$$t_{s2} = [n_{s2}(\lambda_2)/\lambda_2]^{-1/2}$$

Wherein, this method is well known to realize phase-matching in standing waves. While those described in Equation 1 use modulation in the value of the non-linear coefficients, but phase-matching is also possible through changing signs of the non-linear coefficients.

SUMMARY OF THE INVENTION

While the present invention might typically use internally a vertically oriented LED to produce fundamental photonic radiation, its optical cavity and the physics that occur therein are quit different from those that occur within a typical VCSEL laser. Therefore, the present invention should be categorized as a new kind of semiconductor laser-diode.

For example, the present invention, by using only one mirror structure instead of two as both, input and output mirrors, the present invention has a redefined vertical cavity design. Inspired by the present invention's unique cavity design and by the optical physics that occur therein, for future identification, this new semiconductor laser-diode design is referred to herein as a frequency-doubled FCSEL (Folded Cavity Surface Emitting Laser).

The present invention was conceived with an object to overcome the disadvantages described above, and to provide for a frequency doubled sum-frequency generating (FCSEL) "Folded Cavity Surface Emitting Laser" that is capable of providing for the sum-frequency generation of a second-harmonic emission output with higher efficiency, at higher power, and at near-room temperatures, while featuring a small size, a low energy consumption, and a low cost of manufacturing.

Therefore, a frequency-doubled sum-frequency generating folded cavity surface emitting laser will comprise a cavity containing at least two separate active-regions using material from columns III–V of the Periodic Table of Elements' to create compound semiconductor material during their epitaxial deposition. Wherein, the two active-regions would each be configured with a double-heterojunction diode structure capable of creating and amplifying intra-cavity produced photonic radiation.

Furthermore, a frequency-doubled sum-frequency generating folded cavity surface emitting laser would further comprise of at least one mode discriminating total internally reflecting prism shaped waveguide capable of providing a redirection of intra-cavity produced photonic radiation into and out of multiple intra-cavity transverse propagations.

In addition, a frequency-doubled sum-frequency generating folded cavity surface emitting laser provides for at least one semiconductor superlattice that is capable of producing a frequency doubling of the present invention's intra-cavity produced photonic radiation, which is extracted as a sum-frequency generated second harmonic emission.

In summation, the present invention comprises a cavity configuration that simultaneously provides for a total-reflection process of feedback for input fundamental photonic radiation, while contradictorily, providing for a partial-reflection process of feedback for frequency-doubled laser emission output, which is extracted at a prescribed rate from the present invention's cavity as a sum-frequency generated second harmonic of the present invention's fundamental emission.

Normally, a [100] crystalline orientation would be selected as the preferred orientation for the compound semiconductor material used to construct the present invention's multilayered structures. However, in order to promote phase-matching to intra-cavity produced fundamental photonic radiation the deposition of semiconductor materials will be such as to provide an angle of tolerance of at least 5° with respect to the direction of propagation of the reflected photonic radiation made to oscillate within the present invention's folded cavity.

Consequently, a much preferred [111], [211], or [110] crystalline orientation will approximately match the direction of propagation exhibited by the present invention's light rays.

Several other objects and other advantages additionally exhibited by the present invention are presently included below as:

(a) To provide a frequency-doubled folded cavity surface emitting laser that can frequency double, using (SFG) "Sum Frequency Generation", intracavity produce fundamental optical radiation, and output it as amplified frequency-doubled laser light, (b) To provide a frequency-doubled folded cavity surface emitting laser, which can provide further frequency double, external to the folded cavity surface emitting laser-diode's folded cavity, using SHG, the sum frequency generated second-harmonic laser emission output, (c) To provide a frequency-doubled folded cavity surface emitting laser that creates light amplifying feedback with only one quarterwave mirror-stack assembly, and a cavity folding totally internal reflecting polyhedral prism waveguide that is comprised from a single layer of dielectric material, (d) To provide a frequency-doubled folded cavity surface emitting laser that is inexpensive to manufacture, by eliminating the expensive epitaxial deposition of a bottom quarterwave mirror-stack assembly comprising a multitude of layered dielectric or semiconductor materials, and replacing it with a dielectric polyhedral prism waveguide constructed from a single and inexpensive epitaxial or sputter deposited material, (e) To provide a frequency-doubled folded cavity surface emitting laser that uses two graded confinement cladding-layers in its active-region to generate emission output that exhibits a narrower linewidths, (f) To provide a frequency-doubled folded cavity surface emitting laser that produces a more effective output gain by using two graded confinement cladding-layers in its active-region to lower the heat producing electrical resistance that occurs at interfaces lying between contact-layers and cladding-layers, (g) To provide a frequency-doubled folded cavity surface emitting laser, which increases optical confinement with the addition of total internally reflecting cladding material to the surrounding vertical and outermost wall surfaces of the frequency-doubled folded cavity surface emitting semiconductor laser-diode's folded vertical cavity(s), (h) To provide a frequency-doubled folded cavity surface-emitting laser that can be configured as a single laser device, (i) To provide a frequency-doubled folded cavity surface emitting laser that can be configured as a single laser-array comprising a multitude of surface emitting semiconductor laser-diodes, (j) To provide a frequency-doubled folded cavity surface emitting laser or a frequency-doubled folded cavity surface emitting laser-array, which can be manufactured at the same time and from the same semiconductor substrate material used to construct a laser-array's control-circuitry, all of which would be contained within a single semiconductor device, (k) To provide a frequency-doubled folded cavity surface emitting laser that replaces a bottom quarterwave mirror-stack assembly with a polyhedral prism waveguide which, if comprised of quartz or fused silica, can reflect 100%, using a process of total internal reflection, all frequencies of optical radiation entering a polyhedral prism waveguide's top front-face flat horizontal surface, (l) To provide a frequency-doubled folded cavity surface emitting laser that can inexpensively construct its polyhedral prism waveguide using a well-known ion-milling process to slice out prism facet(s) from the waveguide material, (m) To provide a frequency-doubled folded cavity surface emitting laser that can deposit a dielectric material like fused-silica onto any frequency producing semiconductor diode material or combination thereof that could possibly be used to construct a frequency-doubled folded cavity surface emitting laser or a frequency-doubled folded cavity surface emitting laser-array, (n) To provide a frequency-doubled folded cavity surface emitting laser, which uses an amorphous material such as (LiF) "Lithium-Fluoride" to create, for a vertical cavity(s) an optical cladding and thermally dispersive material that also gives added support to polyhedral prism waveguide(s), (o) To provide a frequency-doubled folded cavity surface emitting laser that can increase its modal discrimination by extending the frequency-doubled folded cavity surface emitting laser's optical-cavity length using a polyhedral prism waveguide, (p) To provide a frequency-doubled folded cavity surface emitting laser, which can increase its modal discrimination using a process of total internal reflection to redirect intra-cavity produced light from a longitudinal propagation into a first transverse propagation, into a second transverse propagation, into a third transverse propagation, and back into a longitudinal, but reversed propagation that extends the optical cavity length for higher-order transverse optical-moded light, and because of diffraction, the higher-order transverse optical-moded light suffers loss increasing gain to the fundamental lower-order transverse optical-moded light, which as a consequence, will undergo amplification, then emission as frequency-doubled single fundamental ($TEM_{00}$) moded laser light, (q) To provide a frequency-doubled folded cavity surface emitting laser that has eliminated the need to deposit lattice matched crystal growing buffer-layers using materials like AlN.

Further objects and advantages is to provide a frequency-doubled folded cavity surface emitting laser that provides an increase of nearly 7-mW to a single low-order fundamental transverse mode of laser emission.

Wherein, the selection of one semiconductor material over another, or the selection of one optical material over another for use in the construction of the present invention's active-region(s), its polyhedral prism waveguide, and its multilayered quarterwave mirror-stack assembly is not determined by any structural need, but is determined by a particular application's need for any specific frequency(s) of laser emission.

Therefore, as presented here the materials used to construct the present frequency-doubled FCSEL invention are only one, yet preferred example of a group of several frequency-specific materials that might be used to construct the present invention's frequency transcendent folded cavity structure. Further, the un-obvious properties exhibited by the present invention are made possible by several novel features exhibited by the frequency-doubled FCSEL's cavity folding structure.

Moreover, because these novel features are made to exist using any frequency-specific semiconductor or optical material for their construction, the various layers of material that comprise the present invention's structure have both sufficient novelty and an non-obviousness that are independent of any specific semiconductor or optical material that might, or could be used in the present invention's construction.

Furthermore, for the sake of simplicity the term frequency-doubled FCSEL or frequency-doubled surface emitting semiconductor laser-diode will be hereinafter termed simply as a frequency-doubled FCSEL. Still further objects and advantages will become apparent from a consideration of the ensuing description and drawings.

DRAWING FIGURES

Embodiments of the present invention are described herein in conjunction with the following figures, wherein:

FIG. 16 shows prior art illustrated as a block diagram that graphically displays the pathways of two polarized light-rays as they move through an intra-cavity positioned non-linear uniaxial birefringent crystalline material, which defines the geometry behind type-I birefringent phase-matching, and how its is used to produce the nonlinear second-order frequency-doubling process of SFG.

FIG. 17 shows prior-art illustrated as a block diagram that graphically displays the pathway of a single polarized light-ray when projected into and through an extracavity positioned nonlinear uniaxial birefringent crystalline material, which defines the geometry behind type-I birefringent phase-matching, and how it is used to produce the nonlinear second-order frequency-doubling process of SHG.

In the figures, closely related reference numerals have the same number but different alphabetic suffixes.

DETAILED DESCRIPTION OF THE INVENTION

As a preferred embodiment of the present invention, a frequency-doubled sum-frequency generating FCSEL laser-diode, in contrast to the presented prior art, is constructed using compound semiconductor material that comprise various combinations of elements listed in columns III–V of the 'Periodic Table of Elements'. For example, using a method of epitaxial deposition a compound semiconductor material such as GaAs, AlGaAs, GaInAsP, AlGaInP, GaInAsP, etc. may be utilized as construction material during the deposition of the present invention's active-regions.

Moreover, while a compound semiconductor material such as GaAs, GaAsP, etc., may be utilized as the semiconductor material that provides for a lattice matched substrate wafer. Further, a frequency-doubled sum-frequency generating FCSEL laser-diode will comprise a multitude of layered structures; e.g., a cavity, the reflectors, etc. Wherein, the multitude of layered structures are epitaxially deposited upon the top outermost surface of a GaAs comprised substrate wafer preferably exhibiting the crystalline orientation of [111].

Figure 7:
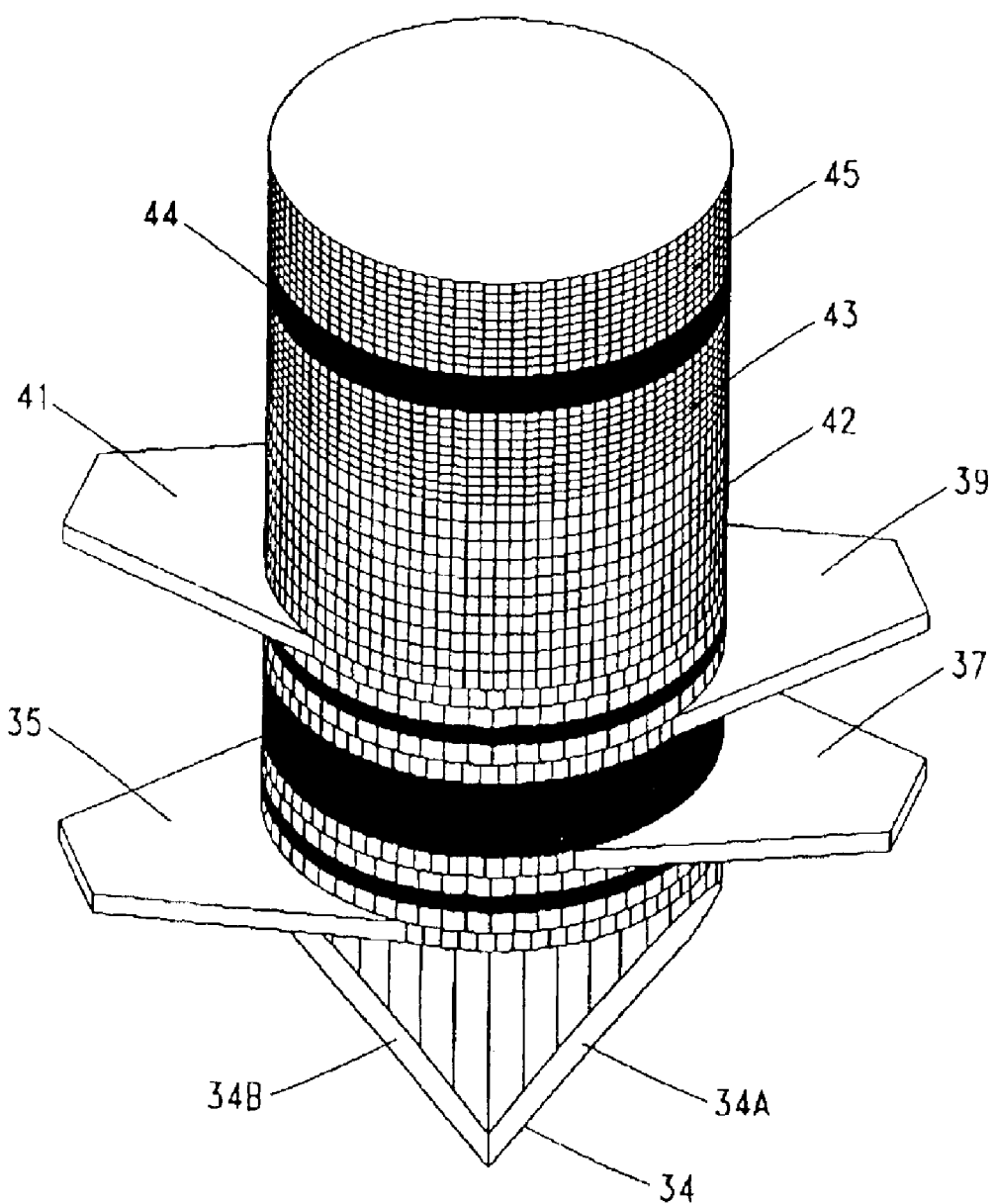
FIG. 7 shows a 60° three-dimensional isometric top side-view of a frequency-doubled FCSEL, displaying the frequency-doubled FCSEL's two MQW active-regions, a first and second superlattice, three plane-parallel mirror-stack reflectors, and one corner-cube prism waveguide.
Figure 8:
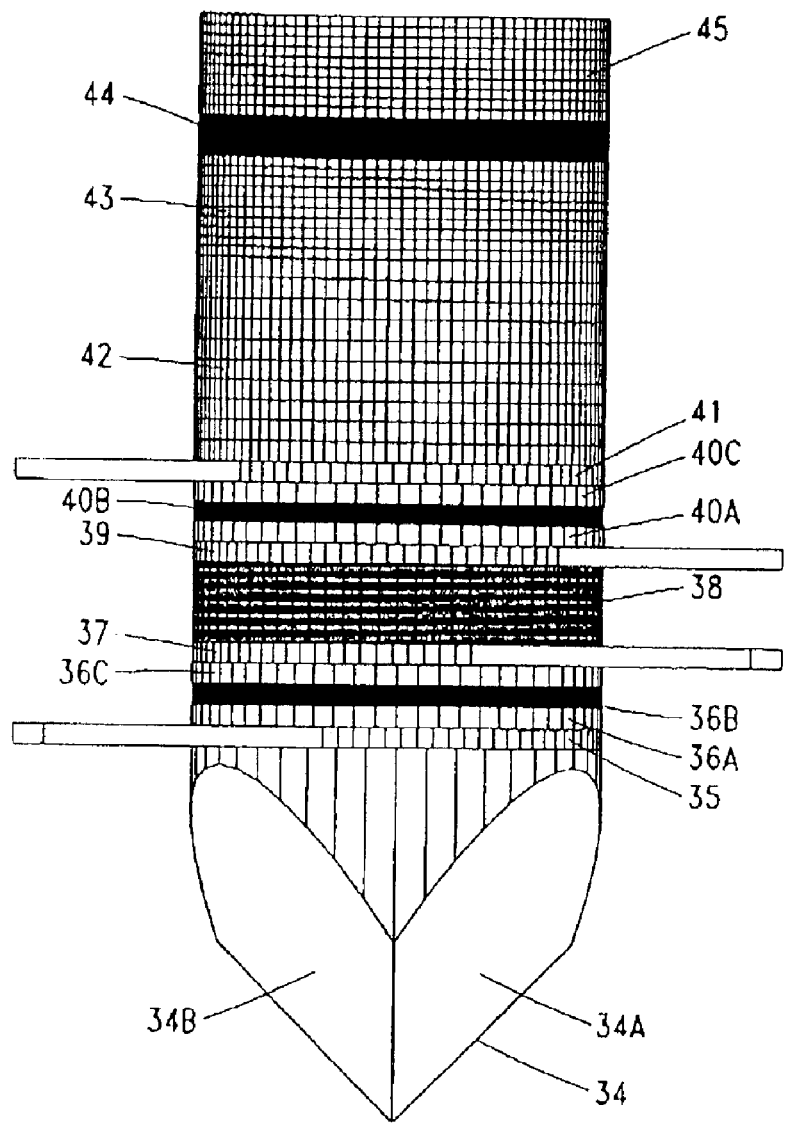
FIG. 8 shows an orthographic front-view of a frequency-doubled FCSEL, displaying the frequency-doubled FCSEL's two MQW active-regions, a first and second superlattice, three plane-parallel mirror-stack reflectors, and one corner-cube prism waveguide.

In addition, a preferred embodiment of the present invention, as illustrated in FIGS. 7, 8 (two referenced numbered three-dimensional isometric-views of a frequency-doubled FCSEL), and 9 (a sectional side-view drawing of a frequency-doubled FCSEL), shows that the present invention uses two separately and electrically pumped double-heterostructure light emitting diodes, which are configured as the present invention's active-regions 36, 40 and comprises:

(a) (MQW) "Multiple Quantum Well" active-area 36B, 40B (FIGS. 7, 8, 9, 10, and 11), (b) Contra-positioned graded confinement cladding-layers 36A, 36C, 40A, 40C (FIGS. 7, 8, 9, 10, and 11), (c) Positive contact-layers 37, 39 (FIGS. 7, 8, 9, 10, and 11), and (d) Negative contact-layers 35, 41 (FIGS. 7, 8, 9, 10, and 11).

Whereby, this double-heterostructure light emitting diode design will improve the performance of the present frequency-doubled FCSEL invention in several ways:

(a) By replacing conventional non-graded confinement cladding-layers 28A, 28C (FIG. 3), which are normally used in today's double-heterostructure laser-diode designs with graded confinement cladding-layers 36A, 36C, 40A, 40C (FIGS. 7, 8, 9, 10, and 11) we increase the confinement of both 'electrons and holes' to a frequency-doubled FCSEL's MQW active-areas 36B, 40B (FIGS. 7, 8, 9, 10, and 11). Further, because the graded confinement cladding-layers increase confinement of both electrons and holes to a frequency-doubled FCSEL's MQW active-area 36B, 40 (FIGS. 7, 8, 9, 10, and 11), the process of 'population inversion' that occurs within the frequency-doubled FCSEL's MQW active-areas 36B, 40 will also increase.

(b) Because the graded confinement cladding-layers 36A, 36C, 40A, 40C (FIGS. 7, 8, 9, 10, and 11) are created using a semiconductor material having a refractive index that gradually and evenly changes, from high to low, over the graded cladding-layer's entire thickness, a high degree of reflectance is maintained, while the light scattering losses normally caused by internal photonic reflections at the material boundaries of typical non-graded confinement cladding-layers 28A, 28C (FIG. 3) is eliminated, improving therein, the output gain and modal confinement of a frequency-doubled FCSEL's laser emission output.

(c) By using graded confinement cladding-layers 36A, 36C, 40A, 40C (FIGS. 7, 8,9, 10, and 11) with evenly graded distribution of dopant materials, where the amount of dopant levels are higher at the material boundaries between contact-layers and cladding-layers, we have greatly reduce the resistance to electrical current at the material boundaries between contact and cladding-layers. By reducing resistance at the material boundaries between contact-layers and cladding-layers, we have increased current confinement, while reducing internally created heat.

(d) By using two graded confinement cladding-layers 36A, 36C, 40A, 40C (FIGS. 7, 8, 9, 10, and 11) in conjunction with the MQW active-areas 36B, 40B (FIGS. 7, 8, 9, 10, and 11) with each active-area being positioned between the frequency-doubled FCSEL's contact-layers 35, 37, 39, 41 (FIGS. 7, 8, 9, 10, and 11), we create a double-heterostructure semiconductor surface emitting laser that has lower current thresholds, has lower internal heat, has higher output gain, and has smoother modulations of its laser emissions.

Moreover, when the present invention uses graded confinement based double-heterostructure semiconductor LEDs as its source of fundamental optical radiation, we create a laser-diode capable of generating an emission output that exhibits a narrower linewidth than those produced by typical double-heterostructure LED based laser-diode based designs. Further, when the present invention uses the graded confinement based double-heterostructure semiconductor LEDs as its source of fundamental optical radiation, and because of the lower electrical-resistance exhibited by their graded confinement cladding-layers 36A, 36C, 40A, 40C (FIGS. 7, 8, 9, 10, and 11), a frequency-doubled sum-frequency generating frequency-doubled FCSEL laser-diode's active-region 36, 40 (FIGS. 7, 8, 9, 10, and 11) produce less heat, and therefore produce a more effective output-gain, which is currently greater than the output-gain typically exhibited by prior-art double-heterostructure semiconductor laser-diode designs.

Figure 9:
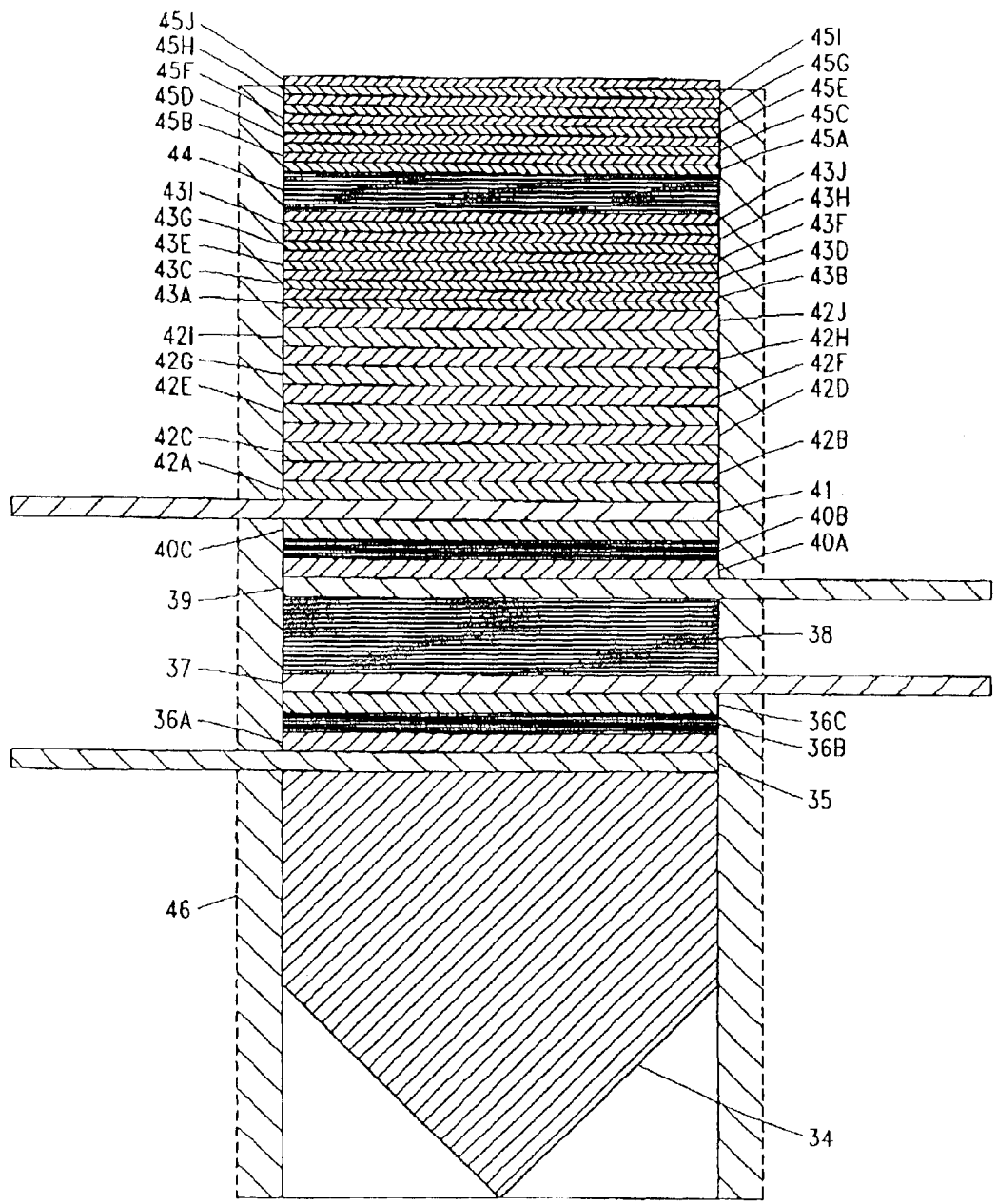
FIG. 9 shows an orthographic side-view of a frequency-doubled FCSEL, displaying the frequency-doubled FCSEL's two MQW active-regions, a first and second superlattice, three plane-parallel mirror-stack reflectors, and one corner-cube prism waveguide as section drawing 9—9 (i.e., see FIG. 12).

The preferred embodiment of the present invention, as illustrated in FIGS. 7, 8, and 9, describes a structure that begins by using a preformed substrate wafer, which also doubles as a first 200-nm thick contact-layer 35 (FIGS. 7, 8, 9, 10, and 11). The substrate wafer comes from a melt that was formed from a seeded crystal of highly $n^+$ doped GaAs material having a crystalline orientation of [100], [111], [110], or [001], and later sliced into a thin substrate wafers.

Therefore, the first contact-layer 35 (FIGS. 7, 8, 9, 10, and 11) also provides for a frequency-doubled FCSEL's main substrate, which is used for the subsequent growth of the crystalline semiconductor layers that make up the frequency-doubled FCSEL's multilayered structures. Further, a frequency-doubled FCSEL's first contact-layer 35, while providing negative electrical connectivity to the frequency-doubled FCSEL's first light emitting active-region 36 (FIGS. 7, 8, 9, 10, and 11), also enhances the reliability of the frequency-doubled FCSEL's design, by preventing the migration of carrier-dislocations and the like to the frequency-doubled FCSEL's first active-area 36B (FIGS. 7, 8, 9, 10, and 11).

In addition, is the deposition of a frequency-doubled FCSEL's first 300-nm thick graded-confinement cladding-layer 36A (FIGS. 7, 8, 9, 10, and 11), which is deposited using MBE or MOCVD upon the top outermost surface of the frequency-doubled FCSEL's first contact-layer 35 (FIGS. 7, 8, 9, 10, and 11), giving it a deposited position between the frequency-doubled FCSEL's first contact-layer 35 (FIGS. 7, 8, 9, 10, and 11) and the frequency-doubled FCSEL's first active-area 36B (FIGS. 7, 8, 9, 10, and 11). Moreover, a frequency-doubled FCSEL's first graded-confinement cladding-layer 36A (FIGS. 7, 8, 9, 10, and 11) is constructed from a graded N doped GaAlAs ternary material. Wherein, the ternary material's concentration of Gallium gradient is made to gradually increase, starting from the first graded-confinement cladding-layer's bottom-edge 36A (FIGS. 7, 8, 9, 10, and 11) and gradually increases upward toward the frequency-doubled FCSEL's first active-area 36B (FIGS. 7, 8, 9, 10, and 11).

For example, the amount of Gallium gradient is made to increase from $Ga_{0.55}Al_{0.45}As$, to $Ga_{0.60}Al_{0.40}As$, to $Ga_{0.65}Al_{0.35}As$, to $Ga_{0.70}Al_{0.30}As$, to $Ga_{0.75}Al_{0.25}As$, and finally to $Ga_{0.80}Al_{0.20}As$ 36A (FIGS. 7, 8, 9, 10, and 11). While, in comparison, the ternary material's concentration of Aluminum gradient is made to gradually decrease, starting from the first graded-confinement cladding-layer's bottom-edge 36A (FIGS. 7, 8, 9, 10, and 11) and gradually decreases upward toward the frequency-doubled FCSEL's active-area 36B (FIGS. 7, 8, 9, 10, and 11). For example, the amount of Aluminum gradient is made to decrease from $Ga_{0.55}Al_{0.45}As$, to $Ga_{0.60}Al_{0.40}As$, to $Ga_{0.65}Al_{0.35}As$, to $Ga_{0.70}Al_{0.30}As$, to $Ga_{0.75}Al_{0.25}As$, and finally to $Ga_{0.80}Al_{0.20}As$ 36A (FIGS. 7, 8, 9, 10, and 11).

In addition, is the deposition is a frequency-doubled FCSEL's first active-area 36B (FIGS. 7, 8, 9, 10, and 11), which constitutes the frequency-doubled FCSEL's first active-medium through which a process of stimulated-emission will produce a first source of coherent light when the active-medium is optically pumped by intra-cavity confined light that comes from frequency-doubled FCSEL's first 36B and second 40B double-heterostructure diode. Wherein, the previously mentioned active-medium is displayed as the frequency-doubled FCSEL's first active-area 36B, which is located within the frequency-doubled FCSEL's active-region 36 (FIGS. 7, 8, 9, 10, and 11).

Moreover, a frequency-doubled FCSEL's first active-area 36B (FIGS. 7, 8, 9, 10, and 11) is illustrated here as being a multi-layered MQW structure, which is positioned between the frequency-doubled FCSEL's first 36A (FIGS. 7, 8, 9, 10, and 11) and second 36C (FIGS. 7, 8, 9, 10, and 11) graded-confinement cladding-layers. The frequency-doubled FCSEL's first MQW structure comprises of seven quantum-wells 97A, 97B, 97C, 97D, 97E, 97F, 97G (FIGS. 23A and 23B), which are constructed using an undoped binary GaAs semiconductor material having a small forbidden band, and six quantum-well cladding-layers 98A, 98B, 98C, 98D, 98E, 98F (FIGS. 20A and 20B), which are constructed using an undoped ternary GaAlAs semiconductor material having a large forbidden band. Whereby, all thirteen semiconductor layers used to comprise a frequency-doubled FCSEL's first active-area 36B (FIGS. 7, 8, 9, 10, and 11), when combined to form a first MQW structure, should have a total material thickness that equals one-quarter of one wavelength of the fundamental emission created by the frequency-doubled FCSEL's first active-region 36 (FIGS. 7, 8, 9, 10, and 11).

For example, if a frequency-doubled FCSEL's first active-region 36 (i.e., pump 1)(FIGS. 7, 8, 9, 10, and 11) were designed to create light emission having a fundamental wavelength of 800-nm, then the first active-area's 36B (FIGS. 7, 8, 9, 10, and 11) total material thickness would need to be one-quarter (i.e., 200-nm) of one wavelength of the fundamental 800-nm light created by the frequency-doubled FCSEL's first active-region 36 (i.e., pump 1)(FIGS. 7, 8, 9, 10, and 11). Therefore, the combined thickness' of the multiple quantum-wells and multiple quantum-well cladding-layers that altogether make up the frequency-doubled FCSEL's first active-area 36B should have a total material thickness equaling 200-nm, or one-quarter of one wavelength of the fundamental 800-nm light created by the frequency-doubled FCSEL's first active-region 36 (FIGS. 7, 8, 9, 10, and 11).

Furthermore, if a frequency-doubled FCSEL's first active-area 36B (FIG. 23A) had seven quantum-wells 97A, 97B, 97C, 97D, 97E, 97F, 97G (FIG. 23A) constructed from undoped binary GaAs semiconductor material, then each of the seven quantum-wells 97A, 97B, 97C, 97D, 97E, 97F, 97G (FIG. 23A) would need to have a material thickness equaling 10.30-nm. Additionally, if a frequency-doubled FCSEL's first active-area 36B had six quantum-well cladding-layers 98A, 98B, 98C, 98D, 98E, 98F (FIG. 23A) constructed from undoped ternary GaAlAs semiconductor material, then the six quantum-well cladding-layers 98A, 98B, 98C, 98D, 98E, 98F (FIG. 23A) would need to have a material thickness equaling 21.30-nm.

In summation, the thickness dimension for each of the seven quantum-wells and six quantum-well cladding-layers located within the frequency-doubled FCSEL's first active-area 36B (FIGS. 7, 8, 9, 10, and 11), when altogether combined should have a total material thickness equaling 200-nm, or one-quarter of one wavelength of the fundamental 800-nm light created by the frequency-doubled FCSEL's first active-region 36 (FIGS. 7, 8, 9, 10, and 11).

Figure 22:
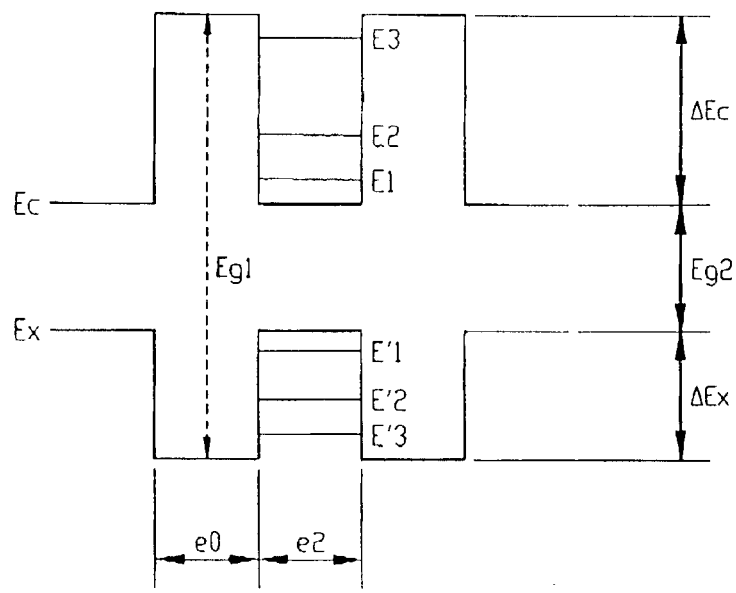
FIG. 22 shows a block diagram that graphically illustrates the profile for the potential wells and the discreet energy levels assumed by the carriers that migrate into the conduction and valency bands.
Figure 23A:
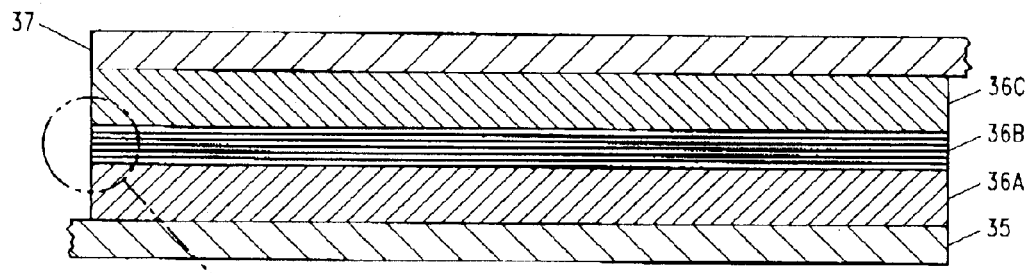
FIG. 23A shows a close-up sectional view of a frequency-doubled FCSEL's first active-region, displaying its two cladding-layers and multiple quantum-wells.

In addition, as illustrated in FIG. 22, the preferred embodiment of the present invention from an energy standpoint shows a frequency-doubled FCSEL's first MQW structure as being diagrammatically characterized. More specifically, FIG. 22 illustrates the profile for the potential wells and the discreet energy levels assumed by the carriers that migrate into the conduction and valency bands (i.e., respectively electrons and holes). When an epitaxially deposited semiconductor film having a small forbidden band $e_2$ (a typical thickness equaling 10-nm), such as films 97A, 97B, 97C, 97D, 97E, 97F, 97G (FIG. 23A), is surrounded by two semiconductor films having a larger forbidden band $e_0$ (a typical thickness equaling 20-nm), such as films 98A, 98B, 98C, 98D, 98E, 98F (FIG. 23A).

Wherein, the previously mentioned 'electrons and holes' (carriers) of the small forbidden band material 97A, 97B, 97C, 97D, 97E, 97F, 97G (FIG. 23A) are confined in monodirectional potential wells $e_2$. Consequently, as illustrated in FIG. 22, the movement of an electron into a well created in the conduction band of height $\Delta E_c$ is quantized into discreet states of energy $E_1$, $E_2$, and $E_3$, etc. Moreover, in the same way the movement of a hole into a well created in the valency band of height $\Delta E_x$ is quantized into discreet states of energy $E'_1$, $E'_2$, and $E'_3$. Further, when the thickness of the small forbidden band material $e_2$ varies, then the energy states assumed by the carriers will also vary. Therefore, the emission length of the frequency-doubled FCSEL's first MQW structure can be adjusted by the choice, the nature, and the thickness dimensions of the semiconductor material used in its construction.

In addition, deposition of a frequency-doubled FCSEL's second 300-nm thick graded-confinement cladding-layer 36C (FIGS. 7, 8, 9, 10, and 11) upon the top outermost surface of the frequency-doubled FCSEL's first active-area 36B (FIGS. 7, 8, 9, 10, and 11) is accomplished using a well known method of epitaxial deposition such as MBE or MOCVD, and would give it a deposited position between the frequency-doubled FCSEL's first active-area 36B (FIGS. 7, 8, 9, 10, and 11) and the frequency-doubled FCSEL's second contact-layer 37 (FIGS. 7, 8, 9, 10, and 11). Further, a frequency-doubled FCSEL's second 300-nm thick graded-confinement cladding-layer 36C (FIGS. 7, 8, 9, 10, and 11) is constructed from a graded P doped GaAlAs ternary semiconductor material. Wherein, the ternary material's concentration of Gallium gradient is made to gradually increase, starting from the second graded-confinement cladding-layer's top-edge 36C (FIGS. 7, 8, 9, 10, and 11) and gradually increases downward toward the frequency-doubled FCSEL's first active-area 36B (FIGS. 7, 8, 9, 10, and 11).

For example, the amount of Gallium gradient is made to increase from $Ga_{0.55}Al_{0.25}As$, to $Ga_{0.60}Al_{0.40}As$, to $Ga_{0.65}Al_{0.35}As$, to $Ga_{0.70}Al_{0.30}As$, to $Ga_{0.75}Al_{0.25}As$, and finally to $Ga_{0.80}Al_{0.20}As$ 36C (FIGS. 7, 8, 9, 10, and 11). While, the ternary material's concentration of Aluminum gradient is made to gradually decrease, starting from the second graded-confinement cladding-layer's top-edge 36C (FIGS. 7, 8, 9, 10, and 11) and gradually decreases downward toward the frequency-doubled FCSEL's first active-area 36B (FIGS. 7, 8, 9, 10, and 11). For example, the amount of Aluminum gradient is made to decrease from $Ga_{0.55}Al_{0.45}As$, to $Ga_{0.60}Al_{0.40}As$, to $Ga_{0.65}Al_{0.35}As$, to $Ga_{0.70}Al_{0.30}As$, to $Ga_{0.75}Al_{0.25}As$, and finally to $Ga_{0.80}Al_{0.20}As$ 36C (FIGS. 7, 8, 9, 10, and 11).

In addition, construction of a frequency-doubled FCSEL's second 200-nm thick contact-layer 37 (FIGS. 7, 8, 9, 10, and 11) using a highly +p-doped GaAs binary semiconductor material is accomplished when it is epitaxially grown upon the top outermost surface of the frequency-doubled FCSEL's second graded-confinement cladding-layer 36C (FIGS. 7, 8, 9, 10, and 11). Moreover, giving it a deposited position between the frequency-doubled FCSEL's second graded-confinement cladding-layer 36C (FIGS. 7, 8, 9, 10, and 11) and the frequency-doubled FCSEL's first superlattice structure 38 (FIGS. 7, 8, 9, 10, and 11). Moreover, a second contact-layer 37 (FIGS. 7, 8, 9, 10, and 11), while providing positive electrical connectivity to the frequency-doubled FCSEL's first active-region 36 (FIGS. 7, 8, 9, 10, and 11) also enhances the reliability of the frequency-doubled FCSEL's laser design, by preventing the migration of carrier-dislocations and the like to the frequency-doubled FCSEL's first active-area 36B (FIGS. 7, 8, 9, 10, and 11).

In addition, the construction of a frequency-doubled FCSEL's first 800-nm thick (a thickness dimension that equals the 800-nm wavelength exhibited by the frequency-doubled FCSEL's two fundamental emissions) semiconductor superlattice using 32-layers of undoped 25-nm thick AlGaAs as construction material. Moreover, a frequency-doubled FCSEL's first semiconductor superlattice will have a deposited position located between a frequency-doubled FCSEL's second 37 and third 39 contact-layer, and used in the nonlinear second-order process of SFG; wherein, a frequency-doubled FCSEL's two fundamental emissions, each having a wavelength of 800-nm, are used to generate a frequency-doubled FCSEL's first frequency-doubled 400-nm laser emission.

Figure 18:
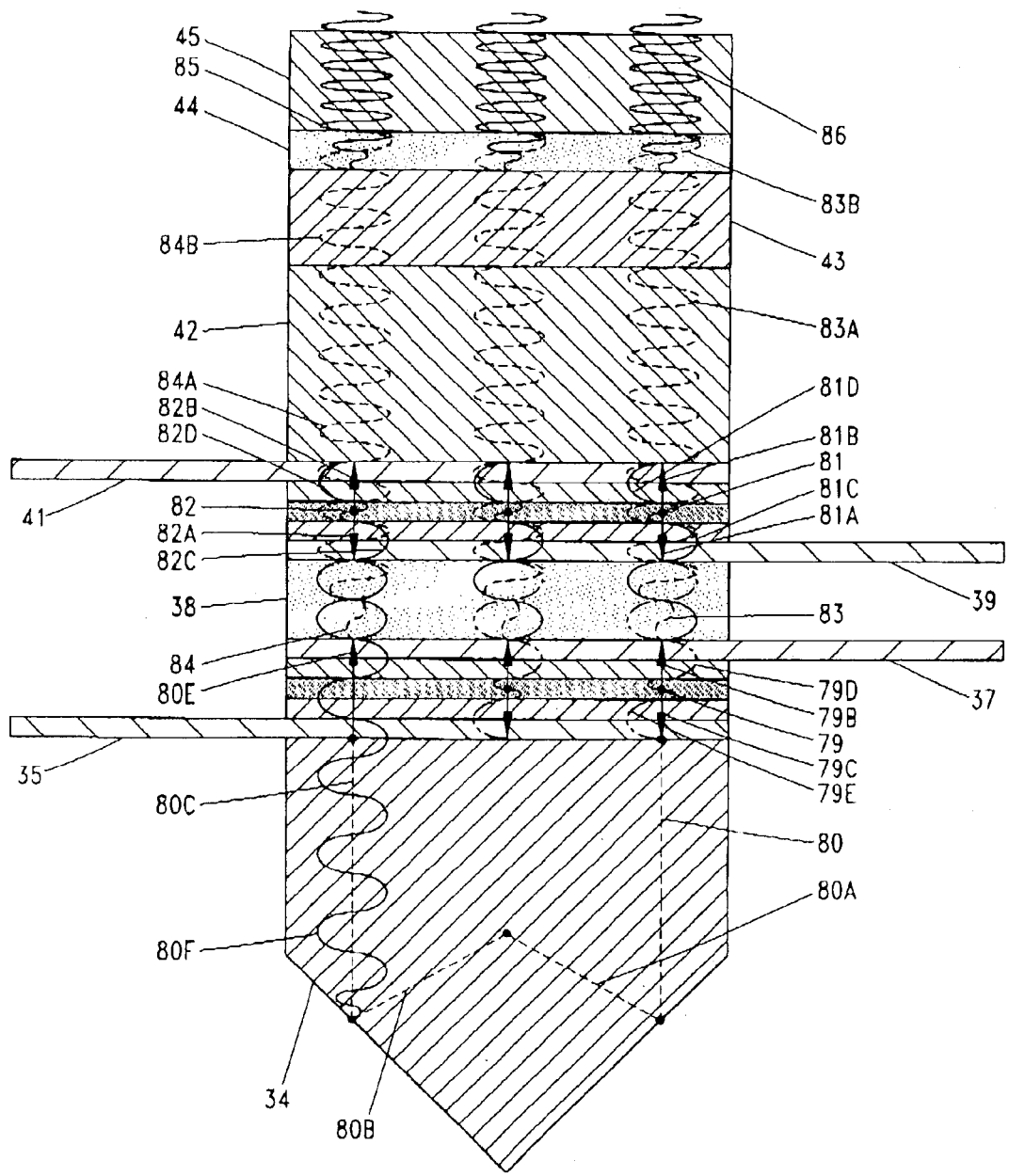
FIG. 18 shows a block diagram which is used to display the nonlinear mixing geometry used during a frequency-doubled FCSEL's production of both SFG and SHG second-order harmonics.

Furthermore, a frequency-doubled FCSEL's first wavelength converting semiconductor superlattice structure 38 (FIGS. 7, 8, 9, 27A, and 27B) is utilized in a frequency-doubling conversion of optical radiation emitted by a frequency-doubled FCSEL's two active-regions (also called Pump-1 and Pump-2) 36, 40 (FIGS. 7, 8, and 9). Moreover, a frequency-doubling conversion of the before mentioned contra-propagating laser emissions 79A, 79B, 79C (FIG. 18), 81A, 81B, 81C (FIG. 18) emitted by a frequency-doubled FCSEL's two active-regions 36, 40 (FIGS. 7, 8, 9, and 10). Further, the first process of frequency-doubling is accomplished through a second-order nonlinear optical process called (SFG) "Sum Frequency Generation" (i.e., sometimes called up-conversion). Whereby, a frequency-doubled FCSEL's two contra-propagating fundamental 800-nm laser emissions 79, 81 (FIG. 18) are up-converted into a single 400-nm laser emission 83A, 84A (FIG. 18).

Moreover, a frequency-doubled FCSEL's first semiconductor superlattice structure 38 consists of 32-odd and even numbered layers, which are constructed from AlGaAs, where each layer has a material thickness equaling 25-nm. Further, the 16 odd numbered layers located within a frequency-doubled FCSEL's first superlattice has a nonlinear optical-coefficient opposite in polarity, compared to the nonlinear optical-coefficient exhibited by the remaining 16 even numbered layers of the superlattice.

Therefore, the 16 odd numbered layers 109A, 109B, 109C, 109D, 109E, 109F, 109G, 109H, 109I, 109J, 109K, 109L, 109M, 109N, 109O, 1090P (FIGS. 27A and 27B) located within a frequency-doubled FCSEL's first superlattice have a 50% to 90% percent content of Aluminum, while the 16 even numbered layers 110A, 110B, 110C, 110D, 110E, 110F, 110G, 110H, 110I, 110J, 110K, 110L, 110M, 110N, 110O, 110P (FIGS. 27A and 27B) located within a frequency-doubled FCSEL's first superlattice structure have a 10% to 50% percent content of Aluminum.

In addition, a frequency-doubled FCSEL's first semiconductor superlattice structure 38 (FIGS. 7, 8, 9, and 10) is deposited between a frequency-doubled FCSEL's second contact-layer 37 (FIGS. 7, 8, 9, 10, and 11), (FIGS. 7, 8, 9, 10, and 11), (FIGS. 7, 8, 9, 10, and 11), and the frequency-doubled FCSEL's third contact-layer 39 (FIGS. 7, 8, 9, 10, and 11), (FIGS. 7, 8, 9, 10, and 11), (FIGS. 7, 8, 9, 10, and 11). Wherein, a frequency-doubled FCSEL's second and third contact-layers 37, 39 are both constructed using highly $p^+$ doped semiconductor material and therefore, act as conduits for the application of positive electrical current to a frequency-doubled FCSEL's first and second active-regions 36, 40. Further, a frequency-doubled FCSEL's first superlattice has a total thickness dimension of 800-nm, which also equals one wavelength of the frequency-doubled FCSEL's two contra-propagating fundamental emissions 79, 81 (FIG. 18). For example, if a frequency-doubled FCSEL's two fundamental emissions 79, 81 have a wavelength of 800-nm, then a frequency-doubled FCSEL's first superlattice should have an overall thickness dimension equaling 800-nm.

Furthermore, as illustrated in FIGS. 7, 8, 9, and 10, the construction of a frequency-doubled FCSEL's third 200-nm thick contact-layer 39 using a highly $p^+$ doped GaAs binary material is accomplished when it is epitaxially deposited between the top outermost surface of the frequency-doubled FCSEL's first superlattice 38, and the frequency-doubled FCSEL's third cladding-layer 40A (FIGS. 7, 8, 9, and 10). Moreover, a frequency-doubled FCSEL's third 200-nm thick contact-layer 39, while providing positive electrical connectivity to the frequency-doubled FCSEL's second active-region 40 (FIGS. 7, 8, 9, and 10), also enhances the reliability of the frequency-doubled FCSEL's design by preventing the migration of carrier-dislocations and the like to the frequency-doubled FCSEL's second active-region 40 (FIGS. 7, 8, 9, and 10).

In addition, the construction of a frequency-doubled FCSEL's third 200-nm thick cladding-layer 40A (FIGS. 7, 8, 9, 10, 19, and 19A) using a graded P doped GaAlAs ternary material is accomplished when it is epitaxially deposited between the top outmost surface of the frequency-doubled FCSEL's third contact-layer 39, and the frequency-doubled FCSEL's second active-area 40B (FIGS. 7, 8, 9, 10, 19, and 19A).

Wherein, the ternary material's concentration of Gallium gradient begins to gradually increase, starting from a third cladding-layer's bottom-edge 40A (FIGS. 7, 8, 9, 10, 19, and 19A), and gradually increases upward toward the frequency-doubled FCSEL's second active-area (i.e., called Pump-2) 40B (FIGS. 7, 8, 9, 10, 19, and 19A). For example, the amount of Gallium gradient is made to increase from $Ga_{0.55}Al_{0.45}As$, to $Ga_{0.60}Al_{0.40}As$, to $Ga_{0.65}Al_{0.35}As$, to $Ga_{0.70}Al_{0.30}As$, to $Ga_{0.75}Al_{0.25}As$, and finally to $Ga_{0.80}Al_{0.20}As$ 40A (FIGS. 7, 8, 9, 10, 19, and 19A).

Wherein, the ternary material's concentration of Aluminum gradient begins to gradually decrease, starting from the previously mentioned third cladding-layer's bottom-edge 40A (FIGS. 7, 8, 9, 10, 19, and 19A), where it gradually decreases upward toward the frequency-doubled FCSEL's second active-area 40B (i.e., called Pump-2) (FIGS. 7, 8, 9, 10, 19, and 19A). For example, the amount of Aluminum gradient begins to decrease from $Ga_{0.55}Al_{0.45}As$, to $Ga_{0.60}Al_{0.40}As$, to $Ga_{0.65}Al_{0.35}As$, to $Ga_{0.70}Al_{0.30}As$, to $Ga_{0.75}Al_{0.25}As$, and finally to $Ga_{0.80}Al_{0.20}As$ 40A (FIGS. 7, 8, 9, 10, 19, and 19A). Further, the frequency-doubled FCSEL was designed to have two active-areas 36B, 40B (FIGS. 7, 8, 9, 10, 19, and 19A), where each active-area is located within its own and separate active-region 36, 40 (i.e., respectfully called Pump-1 and Pump-2) (FIGS. 7, 8, 9, and 10).

Figure 25A:
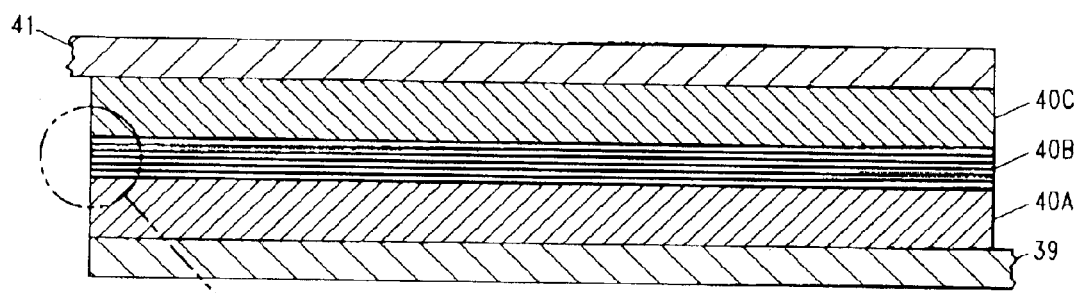
FIG. 25A shows a close-up sectional view of a frequency-doubled FCSEL's second active-region, displaying its two cladding-layers and multiple quantum-wells.
Figure 25B:
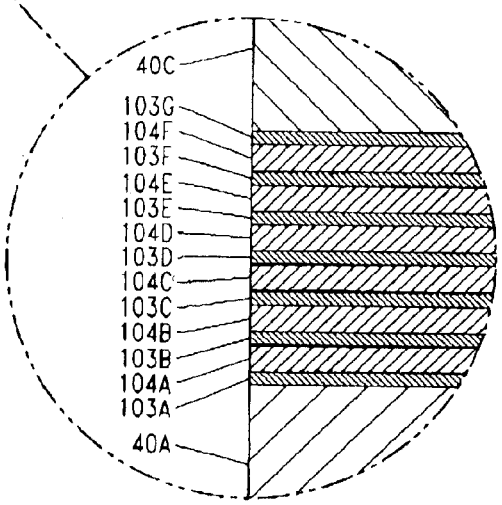
FIG. 25B shows an auxiliary close-up sectional view of a frequency-doubled FCSEL's second MQW, displaying details of the before mentioned active-area along its outer edge.

In addition, a frequency-doubled FCSEL's second active-area comprises a MQW 40B (FIGS. 7, 8, 9, and 10), which is deposited between the frequency-doubled FCSEL's third and fourth cladding-layers 40A, 40C (FIGS. 7, 8, 9, 10, and 19), and contains seven quantum-wells of undoped binary GaAs 103A, 103B, 103C, 103D, 103E, 103F, 103G (FIGS. 25A and 25B), and six quantum-well cladding-layers of undoped ternary GaAlAs 104A, 104B, 104C, 104D, 104E, 104F (FIGS. 25A and 25B). Further, all thirteen of the semiconductor layers that make up a frequency-doubled FCSEL's second active-area 40B should altogether exhibit a thickness dimension equaling one-quarter of one wavelength of the fundamental laser emission output by the frequency-doubled FCSEL's second active-region 40. For example, if a frequency-doubled FCSEL's second active-region 40 is designed to emit laser-light with a wavelength of 800-nm, then the frequency-doubled FCSEL's second active-area would need to have a thickness dimension equaling one-quarter (i.e., 200-nm) of one wavelength of the fundamental laser emission produced by the frequency-doubled FCSEL's second active-region 40.

Therefore, the combined thickness' of multiple quantum-wells and multiple quantum-well cladding-layers that make-up a frequency-doubled FCSEL's second active-area 40B (FIGS. 7, 8, 9, 10, 19, and 19A) should altogether have a total thickness dimension equaling one-quarter of one wavelength of the fundamental laser emission output by the frequency-doubled FCSEL's second active-region 40 (FIGS. 7, 8, 9, 10, 19, and 19A). Further, if a frequency-doubled FCSEL's second active-area has seven quantum-wells of undoped binary GaAs 103A, 103B, 103C, 103D, 103E, 103F, 103G (FIGS. 25A and 25B), they would each need to have a thickness dimension equaling 10.30-nm.

In addition, if a frequency-doubled FCSEL's second active-area has six quantum-well cladding-layers of undoped ternary GaAlAs 104A, 104B, 104C, 104D, 104E, 104F (FIGS. 25A and 25B), then they would each need to have a thickness dimension equaling 21.30-nm. Moreover, a frequency-doubled FCSEL's second active-area's 40B (FIGS. 7, 8, 9, 10, 19, and 19A) seven quantum-wells and six quantum-well cladding-layers combined thickness' would therefore, altogether equal a wavelength of 200-nm, or one-quarter of one wavelength of the fundamental emissions 81A, 81B, 81C, 82A, 82B, 82C (FIG. 18) emitted by the frequency-doubled FCSEL's second active-region 40 (FIGS. 7, 8, 9, 10, 19, and 19A). Wherein, emission, output by the frequency-doubled FCSEL's second active-region 40, would have a fundamental wavelength of 800-nm.

In addition, the construction of a frequency-doubled FCSEL's fourth 200-nm thick cladding-layer 40C (FIGS. 7, 8, 9, 10, 19, and 19A) using a graded N doped GaAlAs ternary semiconductor material is accomplished when, it is epitaxially deposited upon the top outermost surface of a frequency-doubled FCSEL's second active-area 40B (FIGS. 7, 8, 9, 10, 19, and 19A) between a frequency-doubled FCSEL's second active-area (i.e., called Pump-2) 40B and a frequency-doubled FCSEL's fourth contact-layer 41 (FIGS. 7, 8, 9, 10, and 19). Wherein, the ternary material's concentration of Gallium gradient is made to gradually increase, starting from a fourth cladding-layer's top-edge 40C and gradually increases downward toward a frequency-doubled FCSEL's second active-area (called Pump-2) 40B (FIGS. 7, 8, 9, 10, 19, and 19A). For example, the amount of Gallium gradient is made to increase from $Ga_{0.55}Al_{0.45}As$, to $Ga_{0.60}Al_{0.40}As$, to $Ga_{0.65}Al_{0.35}As$, to $Ga_{0.70}Al_{0.30}As$, to $Ga_{0.75}Al_{0.25}As$, and finally to $Ga_{0.80}Al_{0.20}As$ 40C (FIGS. 7, 8, 9, 10, 19, and 19A).

Wherein, the ternary material's concentration of Aluminum gradient is made to gradually decrease, starting from the previously mentioned fourth cladding-layer's top-edge 40C (FIGS. 7, 8, 9, 10, 19, and 19A), and gradually decreases downward toward a frequency-doubled FCSEL's before mentioned second active-area (called Pump-2) 40B (FIGS. 7, 8, 9, 10, 19, and 19A). For example, the amount of Aluminum gradient is made to decrease from $Ga_{0.55}Al_{0.40}As$ to $Ga_{0.60}Al_{0.40}As$ to $Ga_{0.65}Al_{0.35}$, to $Ga_{0.70}Al_{0.30}As$, to $Ga_{0.75}Al_{0.25}As$, and finally to $Ga_{0.80}Al_{0.20}As$ 40C (FIGS. 7, 8, 9, 10, 19, and 19A).

In addition, construction of a frequency-doubled FCSEL's fourth 200-nm thick contact-layer 41 (FIGS. 7, 8, 9, 10, 19, and 19A) using a highly $n^+$ doped GaAs Gallium-Arsenide binary material is accomplished when, it is epitaxially deposited upon the top outmost surface of the frequency-doubled FCSEL's fourth cladding-layer 40C (FIGS. 7, 8, 9, 10, 19, and 19A) between the frequency-doubled FCSEL's fourth cladding-layer 40C (FIGS. 7, 8, 9, 10, 19, and 19A) and the frequency-doubled FCSEL's first semi-reflecting quarter-wave mirror-stack assembly 42 (FIGS. 7, 8, 9, 10, 18, 19, and 19A). Moreover, a frequency-doubled FCSEL's fourth contact-layer 41, while providing, negative electrical connectivity to a frequency-doubled FCSEL's before mentioned second active-region, also enhances the reliability of a frequency-doubled FCSEL's design by preventing the migration of carrier-dislocations and the like to the frequency-doubled FCSEL's second active-region 40 (FIGS. 7, 8, 9, 10, 19, and 19A).

In addition, is the construction of a frequency-doubled FCSEL's first semi-reflecting quarterwave mirror-stack assembly 41 (FIGS. 7, 8, 9, 10, 19, and 19A), which will comprise a plurality of alternating layers of low and high refractive semiconductor material. Moreover, a plurality of one or more layers of undoped Gallium-Aluminum-Arsenide $Ga_{i-u}Al_uAs$, and one or more layers of undoped Gallium-Aluminum-Arsenide $Ga_{i-w}Al_{i-w}Al_wAs$ material, where w>u (i.e., were the amount of Aluminum is greater for the w represented material than for the u represented material, thereby changing the materials refractive indices). Moreover, the materials used in a frequency-doubled FCSEL's first semi-reflecting quarterwave mirror-stack assembly are deposited onto the frequency-doubled FCSEL's fourth contact-layer 41 (FIGS. 7, 8, 9, 10, 19, and 19A), using a well-known form of epitaxial deposition such as MBE or MOCVD.

For example, as illustrated in FIGS. 7, 8, 9, and 10, a layer of undoped Gallium-Aluminum-Arsenide $Ga_{i-u}Al_uAs$ material 200-nm thick 42A is deposited epitaxially upon a frequency-doubled FCSEL's fourth and last contact-layer 41 (FIGS. 7, 8, 9, 10, 19, and 19A), while a layer of undoped Gallium-Aluminum-Arsenide $Ga_{i-w}Al_wAs$ material 200-nm thick 42B is subsequently and epitaxially deposited upon the first 200-nm thick layer of undoped Gallium-Aluminum-Arsenide $Ga_{i-u}Al_uAs$ 42A, thereby making the first mirror pair of (GaAlAs/GaAlAs) reflectors.

Furthermore, as illustrated in FIGS. 7, 8, 9, and 10, if additional mirror-pairs are required several more layers of additional mirror-pairs can be deposited upon a frequency-doubled FCSEL's first semi-reflecting quarterwave mirror-stack's existing high-refractive layers of undoped GaAlAs 42A, 42C, 42E, 42G, 42I, and existing low-refractive layers of undoped GaAlAs 42B, 42D, 42F, 42H, 42J. Further, it should be understood that a frequency-doubled FCSEL's first semi-reflecting quarterwave mirror-stack assembly 42 (FIGS. 7, 8, 9, and 10) also functionally serves as a multi-layered reflector for the frequency-doubled FCSEL's two fundamental 800-nm wavelength emissions. Additionally, the plurality of alternating layers that make-up a frequency-doubled FCSEL's first quarterwave mirror-stack assembly are formed from one mirror-pair to ten mirror-pairs, with a preferred number of mirror-pairs ranging from four to five mirror-pairs 42, as illustrated in FIGS. 7, 8, 9, and 10.

In addition, as illustrated in FIGS. 7, 8, and 9, is the construction of a frequency-doubled FCSEL's second semi-reflecting quarterwave mirror-stack assembly 43, which is made from a plurality of alternating layers of high and low-refractive materials. Moreover, a plurality of one or more layers of ($CaCO_3$) "Calcium-Carbon-Trioxide" (i.e., sometimes called Calcite) material, and one or more layers of ($MgF_2$) "Magnesium-Difluoride". Moreover, the layers that make up the frequency-doubled FCSEL's second semi-reflecting quarterwave mirror-stack assembly 43 are to be deposited upon the last layer of undoped (GaAlN) "Gallium Aluminum Nitride" $Ga_{i-w}Al_wAs$ 42J of the frequency-doubled FCSEL's first mirror-stack assembly 42.

For example, a layer of $CaCO_3$ 100-nm thick 43A (FIGS. 7, 8, and 9) is deposited epitaxially onto the last 200-nm thick layer of undoped GaAlAs 42J of the frequency-doubled FCSEL's first mirror-stack assembly, while a layer of $MgF_2$ material 100-nm thick 43B (FIGS. 7, 8, and 9) is subsequently deposited onto the first 100-nm thick $CaCO_3$ layer 43A of the frequency-doubled FCSEL's second mirror-stack assembly; therein, making the first mirror pair of ($CaCO_3$/$MgF_2$) reflectors. Further, if additional mirror-pairs are required several more layers of additional mirror-pairs can be deposited onto a frequency-doubled FCSEL's second semi-reflecting quarterwave mirror-stack's existing layers of $CaCO_3$ 43A, 43C, 43E, 43G, 43I and $MgF_2$ 43B, 43D, 43F, 43H, 43J.

Furthermore, as illustrated in FIGS. 7, 8, 9, and 10, it should be understood that the second semi-reflecting quarterwave mirror-stack assembly 43, functionally serves as a frequency-doubled FCSEL's multilayered frequency specific light-confining and light-forwarding reflector, specifically for 400-nm laser emissions 84B. Additionally, the plurality of alternating layers that make-up a frequency-doubled FCSEL's second quarterwave mirror-stack assembly are formed from one mirror-pair to ten mirror-pairs with a preferred number of mirror-pairs ranging from four to five mirror-pairs 43 (FIGS. 7, 8, 9, and 10).

In addition, as illustrated in FIGS. 7, 8, 9, 10, and 18, a preferred embodiment is a frequency-doubled FCSEL's second semiconductor superlattice 44, which is used in a frequency-doubling wavelength conversion of the sum frequency generated emissions that were produced by the first semiconductor superlattice structure 38. Further, the frequency-doubling conversion of the sum frequency generated emissions 83A, 84A (FIG. 18) is accomplished through a nonlinear second-order optical process called (SHG) "Second Harmonic Generation". Moreover, SHG is a process whereby, sum frequency generated emissions 83A, 84A (FIG. 18), being extracted from a frequency-doubled FCSEL's first semiconductor superlattice and having a wavelength of 400-nm is converted into a second frequency-doubled group of emissions 83A, 84A (FIG. 18), which will have a new wavelength of 200-nm.

In addition, as illustrated in FIGS. 7, 8, 9, 10, 18, 28A, and 28B, a frequency-doubled FCSEL's second semiconductor superlattice 44 also consists of 32-odd and even numbered layers of AlGaAs. Wherein, each AlGaAs layer has a thickness dimension of 12.5-nm. Further, the 16-odd numbered layers within the second semiconductor superlattice have a nonlinear optical-coefficient opposite in polarity to the nonlinear optical-coefficient of its 16-even numbered layers. Therefore, the odd numbered layers 111A, 111B, 111C, 111D, 111E, 111F, 111G, 111H, 111I, 111J, 111K, 111L, 111M, 111N, 111O, 111P (FIGS. 28A and 28B) located within a frequency-doubled FCSEL's second semiconductor superlattice have a 50% to 90% content of Aluminum, while the even numbered layers 112A, 112B, 112C, 112D, 112E, 112F, 112G, 112H, 112I, 112J, 112K, 112L, 112M, 112N, 112O, 112P (FIG. 28B) located within a frequency-doubled FCSEL's second semiconductor superlattice have a 10% to 50% content of Aluminum.

In addition, as illustrated in FIGS. 7, 8, 9, 10, 18, 28A, and 28B, a frequency-doubled FCSEL's second semiconductor superlattice 44 is deposited between a frequency-doubled FCSEL's second quarterwave mirror-stack assembly 43, and a frequency-doubled FCSEL's third and final quarterwave mirror-stack assembly 45. Further, a frequency-doubled FCSEL's second semiconductor superlattice 44 must have an overall size and material thickness that equals one wavelength of the frequency-doubled FCSEL's first extracted laser emissions of 400-nm 83A, 84A (FIG. 18).

Moreover, a frequency-doubled FCSELs first frequency-doubled emission of 400-nm is to be frequency-doubled within a second semiconductor superlattice using a nonlinear second-order optical process called (SHG) "Second Harmonic Generation". For example, if a frequency-doubled FCSEL's first semiconductor superlattice 38 frequency-doubled and extracted laser emissions 83A, 84A (FIG. 18) have a wavelength of 400-nm, then the frequency-doubled FCSEL's second semiconductor superlattice 44 would need to have an overall size and material thickness equaling 400-nm.

In addition, as illustrated in FIGS. 7, 8, 9, 10, and 18, a frequency-doubled FCSEL's third semi-reflecting quarterwave mirror-stack assembly 45 is made from a plurality of alternating layers of low- and high-refractive material. Moreover, a plurality of one or more layers of $MgF_2$, and one or more layers of $CaCO_3$ are deposited onto the 32nd and topmost layer of undoped AlGaAs 23J of the frequency-doubled FCSEL's second semiconductor superlattice.

For example, as illustrated in FIGS. 7, 8, 9, 10, and 18, a layer of $MgF_2$ 100-nm thick 45A is epitaxially deposited onto the 32nd and topmost layer of undoped AlGaAs 44J of the frequency-doubled FCSEL's second semiconductor superlattice 44, while a layer of $CaCO_3$ material 100-nm thick 45B, is subsequently and epitaxially deposited onto the frequency-doubled FCSEL's third mirror-stack assembly's first 100-nm thick layer of $MgF_2$ 45A, making a first mirror-pair of (MgF$_2$/CaCO$_3$) dielectric reflectors 45A, 45B. Further, if additional mirror-pairs are required several more layers of additional mirror-pairs can be deposited onto the existing 100-nm thick layers of MgF$_2$ 45A, 45C, 45E, 45G, 45I and CaCO$_3$ 45B, 45D, 45F, 45H, 45J.

Furthermore, as illustrated in FIGS. 7, 8, 9, 10, and 18, it should be understood that the third and topmost semi-reflecting dielectric quarterwave mirror-stack assembly 45, also functionally serves as a frequency-doubled FCSEL's reflector of 400-nm wavelength emission, and as a frequency-doubled FCSEL's extractor of 200-nm wavelength emission output. Moreover, if additional mirror-pairs are required, then several more layers of additional mirror-pairs can be deposited onto the top outermost surface of the existing 200-nm thick layers of MgF$_2$ 45A, 45C, 45E, 45G, 45I, and CaCO$_3$ 45B, 45D, 45F, 45H, 45J. Further, the plurality of alternating layers that make-up a frequency-doubled FCSEL's third quarterwave mirror-stack assembly are formed from one mirror-pair to ten mirror-pairs with a preferred number of mirror pairs ranging from four to five mirror-pairs 45.

In addition, as illustrated in FIGS. 7, 8, 9, 10, 18, 19A, 19B, 20A, 20B, 21A, and 21B, a frequency-doubled FCSEL's internal reflecting corner-cube shaped polyhedral prism waveguide 34, if constructed using Quartz (SiO$_2$) "Silicon-Dioxide" (i.e., sometimes called fused silica), will reflect internally 100%, any wavelength of optical radiation entering its plane-parallel, flat horizontal, and circular top front-face surface.

Furthermore, a frequency-doubled FCSEL's corner-cube polyhedral prism waveguide is exactly what its name implies, a polyhedral prism waveguide having the shape of a cube's corner 34, which is cut off orthogonal to one of its (i.e., body-diagonal) triad axes, while the resultant polyhedral prism's top plane-parallel and flat horizontal surface is as a result, formed into a planar-flat and circular surface 87C, 34D, 90B.

Moreover, as illustrated in FIGS. 19A, 19B, 20A, 20B, 21A, and 21B, a frequency-doubled FCSEL's corner-cube polyhedral prism waveguide's three polyhedral prisms will totally redirect internally, any incoming light-rays 79A backwards a 180° 80D toward their original direction and light source, no matter what the light-rays' angle of incidence was on the corner-cube polyhedral prism waveguide's plane-parallel, flat horizontal, and circular top front-face surface 34D. Therefore, an internally reflected light-ray is shifted laterally by an amount that depends upon the light-ray's point of entry.

Figure 20A:
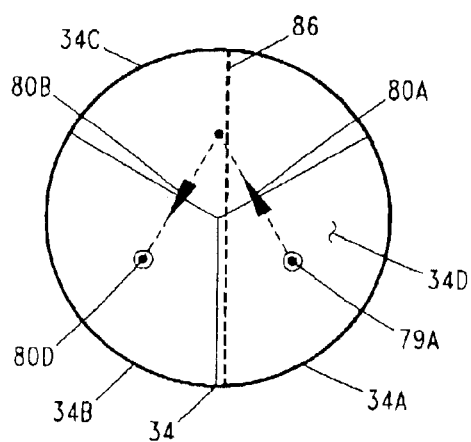
FIG. 20A shows a 3D orthographic plan-view of a frequency-doubled FCSEL's corner-cube prism waveguide and a ray-traced pathway for a single light ray as it internally reflects through the structure of the waveguide.
Figure 20B:
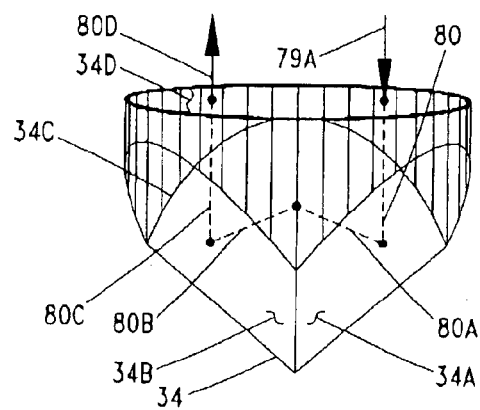
FIG. 20B shows a 10° 3D isometric top side-view of a frequency-doubled FCSEL's corner-cube prism waveguide and a ray-traced pathway for a single light ray as it internally reflects through the structure of the waveguide.

Furthermore, as illustrated in FIGS. 20A and 20B, a frequency-doubled FCSEL's corner-cube polyhedral prism waveguide 34 is displayed as a three-dimensional object showing the corner-cube polyhedral prism waveguide along with a raytraced pathway for an incoming 79A (FIGS. 20A and 20B) and outgoing 80D (FIGS. 20A and 20B) light-ray made incidental upon the corner-cube polyhedral prism waveguide's plane-parallel, flat horizontal, and circular top front-face surface 34D.

Moreover, the main function of illustrations FIGS. 20A and 20B is to describe, through the use of two simple geometric diagrams, how light-rays, when entering a frequency-doubled FCSEL corner-cube polyhedral prism waveguide's plane-parallel, flat horizontal, and circular top front-face surface 34D are internally redirected backwards a 180° toward their originating light source 80D.

Moreover, as illustrated in FIGS. 20A and 20B, when a light-ray 79A enters the before mentioned plane-parallel, flat horizontal, and circular top front-face surface 34D of a frequency-doubled FCSEL's corner-cube polyhedral prism waveguide 34 it will first travel to one of the corner-cube polyhedral prism waveguide's three internal polyhedral prism facets 34A located at the corner-cube polyhedral prism waveguide's bottom 34A, 34B, 34C, where it 80 will be redirected 80A 100% from a first internal polyhedral prism-facet 34A to a second internal polyhedral prism-facet 34C, where it will be redirected 80B 100% to a third internal polyhedral prism-facet 34B, where it will be redirected 80C 100% up and out of the frequency-doubled FCSEL's corner-cube polyhedral prism waveguide's plane-parallel, flat horizontal, and circular top front-face surface 80D backwards into the frequency-doubled FCSEL's vertical cavity for further amplification.

Figure 1:
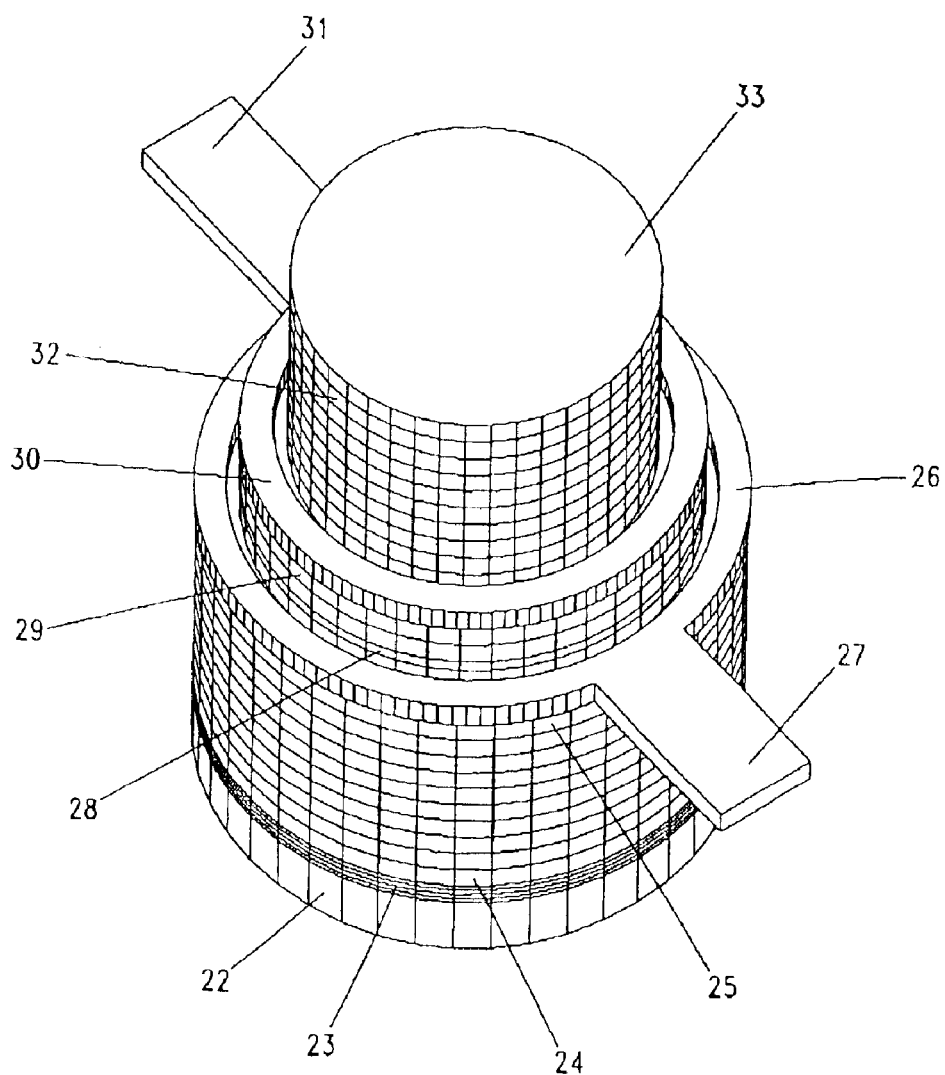
FIG. 1 shows prior art illustrated as a three-dimensional isometric top side-view of a mesa-etched VCSEL comprising one substrate layer, one active-region, and two quarterwave mirror-stack assemblies.
Figure 2:
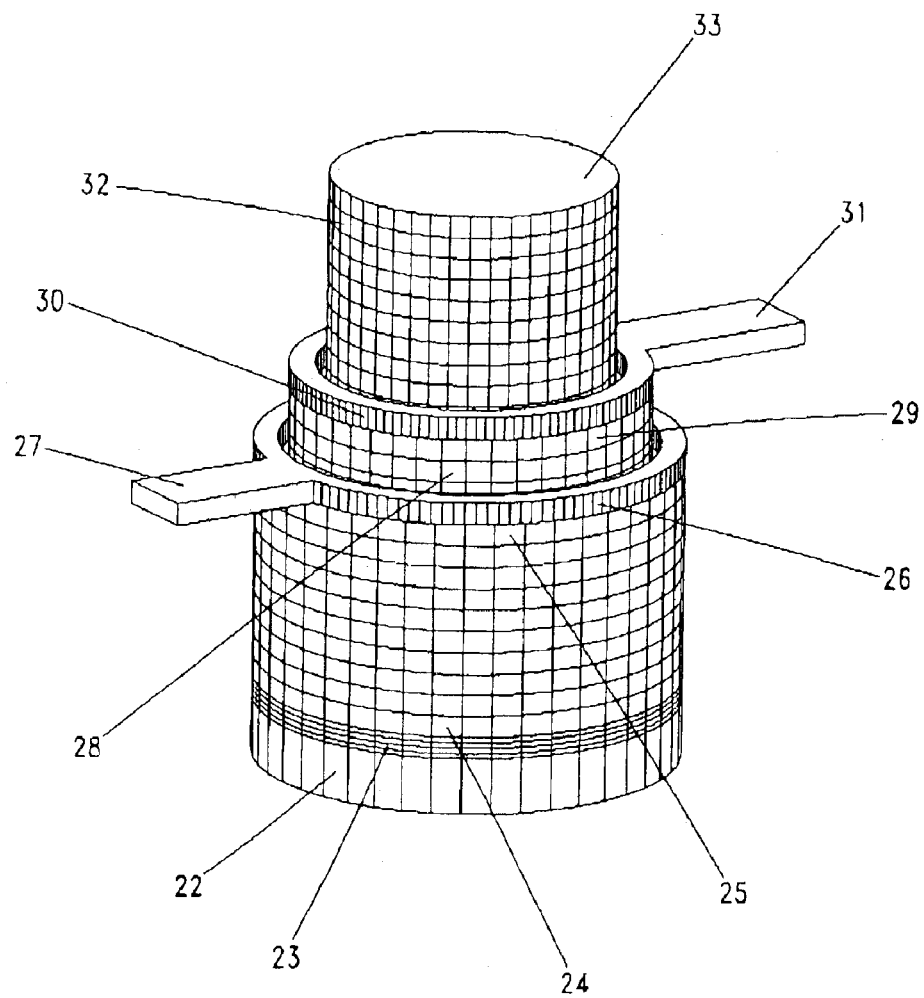
FIG. 2 shows prior art illustrated as a three-dimensional isometric top front-view of a mesa-etched VCSEL comprising one substrate layer, one active-region, and two quarterwave mirror-stack assemblies.
Figure 3:
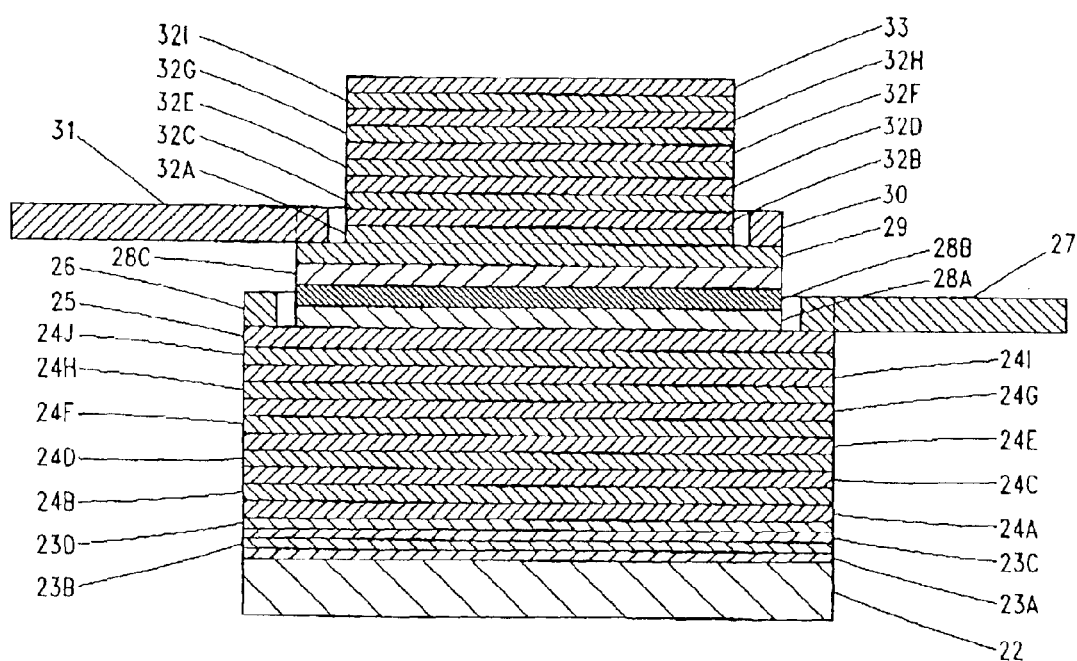
FIG. 3 shows prior art illustrated as an orthographic side-view vertical section of a mesa-etched VCSEL displayed as a multilayered structure comprising one substrate layer, one active-region, and two quarterwave mirror-stack assemblies.
Figure 4:
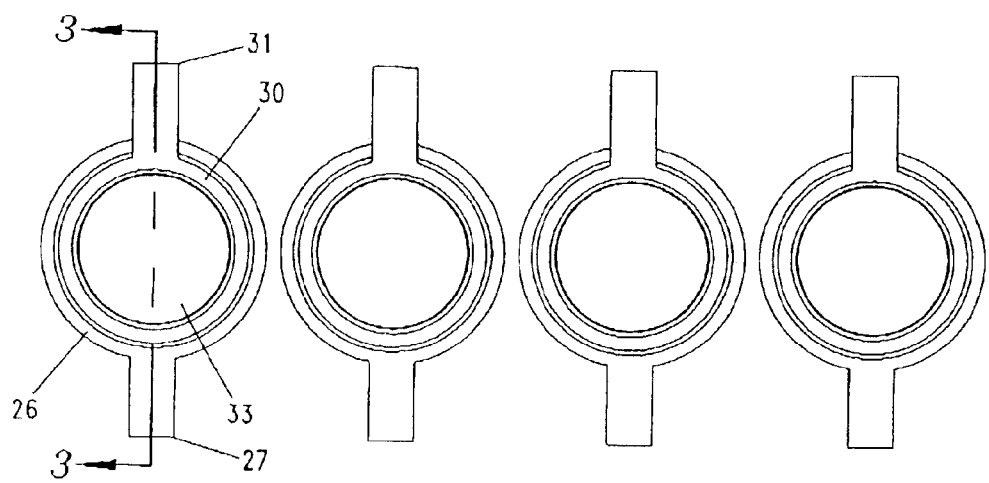
FIG. 4 shows prior art illustrated as an orthographic plan-view of a linear array of four VCSELs comprising n-metal connector rings, p-metal connector rings, n-metal connectors, p-metal connectors, emitter-layers, and section line 3—3.
Figure 5:
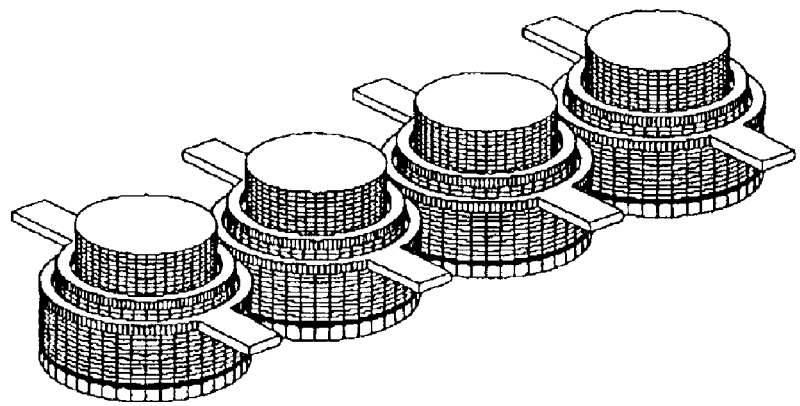
FIG. 5 shows prior art illustrated as a three-dimensional isometric top-right side-view of four mesa-etched VCSELs shown in a linear array configuration.
Figure 6:
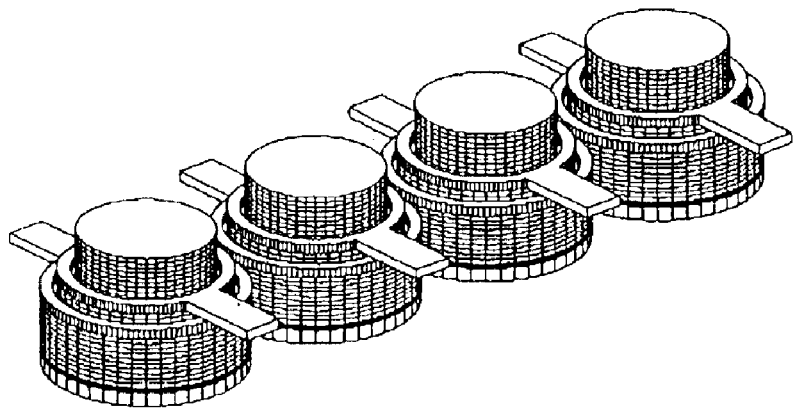
FIG. 6 shows prior art illustrated as a three-dimensional isometric top-left side-view of four mesa-etched VCSELs shown in a linear array configuration.

In addition, as a preferred embodiment of the present invention, as illustrated in FIGS. 20A and 20B, a polyhedral prism waveguide 87, 34, 90 is used in place of what is typically known in prior-art as the primary quarter-wave DBR configured mirror-stack assembly. Typically, as illustrated in FIGS. 1, 2, and 3, before the epitaxial deposition of (AlN) "Aluminum-Nitride", (GaN) "Gallium-Nitride", and/or (AlGaN) "Aluminum-Gallium-Nitride" can occur, pre-deposition of buffer-layers 2A, 2B, 2C, 2D, using a material such as (AlN) "Aluminum-Nitride", must be made onto the top outermost surface of a metallic substrate 22.

However, by using a frequency-doubled FCSEL's polyhedral prism waveguide 87, 34, 90 made from "Fused Silica" in place of quarterwave DBR mirror-stack assemblies, the need for buffering layers is completely eliminated. Further, the location of a frequency-doubled FCSEL's polyhedral prism waveguide is at the base of the frequency-doubled FCSEL's vertical cavity, and is used to replace the more conventional metallic alloy and/or sapphire substrates 22 and the planar-flat multilayered quarterwave DBR mirror-stack assemblies 24 (FIG. 3) normally used in prior-art VCSEL with a single layered monolithic structure 87, 34, 90, which is made from a single layer of "Fused Silica" and will transmit and reflect all wavelengths of optical radiation.

Furthermore, as illustrated in FIGS. 19A, 19B, 20A, 20B, 21A, and 21B, the polyhedral prism waveguides used in frequency-doubled FCSELs are mono-structural (i.e., formed into a single shape from a single material) polyhedrons and therefore tend to be geometrically complex, but structurally simply, as opposed to the previously mentioned quarterwave DBR mirror-stack assemblies 24 typically used in prior-art VCSELs, which tend to be geometrically simple, but structurally complex, and are typically comprised as multilayered structures having a multitude of thin-film planar-flat mirror plates that are constructed from materials with alternate refractive indices.

Moreover, a frequency-doubled FCSEL's mono-structural polyhedral prism waveguide 87, 34, 90, when constructed using SiO$_2$ are inexpensive to manufacture, moisture resistant, heat resistant, non-conducting, and easy to use in the construction of frequency-doubled FCSELs. The previously mentioned SiO$_2$ material is amorphous (i.e., a material made up of molecules that lack a distinct crystalline structure) and therefore, also has an absolute lattice-mismatch to semiconductors like (GaAs) "Gallium-Arsenide" and (AlGaAs) "Aluminum-Gallium-Arsenide and to other Zinc-blend semiconductor materials as well, which tends to promote a greater reflectivity at the material interface that lies between the frequency-doubled FCSEL's first contact layer 35 (FIGS. 7, 8, 9, 10, and 11) and the frequency-doubled FCSEL's polyhedral prism waveguide 87, 34, 90.

In addition, as illustrated in FIGS. 20A and 20B, a frequency-doubled FCSEL's polyhedral prism waveguide would also be optically transparent, optically transmitting, and optically reflective to all intra-cavity optical radiation having wavelengths that range from the very-short 150-nm of ultraviolet radiation to the very-long 5000-nm of infrared radiation.

Figures 21A, 21B:
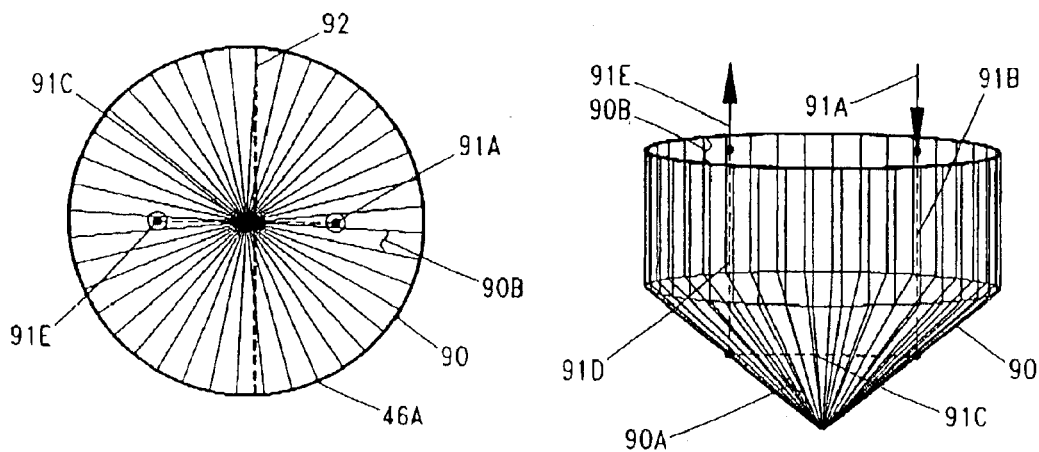
FIG. 21A shows a 3D orthographic plan-view of a frequency-doubled FCSEL's cone prism waveguide and a ray-traced pathway for a single light ray as it internally reflects through the structure of the waveguide.
FIG. 21B shows a 10° 3D isometric top side-view of a frequency-doubled FCSEL's cone prism waveguide and a ray-traced pathway for a single light ray as it internally reflects through the structure of the waveguide.

Moreover, remembering that it is the polyhedral prism waveguide's mono-structural geometry that gives it the ability to totally redirect all optical radiation entering its plane-parallel, flat-horizontal, and circular top front-face surface 87C (FIGS. 19A and 19B), 34D (FIGS. 20A and 20B), 90B (FIGS. 21A and 21B).

Furthermore, the frequency-doubled FCSEL design increases modal discrimination by extending its optical-cavity length using the polyhedral prism waveguide as the means. The previously mentioned polyhedral prism waveguide, because it lengthens a frequency-doubled FCSEL's optical-cavity, works by increasing diffraction loss to high-order transverse optical modes thus, increasing gain to fundamental low-order transverse optical modes.

Therefore, by replacing the primary quarterwave DBR mirror-stack assembly, typical for VCSEL designs with a polyhedral prism waveguide, we increase the output of its fundamental single-transverse optical moded laser emission to nearly 7-mW.

In addition, as an additional embodiment of the present invention, a phase-matching layer comprised as a superlattice constructed using a compound semiconductor comprising of elements taken from columns III–V and II–VI of the 'Periodic Table of Elements' to form layers having an orientation substantially identical to that of the layers that comprise two active-regions. Wherein, the last spacer-layer may be comprised as the first superlattice, which also functions as a phase-matching layer. Alternatively, the two active-regions or at least one of the spacer-layers (i.e., preferably called cladding-layers) may be comprised as superlattices, which also function as phase-matching layers. Other additional embodiments of the present invention are described below.

Figure 19A:
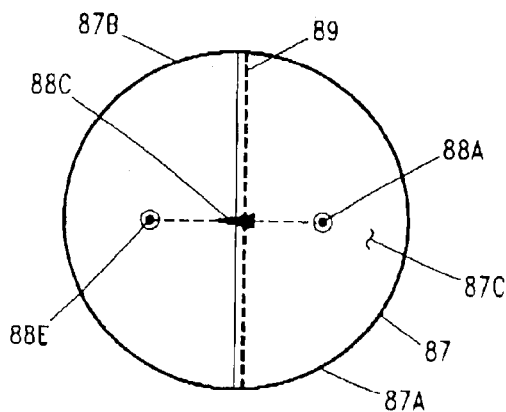
FIG. 19A shows a 3D orthographic plan-view of a frequency-doubled FCSEL's roof prism waveguide and a ray-traced pathway for a single light ray as it internally reflects through the structure of the waveguide.
Figure 19B:
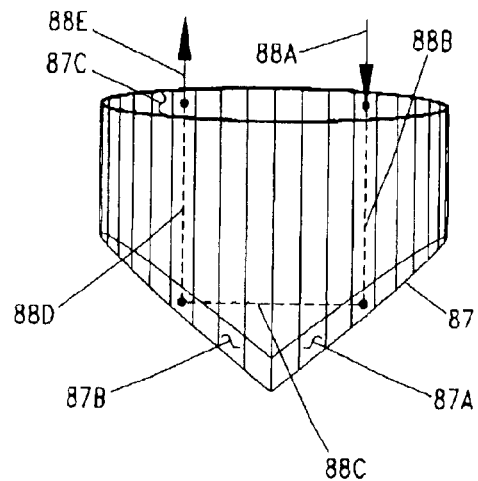
FIG. 19B shows a 10° 3D isometric top side-view of a frequency-doubled FCSEL's roof prism waveguide and a ray-traced pathway for a single light ray as it internally reflects through the structure of the waveguide.

In addition, as an additional embodiment of the present invention, as illustrated in FIGS. 13, 14, 17, and 18, two additional forms of the polyhedral prism waveguide which, if comprised of $SiO_2$, will also reflect internally 100% any wavelength of optical radiation entering their plane-parallel, flat horizontal, and circular top front-face surface 87C (FIGS. 19A and 19B), 34D (FIGS. 20A and 20B), 90B (FIGS. 21A and 21B). The first additional embodiment, as illustrated in FIGS. 19A and 19B, describes a right-angle prism shaped polyhedral prism waveguide. Whereby, FIG. 19B (i.e., an isometric three-dimensional-view) displays an isometric three-dimensional-view of a frequency-doubled FCSEL's right-angle prism shaped polyhedral prism waveguide 87 along with a raytraced pathway for an incoming 88A and outgoing 88E light-ray incidental upon the right-angle prism shaped polyhedral prism waveguide's plane-parallel, flat horizontal, and circular top front-face surface 87C (FIG. 19B).

In addition, FIG. 19A (i.e., an orthographic top plan-view) displays an orthographic plan-view of a frequency-doubled FCSEL's right-angle prism shaped polyhedral prism waveguide 87 and raytraced pathway for an incoming 88A and outgoing 88E light-ray incidental upon of the frequency-doubled FCSEL's right-angle prism shaped polyhedral prism waveguide's top plane-parallel, flat horizontal, and circular front-face surface 87C (FIG. 19A). The main function of illustrations FIGS. 19A and 19B is to describe through the use of two simple geometric diagrams how light-rays 88 (FIGS. 19A and 19B) when they enter a frequency-doubled FCSEL's right-angle prism shaped polyhedral prism waveguide's plane-parallel, flat horizontal, and circular top front-face surface 87C (FIGS. 19A and 19B) are internally reflected backwards 180° toward their originating light source 88E.

Moreover, as illustrated in FIGS. 19A and 19B, when a light-ray 88A enters the plane-parallel, flat horizontal, and circular top front-face surface 87C of a frequency-doubled FCSEL's right-angle prism shaped polyhedral prism waveguide 87 it will first travel to one of the right-angle prism shaped polyhedral prism waveguide's two internal polyhedral prism-facets, which are located at the bottom of the right-angle prism shaped polyhedral prism waveguide 87A, 87B (FIGS. 19A and 19B), where it 88B will be redirected 88C 100% into a 90° transverse direction from a first internal polyhedral prism-facet 87A to a second internal polyhedral prism-facet 87B, where it will be redirected 88D 100% into a 90° longitudinal direction up and out of the plane-parallel, flat horizontal, and circular top front-face surface 87C of the right-angle prism shaped polyhedral prism waveguide backwards into the frequency-doubled FCSEL's vertical cavity 88E for further amplification.

Another additional embodiment, as illustrated in FIGS. 21A and 21B, describes a conical shaped polyhedral prism waveguide 90, if comprised of $SiO_2$, will reflect internally 100% any wavelength of optical radiation entering its plane-parallel, flat horizontal, and circular top front-face surface 90B. Further, FIG. 21B (i.e., an isometric three-dimensional-view) displays an isometric three-dimensional-view of a frequency-doubled FCSEL's conical shaped polyhedral prism waveguide 90 along with a raytraced pathway for an incoming 91A and outgoing 91E light-ray that is incidental upon the conical shaped polyhedral prism waveguide's plane-parallel, flat horizontal, and circular top front-face surface 90B.

In addition, FIG. 21A (i.e., an orthographic top plan-view) displays an orthographic plan-view of a frequency-doubled FCSEL's conical shaped polyhedral prism waveguide 90 along with a raytraced pathway for an incoming 91A and outgoing 91E light-ray that is incidental upon of the conical shaped polyhedral prism waveguide's top plane-parallel, flat horizontal, and circular front-face surface 90B (FIGS. 21A and 21B). The main function of illustrations FIGS. 21A and 21B is to describe through the use of two simple geometric diagrams how light-rays 91 (FIGS. 21A and 21B), when they enter a frequency-doubled FCSEL's conical shaped polyhedral prism waveguide's plane-parallel, flat horizontal, and circular top front-face surface 90B (FIGS. 21A and 21B), are internally reflected backwards 180° toward their originating light source 88E.

Moreover, when the previously mentioned light-ray 91A (FIGS. 21A and 21B) enters the plane-parallel, flat horizontal, and circular top front-face surface 90B (FIGS. 21A and 21B) of a frequency-doubled FCSEL's conical shaped polyhedral prism waveguide 90 (FIGS. 21A and 21B) it will first travel to the conical shaped polyhedral prism waveguide's curved polyhedral prism-facet 90A (FIGS. 21A and 21B), which is located at the conical shaped polyhedral prism waveguide's bottom 90A, where it 91B (FIGS. 21A and 21B) will be redirected 91C (FIGS. 21A and 21B) 100% into a 90° transverse direction from the curved internal polyhedral prism-facet 91A to the other side of the curved internal polyhedral prism-facet 91A (FIGS. 21A and 21B), where it will be redirected 91D (FIGS. 21A and 21B) 100% into a 90° degree longitudinal direction up and out of the frequency-doubled FCSEL's conical shaped polyhedral prism waveguide's plane-parallel, flat horizontal, and circular top front-face surface 90B (FIGS. 21A and 21B) backwards into the frequency-doubled FCSEL's vertical cavity for further amplification 91E.

An additional embodiment of the present invention, as illustrated in FIGS. 7, 8, 9, 13, 14, 15, 16, 17, and 18, is described as being the material distribution process for the polyhedral prism waveguides 87, 34, 90. Further, if constructed from $SiO_2$, the polyhedral prism waveguides are to be sputter deposited onto the bottom outermost surface of the frequency-doubled FCSEL's first $n^+$ doped (GaAs) "Gallium-Arsenide" crystalline semiconductor contact-layer 35 (FIGS. 7, 8, 9, 10, and 11), while the contact-layer's top outermost surface will be used as a crystal growing substrate for the growth of the frequency-doubled FCSEL's remaining crystalline semiconductor structures, using MBE or MOCVD as the preferred method of epitaxial deposition.

Furthermore, the reason why the top outermost surface of a frequency-doubled FCSEL's first $n^+$ doped GaAs semiconductor contact-layer 35 is used as the crystal growing substrate for growing the frequency-doubled FCSEL's remaining crystalline semiconductor structures is because the polyhedral prism waveguides deposited at the very bottom of the frequency-doubled FCSEL's optical cavity are constructed using $SiO_2$ and therefore, cannot be used as a crystal semiconductor growing substrate material.

Moreover, this is because $SiO_2$, being a dielectric material used in the construction of the polyhedral prism waveguides is amorphous and therefore, can never be used to grow the frequency-doubled FCSEL's succeeding layers of crystalline semiconductor materials. To explain this further, $SiO_2$ can never be used as a growth material during a MBE or a MOCVD epitaxial deposition of a frequency-doubled FCSEL's layers of crystalline semiconductor material during the process of MBE or MOCVD deposition because, a deposited material during its growth will take on the same crystalline or non-crystalline molecular structure exhibited by the substrate material it is being grown upon.

Consequently, if a frequency-doubled FCSEL's polyhedral prism waveguides 87 (FIGS. 19A and 19B), 34 (FIGS. 20A and 20B), 90 (FIGS. 21A and 21B) are made from $SiO_2$ then any crystalline semiconductor material if epitaxially deposited upon its amorphous structure will also during its growth acquire the $SiO_2$ material's amorphous non-crystalline form, and because the frequency-doubled FCSEL's subsequent layers need to have crystalline structures to function, $SiO_2$ is useless as a growth material used in the production of crystalline double-heterostructure light emitting diodes, crystalline quarterwave mirror-stacks, and any other crystalline structures that might be used to control the polarization, modulation, and/or frequency of the frequency-doubled FCSEL's laser emissions.

Furthermore, the distribution of $SiO_2$, if used in the construction of a frequency-doubled FCSEL's polyhedral prism waveguides 87 (FIGS. 19A and 19B), 34 (FIGS. 20A and 20B), 90 (FIGS. 21A and 21B), is accomplished using a well known sputtering process upon the bottom outermost planar-flat surface that underlies the frequency-doubled FCSEL's first $n^+$ doped binary GaAs comprised contact-layer 35 (FIGS. 7, 8, 9, 10, and 11), whose top outmost surface also doubles as the frequency-doubled FCSEL's crystal growing substrate. For example, a layer of $SiO_2$ approximately 1000-nm thick is sputter deposited onto the bottom outermost surface of a frequency-doubled FCSEL's first contact-layer 35 (FIGS. 7, 8, 9, 10, and 11) of highly $n^+$ doped binary GaAs semiconductor material. Thereinafter, a photo-resist is applied and latter lithography etching processes are used to remove the excess $SiO_2$ that surrounds the frequency-doubled FCSEL's polyhedral prism waveguide(s) revealing therein, cylindrical shaped base-structure(s).

Moreover, a well known ion-milling process is employed to slice out the polyhedral prism waveguide(s) 87 (FIGS. 19A and 19B), 34 (FIGS. 20A and 20B), 90 (FIGS. 21A and 21B) polyhedral prism facets 87A, 87B (FIGS. 19A and 19B), 34A, 34B, 34C (FIGS. 20A and 20B), 90A (FIGS. 21A and 21B), while a material like (LiF) "Lithium-Fluoride" 46 (FIGS. 9, 10, and 11), having a very low-refractive index is deposited, using a well known sputtering process, around the frequency-doubled FCSEL's $SiO_2$ comprised polyhedral prism waveguide(s). Thereinafter, the excess LiF 46 (FIGS. 9, 10, and 11) cladding material can be partially removed using a well-known ion-milling process; leaving the polyhedral prism waveguide's facets 87A, 87B (FIGS. 19A and 19B), 34A, 34B, 34C (FIGS. 20A and 20B), 90A (FIGS. 21A and 21B) uncovered. Moreover, an amorphous form of the LiF 46 (FIGS. 9, 10, and 11) cladding material, while used as optical-cladding by a frequency-doubled FCSEL's optical cavity, also adds support and structural strength to the frequency-doubled FCSEL's polyhedral prism waveguide(s) 87 (FIGS. 19A and 19B), 34 (FIGS. 20A and 20B), 90 (FIGS. 21A and 21B).

Furthermore, it should be understood that within each frequency-doubled FCSEL device the thickness and doping levels of dopants within each layer is precisely controlled. Any deviation from designed parameters, no matter how slight, would affect the frequency-doubled FCSEL's performance (i.e., frequency range and flux intensity). For example, if a frequency-doubled FCSEL device were designed to emit laser light at a wavelength of 800-nm the thickness of each alternating layer, used in the frequency-doubled FCSEL's quarterwave mirror-stack reflector assembly 42 (FIGS. 7, 8, 9, 10, and 11) would, each need to equal one-quarter of one wavelength of the fundamental 800-nm light produced by the frequency-doubled FCSEL's two active-regions 36, 40.

Moreover, the doping of a frequency-doubled FCSEL's multi-layered structures is accomplished by the addition of various dopant materials (e.g., n-type electron donating dopants like Phosphorus and p-type electron accepting dopants like Boron) to the materials being used in the construction of the frequency-doubled FCSEL's multilayered structures; using a well known method of epitaxial deposition such as MBE or MOCVD. A frequency-doubled FCSEL laser device will use many different dopant concentrations of specific dopant materials within the several different extrinsic semiconductor layers used to make-up the frequency-doubled FCSEL's various multi-layered structures.

An additional embodiment of the present invention, as illustrated by FIGS. 7, 8, and 9, which describes the frequency-doubled FCSEL as a single laser device, where and how it is used. For example, a frequency-doubled FCSEL, when configured as a single laser device can be used in hardware applications like:

(a) In (AV) "Audio Video" record/playback multi-media recorders.

(b) In (DVD) "Digital Video Disk" players.

(c) In (CD) "Compact Disk" players.

(d) In (WORM) "Write Once Read Many" data-storage devices constructed using single frequency-doubled FCSEL lasers.

(e) In (MPEG) "Motion Picture Expert Group" compact disk players and recorders constructed using single frequency-doubled FCSEL lasers.

(f) In (MD) "Mini Disk" magneto-optical record/playback recorders.

(g) In rear-projection big-screen television.

(h) In magneto-optical flying-head data-storage hard disk drives.

(i) In (DVD) "Digital Video Disk" ram-disk data-storage drives.

(j) In (MO) "Magneto Optical" removable disc media mass-storage.

(k) In short-haul and long-haul fiber-optic communication transmitters.

An additional embodiment of the present invention, as illustrated by FIGS. 12, 13, 14, and 15, which describes the frequency-doubled FCSEL as a laser-array device, and where and how it as an laser-array can be used. For example, a frequency-doubled FCSEL when configured as a laser-array device can be used in hardware applications like:

(a) In optically pumped solid-state lasers using a frequency-doubled FCSEL laser-array.

(b) In video-display micro-screens using a frequency-doubled FCSEL laser-array.

(c) In flat-bed and hand-held scanners using a frequency-doubled FCSEL laser-array.

(d) In laser printers using a frequency-doubled FCSEL laser-array.

An additional embodiment of the present invention, as illustrated by FIGS. 12, 13, 14 and 15, which describes how the frequency-doubled FCSEL can be configured and used within laser-arrays simultaneously manufactured from the same binary (GaAs) "Gallium-Arsenide" semiconductor material being used to construct the control-circuitry later used to control the laser-array; all of which would be contained within a single laser-array device. Further, the frequency-doubled laser-array FCSELs would be configured either as a single laser-array, comprising a multitude of singularly addressable laser-diodes, or as a laser-array, singularly addressable group comprising a multitude of laser-diodes, which are altogether controlled as a single unit.

Moreover, the electronic control over both a single frequency-doubled FCSEL laser device or individual frequency-doubled FCSEL laser devices located within a single frequency-doubled FCSEL laser-array is accomplished using a GaAs semiconductor based control-bus, memory-bus, and address-bus form of circuitry, all of which are semiconductor circuits created from and contained within the same semiconductor substrate material used to create the before mentioned frequency-doubled FCSEL lasers. To explain further, GaAs based circuitry can be created, along with the before mentioned frequency-doubled FCSEL laser devices, from the same binary GaAs semiconductor substrate material. Integrating the frequency-doubled FCSEL devices, along with the control circuitry into a single surface mountable integrated semiconductor chip device.

Figure 10:
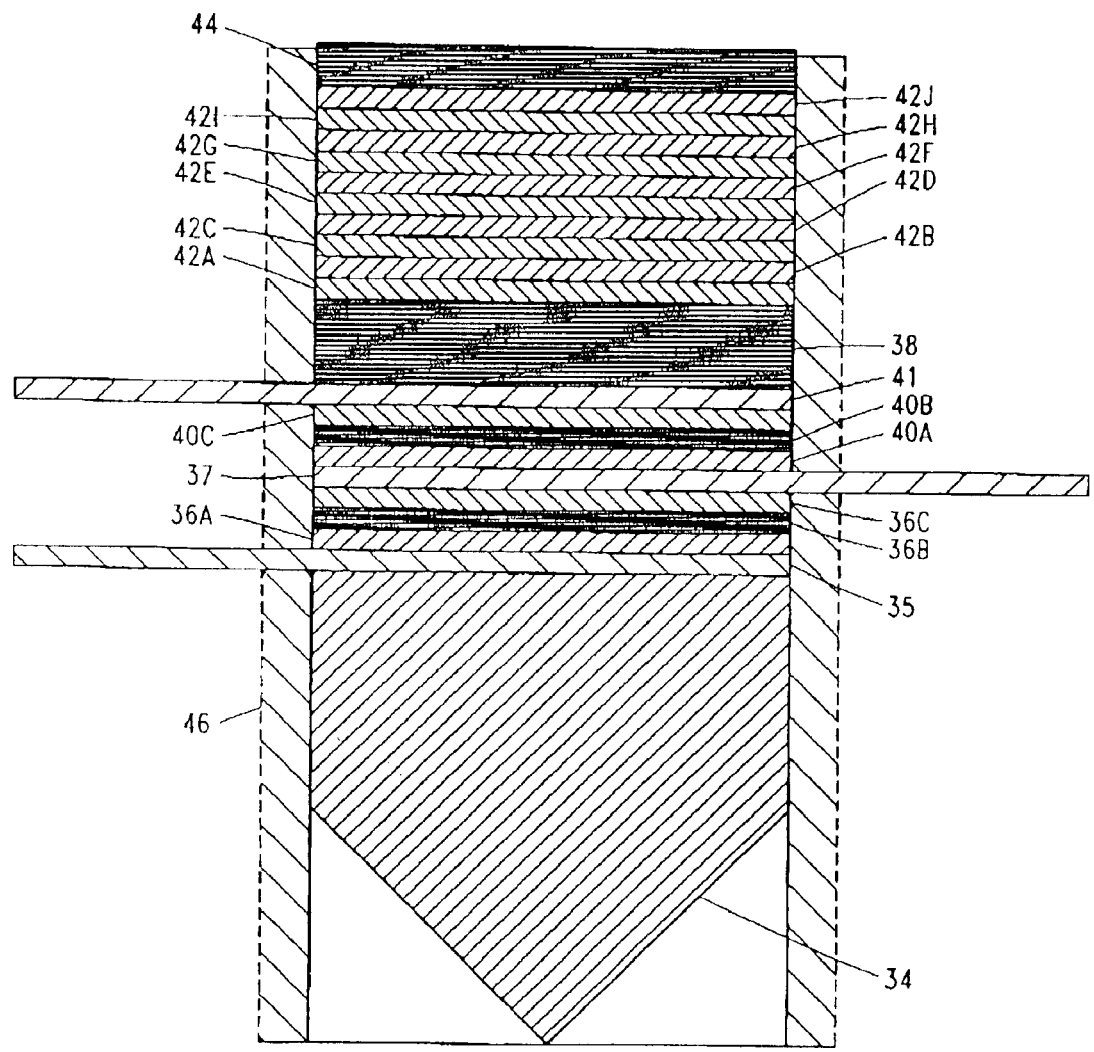
FIG. 10 shows an orthographic side-view of a frequency-doubled FCSEL, displaying the frequency-doubled FCSEL's two MQW active-regions, a first and second superlattice, three plane-parallel mirror-stack reflectors, and one internal reflecting corner-cube prism waveguide as section drawing 10—10 (i.e., see FIG. 12).
Figure 11:
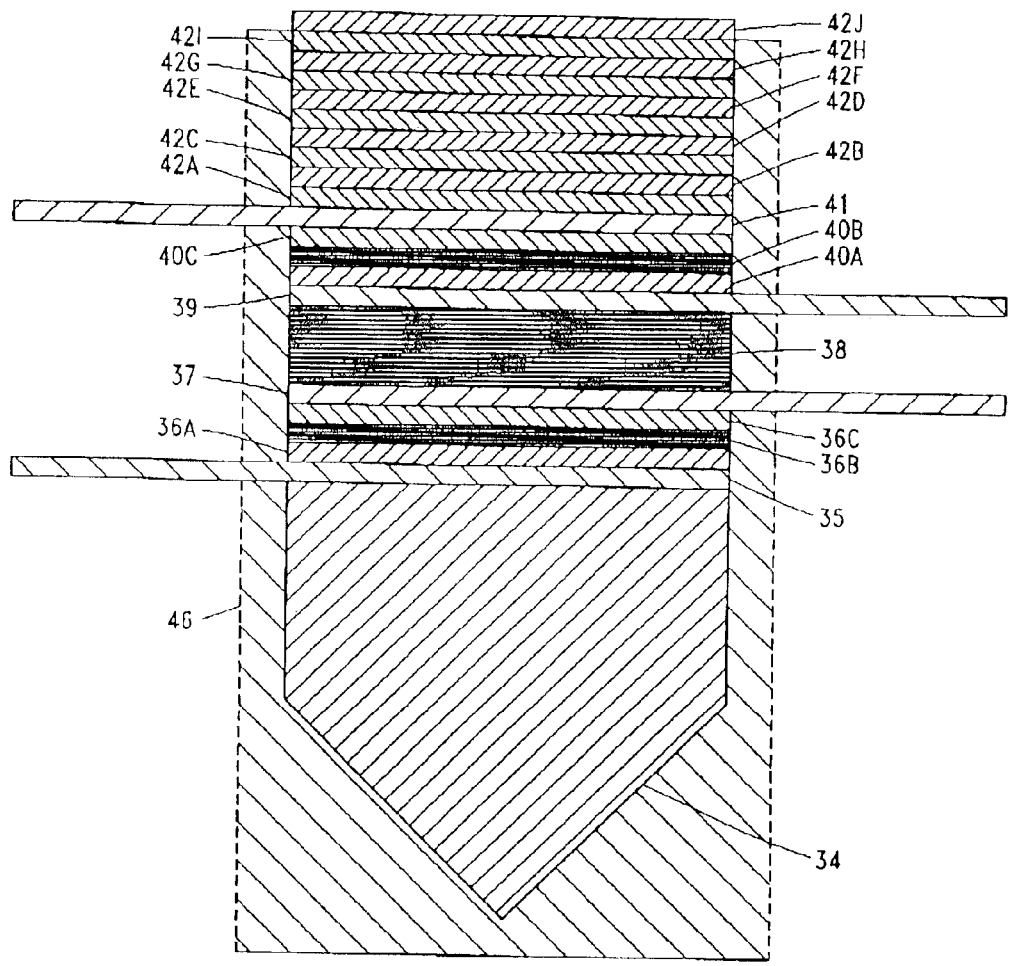
FIG. 11 shows an orthographic side-view of a frequency-doubled FCSEL, displaying the frequency-doubled FCSEL's two MQW active-regions, a superlattice, one plane-parallel mirror-stack reflector, optical-cladding, and one internal reflecting corner-cube prism waveguide as section drawing 11—11 (i.e., see FIG. 13).
Figure 12:
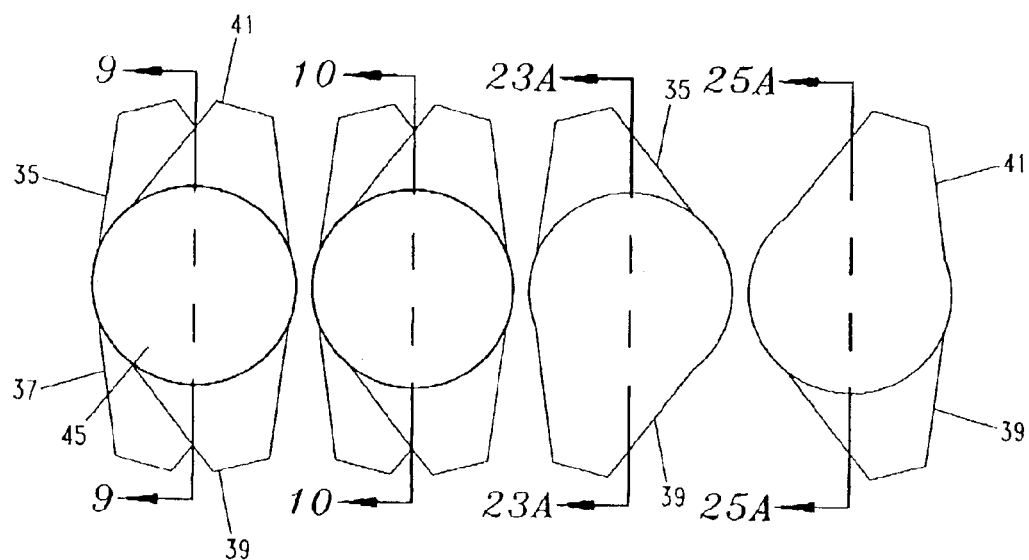
FIG. 12 shows an orthographic top-view of four frequency-doubled FCSELs, illustrating section lines 9—9, 10—10, 23A—23A, and 25A—25A.
Figure 13:
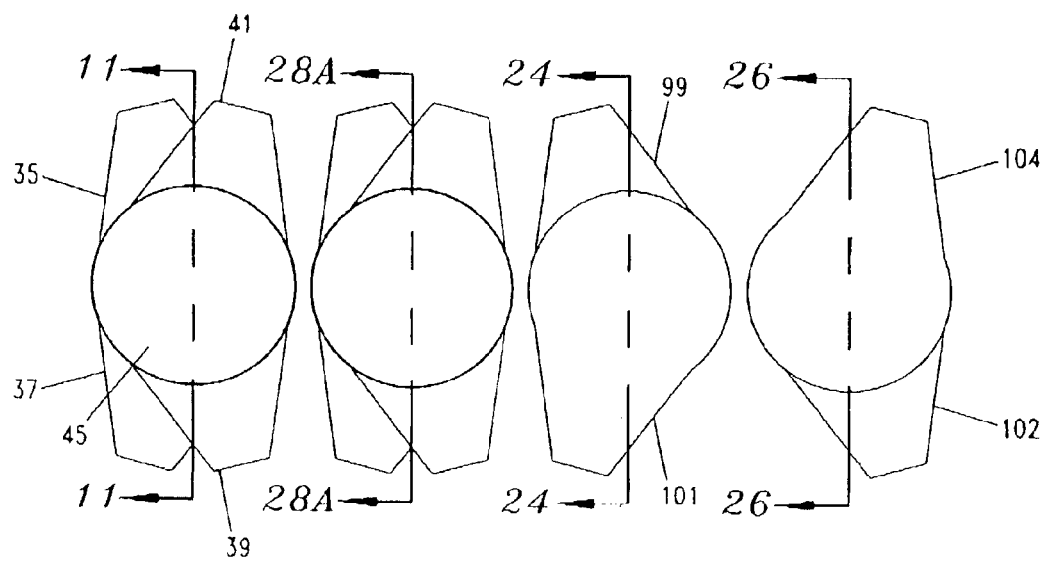
FIG. 13 shows an orthographic top-view of four frequency-doubled FCSELs, illustrating section lines 11—11, 28A—28A, 24—24, and 26—26.
Figure 14:
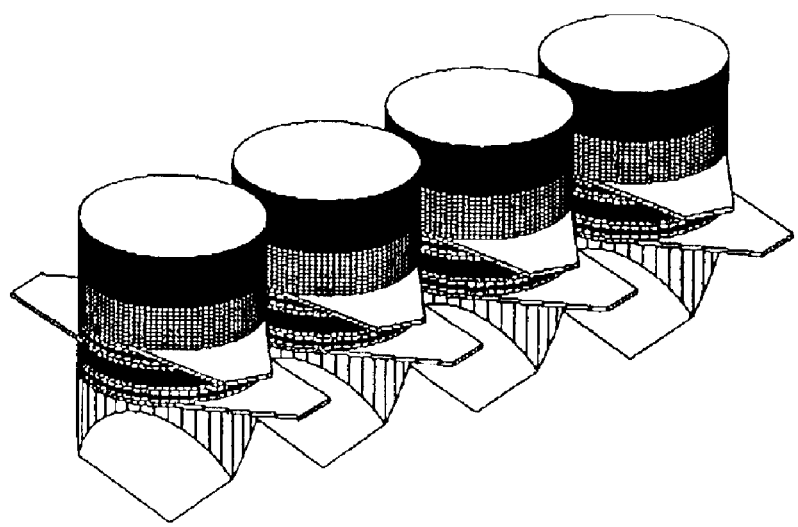
FIG. 14 shows a three-dimensional isometric top right side-view drawing that illustrates four mesa-etched FCSELs in a linear-array configuration.
Figure 15:
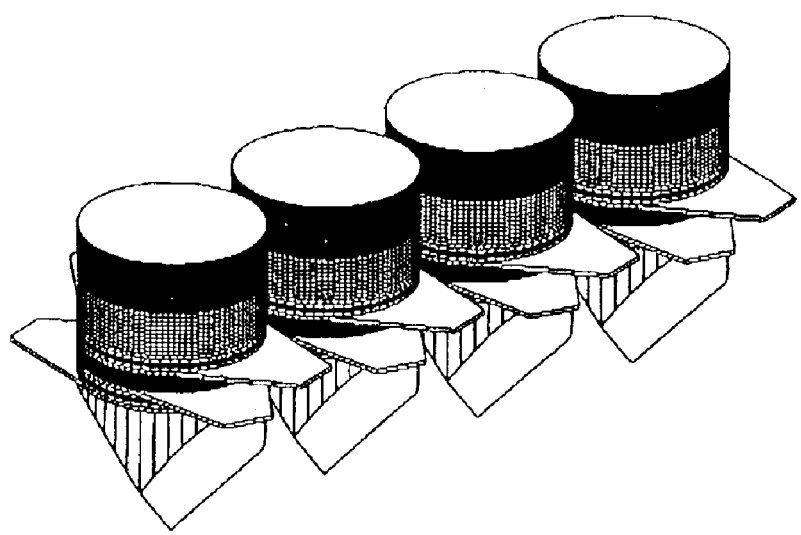
FIG. 15 shows a three-dimensional isometric top left side-view drawing that illustrates four mesa-etched FCSELs in a linear-array configuration.

An additional embodiment of the present invention, as illustrated by FIGS. 9, 10, and 11, which shows the addition of a cladding material 46 to the vertical and outermost wall surfaces of the frequency-doubled FCSEL's vertical cavity or cavities, where the cladding material has a refractive index less than the semiconductor crystalline materials used in the construction of its before mentioned vertical cavity. Further, a cladding material 46 (FIGS. 9, 10, and 11) is to be deposited around and between every lithographically etched frequency-doubled FCSEL; therein, surrounding every frequency-doubled FCSEL's outermost wall-surface with an internal reflectivity that is 100% for any intracavity traveling light-ray, but only if the light-ray's angle of incidence upon the cladding-layer's 46 innermost wall surface has an angle of incidence equal to or greater than what is normally termed as 'the critical angle of internal reflection'.

For example, the deposition of LiF 46 (FIGS. 9, 10, and 11), an optical material possessing a much lower refractive index than the binary GaAs, and the ternary GaAlAs materials used in the construction of a frequency-doubled FCSEL's vertical cavity; wherein, the previously mentioned LiF is sputter deposited onto and around the outermost wall surfaces 46 of the frequency-doubled FCSEL's vertical cavity; excluding the frequency-doubled FCSEL's 200-nm thick Calcite emitter layer 42J (FIGS. 9, 10, and 11) which, being the last deposited layer in the frequency-doubled FCSEL device is located at the very top of the frequency-doubled FCSEL's before mentioned quarterwave mirror-stack assembly 42 (FIGS. 7, 8, and 9).

In addition, the deposition of cladding material to a frequency-doubled FCSEL's outer-most wall surface will give added stability to the frequency-doubled FCSELs and their polyhedral prism waveguides, while helping to achieve a total internal reflectivity for the frequency-doubled FCSEL device(s). The introduction of vertically applied internal reflectivity will help reduce optical loses to a frequency-doubled FCSEL's optical cavity, which are normally caused by planar-mirror light-scattering and planar-mirror diffraction-scattering. Moreover, the application of cladding materials like LiF to the optical cavities of frequency-doubled FCSELs 40 (FIGS. 7, 8, 9, 10, and 11) will create between the optical cavities of frequency-doubled FCSELs and the previously mentioned optical cladding material, an internal reflecting optical-barrier, which will confine to a frequency-doubled FCSEL's optical cavity, diode produced fundamental light.

Furthermore, this process works in much the same way as fiber-optic technology does; wherein, an optical cladding material, having an lower refractive index than the material used within an optical fiber's core is deposited onto the outermost surface walls of that optical fiber's core, will achieve 100% of total internal reflectivity for any intra-fiber traveling light-ray whose angle of incidence upon the inner-most wall surface of optical-fiber's cladding-layer has an angle of incidence equal to or greater than what is normally termed as 'the critical angle of internal reflection'.

Figure 24:
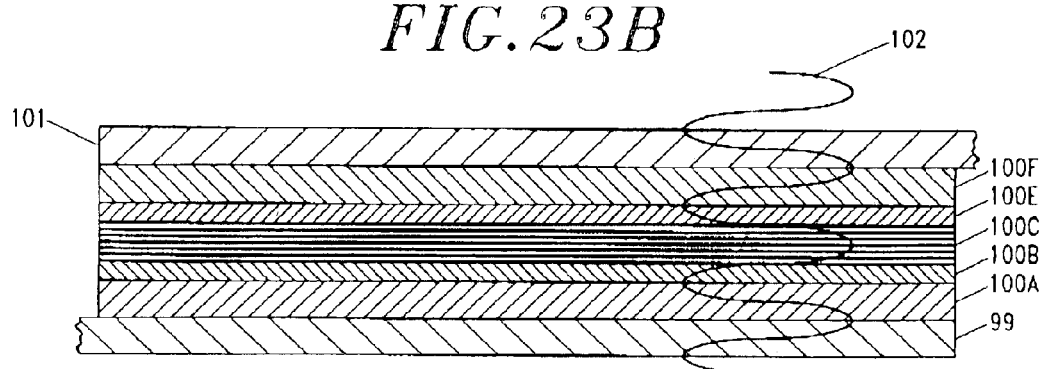
FIG. 24 shows a close-up sectional view of a frequency-doubled FCSEL's first alternate active-region, which displays two secondary confinement cladding-layers, two primary-confinement cladding-layers, and multiple quantum-wells.
Figure 26:
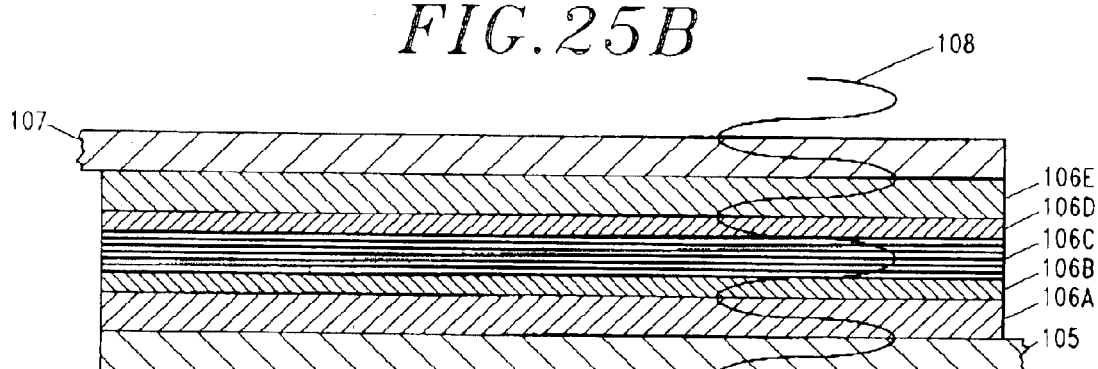
FIG. 26 shows a close-up sectional view of a frequency-doubled FCSEL's second alternate active-region, which displays two secondary confinement cladding-layers, two primary-confinement cladding-layers, and multiple quantum-wells.

An alternative embodiment to the present invention, as illustrated in FIGS. 24 and 26, describes an alternative to the double-heterostructure light emitting diode design previously described in the preferred embodiment. Further, the alternative embodiment of the present invention comprises a double-heterostructure diode design, which is configured as an active-region 100, 106 (FIGS. 24 and 26) and comprise two MQW active-areas 100C, 106C (FIGS. 24 and 26) that are sandwitched between two primary contra-positioned non-graded confinement cladding-layers 100A, 100F, 106A, 106E (FIGS. 24 and 26), two contra-positioned non-graded (SCH) "Separate Confinement Heterostructure" cladding-layers 100B, 100E, 106B, 106D (FIGS. 24 and 26), one positive contact-layer 101, 107 (FIGS. 24 and 26), and one negative contact-layer and crystal growing substrate 99, 105 (FIGS. 24 and 26).

Furthermore, as illustrated in FIGS. 24 and 26, an alternative embodiment to the present invention describes a double-heterostructure light emitting diode design whose order of layered deposition begins with the creation of a first 200-nm thick contact-layer 99 (FIG. 24), which is formed from a pre-manufactured and pre-sliced semiconductor wafer that was comprised from a seed crystal of highly n+ doped GaAs binary semiconductor material having a crystallographic orientation of [100], [111], [110], or [001], and used as the main substrate for the subsequent growth of the remaining crystalline semiconductor layers that make-up the diode's structure.

Moreover, the alternative frequency-doubled FCSEL diode's first contact-layer 99 (FIG. 24), while providing negative electrical connectivity to the alternative frequency-doubled FCSEL diode's light emitting active-region 100 (FIG. 24) will also enhance the reliability of the alternative frequency-doubled FCSEL diode's design, by preventing the migration of carrier-dislocations, and the like to the alternative frequency-doubled FCSEL diode's active-area 100C (FIG. 24).

In addition, as illustrated in FIG. 24, the alternative embodiment of the present frequency-doubled FCSEL invention shows a first 200-nm thick primary non-graded confinement cladding-layer 100A (FIG. 24), which is deposited using MBE or MOCVD onto the top outermost surface of the alternative frequency-doubled FCSEL diode's first contact-layer 99 giving it a deposited position between the alternative frequency-doubled FCSEL diode's first contact-layer 99 and the alternative frequency-doubled FCSEL diode's first non-graded SCH cladding-layer 100B (FIG. 24). Further, as illustrated in FIG. 24, the alternative embodiment of the present invention shows that the first 200-nm thick primary non-graded confinement cladding-layer 100A (FIG. 24) comprises of an N doped AlGaAs ternary semiconductor material.

In addition, as illustrated in FIG. 24, the alternative embodiment to the present invention also shows that the first 100-nm thick non-graded SCH cladding-layer 100B (FIG. 24) comprises a highly n-doped GaAlAs ternary semiconductor material, which is deposited using MBE or MOCVD onto the top outermost surface of the alternative frequency-doubled FCSEL diode's first primary non-graded confinement cladding-layer 100A (FIG. 24), giving it a deposited position between the alternative frequency-doubled FCSEL diode's first primary non-graded confinement cladding-layer 100A and the alternative frequency-doubled FCSEL diode's active-area 100C (FIG. 24).

Moreover, the alternative frequency-doubled FCSEL diode's first 100-nm thick non-graded SCH cladding-layer 100B is made from a semiconductor material having an refractive index that is between the refractive index of the multiple quantum-wells that make-up the alternative frequency-doubled FCSEL diode's active-area 100C and the refractive index of the material used to construct the alternative frequency-doubled FCSEL diode's first primary non-graded confinement cladding layers 100A (FIG. 24).

In addition, as illustrated in FIG. 24, the alternative embodiment of the present invention also shows that next in line for material deposition is a active-area 100C (FIG. 24), which constitutes an alternate frequency-doubled FCSEL's active-medium, which through a process of stimulated-emission, produces amplified light when active-medium is optically pumped by intracavity confined light created by the populated-inversion that occurs within the alternative frequency-doubled FCSEL diode's active-area 100C (FIG. 24) configured as a MQW structure.

In addition, as illustrated in FIG. 24, an alternative embodiment of the present invention also shows that the previously mentioned active-area 100C is a multi-layered MQW structure that is positioned between the alternative frequency-doubled FCSEL's first and second non-graded SCH confinement cladding-layers 100B, 100E (FIG. 24). Further, the MQW 100C comprises seven quantum-wells 97A, 97B, 97C, 97D, 97E, 97F, 97G (FIG. 23B) constructed from a binary GaAs semiconductor material having a small forbidden band width, and six quantum-well cladding-layers 98A, 98B, 98C, 98D, 98E, 98F (FIG. 23B) constructed from a ternary GaAlAs semiconductor material having a very large forbidden band width.

Moreover, all thirteen of the previously mentioned semiconductor layers that make up an alternative frequency-doubled FCSEL's active-area 100C. (FIG. 24), when combined form a MQW having a combined material thickness that is one-quarter of one wavelength of the fundamental light emission created by the alternative frequency-doubled FCSEL's first active-region 100 (FIG. 24). For example, if an alternative frequency-doubled FCSEL's active-region 100 (FIG. 24) were designed to create light with a fundamental wavelength of 800-nm the alternative frequency-doubled FCSEL's active-area 100C total material thickness would need to equal one-quarter (i.e., 200-nm) of one wavelength of the fundamental 800-nm light created by the alternative frequency-doubled FCSEL's active-region 100.

Figure 23B:
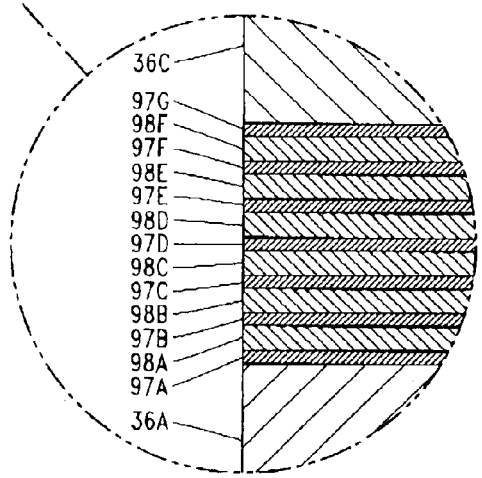
FIG. 23B shows an auxiliary close-up sectional view of a frequency-doubled FCSEL's first MQW, displaying details of the before mentioned active-area along its outer edge.

Furthermore, as illustrated in FIG. 23B, if an alternative frequency-doubled FCSEL's active-area 100C (FIG. 24), had seven quantum-wells 97A, 97B, 97C, 97D, 97E, 97F, 97G comprised of binary GaAs semiconductor material, the seven quantum-wells would each need to have a material thickness of about 10.30-nm. Additionally, if an alternative frequency-doubled FCSEL's active-area 100C had six quantum-well cladding-layers 98A, 98B, 98C, 98D, 98E, 98F (FIG. 23B) comprised of ternary GaAlAs semiconductor material, the six quantum-well cladding-layers would each need to have a material thickness of about 21.30-nm. Moreover, the thickness amounts for each of the seven quantum-wells and six quantum-well cladding-layers located within the alternative frequency-doubled FCSEL's active-area 100C, when combined should have a total material thickness equal to 200-nm or one-quarter of one wavelength of the fundamental 800-nm light created by the alternative frequency-doubled FCSEL's active-region 100 (FIG. 24).

In addition, as illustrated in FIG. 22, the alternative embodiment of the present invention shows an alternative frequency-doubled FCSEL diode's MQW structure from an energy standpoint as being diagrammatically characterized (FIG. 22). More specifically, FIG. 22 illustrates the profile of the potential wells and the discreet energy levels assumed by the carriers respectively in the conduction and valency bands (i.e., respectively electrons and holes). Further, when a semiconductor film with a small forbidden band $e_2$ (e.g., film with a typical thickness of about ten nanometers), such as films 97A, 97B, 97C, 97D, 97E, 97F, 97G (FIG. 23B) are surrounded by two films with a larger forbidden band $e_0$ (e.g., film with a typical thickness of about twenty nanometers), such as films 98A, 98B, 98C, 98D, 98E, 98F (FIG. 23B), the electrons and holes of the small forbidden band material 97A, 97B, 97C, 97D, 97E, 97F, 97G (FIG. 23B) are confined in monodirectional potential wells $e_2$.

Furthermore, as illustrated in FIG. 22, the movement of an electron into a well created in the conduction band of height $\Delta E_c$ is quantized in discreet states of energy $E_1$, $E_2$, $E_3$, etc. Moreover, in the same way, the movement of a hole into a well created in the valency band of height $\Delta E_x$ is quantized in discreet states of energy $E'_1$, $E'_2$, and $E'_3$. When the thickness of the small forbidden bandwidth material $e_2$ varies, the energy states assumed by the carriers also vary. Therefore, the emission wavelength of the previously mentioned MQW structures can consequently be adjusted by the choice the nature and the thickness of the semiconductor material films being used in their construction.

In addition, as illustrated in FIG. 24, the alternative embodiment to the present invention describes a second 100-nm thick non-graded SCH cladding-layer 100E as being comprised from a p-doped GaAlAs ternary semiconductor material, which is deposited using MBE or MOCVD onto the top outermost surface of the alternative frequency-doubled FCSEL diode's active-area 100C (FIG. 24), giving it a deposited position between and the alternative frequency-doubled FCSEL diode's active-area 100C and the alternative frequency-doubled FCSEL diode's second primary non-graded confinement cladding-layer 100F (FIG. 24). Further, an alternative frequency-doubled FCSEL diode's second 100-nm thick non-graded SCH cladding-layer 100E is comprised from a material having an refractive index that lies between the refractive index of the alternative frequency-doubled FCSEL diode's multiple quantum-wells and the refractive index of the material used to construct the alternative frequency-doubled FCSEL diode's second primary non-graded confinement cladding layers 100F (FIG. 24).

Moreover, as illustrated in FIG. 24, the alternative embodiment to the present invention describes an alternative frequency-doubled FCSEL diode's second 200-nm thick primary non-graded confinement cladding-layer 100F as being as being comprised from a P doped AlGaAs ternary semiconductor material, which is deposited using MBE or MOCVD onto the top outermost surface of the alternative frequency-doubled FCSEL diode's second 100-nm thick non-graded SCH cladding-layer 100E (FIG. 24), giving it a deposited position that lies between the alternative frequency-doubled FCSEL diode's second 100-nm thick non-graded SCH cladding-layer 100E and the alternative frequency-doubled FCSEL diode's second contact-layer 101 (FIG. 24).

In addition, as illustrated in FIG. 24, the alternative embodiment to the present invention describes an alternative frequency-doubled FCSEL diode's second 200-nm thick contact-layer 101 as being comprised from a highly p+ doped GaAs binary semiconductor material, which is epitaxially grown onto the top outermost surface of the alternative frequency-doubled FCSEL diode's second primary non-graded confinement cladding-layer 100F (FIG. 24).

Moreover, as illustrated in FIG. 24, the alternative embodiment to the present invention describes that a second 200-nm thick contact-layer 101 (FIG. 24) while providing positive electrical connectivity to the alternative frequency-doubled FCSEL diode's active-region 100 (FIG. 24) will also enhance the reliability of the alternative frequency-doubled FCSEL diode's laser design by preventing the migration of carrier-dislocations and the like to the alternative frequency-doubled FCSEL diode's active-area 100C (FIG. 24).

Furthermore, as illustrated in FIGS. 24 and 26, the alternative embodiment to the present invention also describes a standing wave 102, 108 (FIGS. 24 and 26) as being plotted across the alternative embodiment double-heterostructure diode's structure; wherein, the standing wave's 102, 108 peak crest (i.e., its antinode) as being centered onto the center of the alternative frequency-doubled FCSEL diode's active-area 100C, 106C (FIGS. 24 and 26) illustrating an properly designed active-region capable of optimum coupling to gain-region.

For example, as illustrated in FIGS. 24 and 26, an alternative frequency-doubled FCSEL diode's active-region, when comprised of two contra-propagating 100-nm thick non-graded SCH cladding-layers 100B, 100E and an active-area 200-nm thick 100C (FIG. 24), layers equaling a total material thickness of 400-nm or one-half of one wavelength of the fundamental 800-nm emission that is generated by the alternative embodiment diode's active-region, would be centered on a propagating standing wave's crest; thus, generating optimal gain for stimulated-emission.

From the description above, a number of advantages of my present invention become evident:

(a) The total elimination, along with the manufacturing processes associated with their construction of what is typically known in prior-art VCSEL design as the first quarterwave mirror-stack assembly, or the base quarterwave mirror-stack reflector, which is replaced, as illustrated in FIGS. 7, 8, 9, 10, and 11 by the present inventions polyhedral prism waveguide 87, 34, 90.

(b) The use of a polyhedral prism waveguide, which is located at the base of the present invention's vertical cavity, and replaces the more conventional metallic alloy and/or sapphire substrates and/or the planar-flat multilayered quarterwave mirror-stack assemblies 22, 23 (FIGS. 1, 2, 3, 4, and 5) normally used in prior-art VCSEL design with a single layered monolithic structure that will reflect and transmit all frequencies of optical radiation.

(c) The polyhedral prism waveguides used in the present invention are mono-structural (i.e., formed into a single shape from a single material) polyhedrons, which are geometrically complex, but structurally simply, as opposed to quarterwave mirror-stacks used in prior-art VCSELs, which are geometrically simple, but structurally complex, being comprised as multilayered structures having a multitude of thin-film planar-flat plates being constructed from materials exhibiting alternate refractive indices.

(d) The present invention's mono-structural polyhedral prism waveguide 87 (FIGS. 19A and 19B), 34 (FIGS. 20A and 20B), 90 (FIGS. 21A and 21B), when constructed from $SiO_2$ are inexpensive to manufacture.

(e) The present invention's mono-structural polyhedral prism waveguide 87 (FIGS. 19A and 19B), 34 (FIGS. 20A and 20B), 90 (FIGS. 21A and 21B), when constructed from $SiO_2$ is moisture resistant.

(f) The present invention's mono-structural polyhedral prism waveguide 87 (FIGS. 19A and 19B), 34 (FIGS. 20A and 20B), 90 (FIGS. 21A and 21B), when constructed from $SiO_2$ is heat resistant.

(g) The present invention's mono-structural polyhedral prism waveguide 87 (FIGS. 19A and 19B), 34 (FIGS. 20A and 20B), 90 (FIGS. 21A and 21B), when constructed from $SiO_2$ is non-conducting.

(h) The present invention's mono-structural polyhedral prism waveguide 87 (FIGS. 19A and 19B), 34 (FIGS. 20A and 20B), 90 (FIGS. 21A and 21B), when constructed from $SiO_2$ is easy to use in the construction of the present invention.

(i) The present invention's mono-structural polyhedral prism waveguide 87 (FIGS. 19A and 19B), 34 (FIGS. 20A and 20B), 90 (FIG. 21A and 21B), when constructed from $SiO_2$ is amorphous (i.e., a material made up of molecules that lack a distinct crystalline structure). Therefore, the material has an absolute lattice-mismatch to diode constructing semiconductor materials like GaAs and AlGaAs and to other Zincblend semiconductor materials as well. Moreover, this tends to promote a greater reflectivity at the material interface located between the frequency-doubled FCSEL's first contact layer 35 (FIGS. 7, 8, 9, 10, and 11) and the frequency-doubled FCSEL's polyhedral prism waveguide 87 (FIGS. 19A and 19B), 34 (FIGS. 20A and 20B), 90 (FIGS. 21A and 21B).

(j) The present invention's mono-structural polyhedral prism waveguide 87 (FIGS. 19A and 19B), 34 (FIGS. 20A and 20B), 90 (FIGS. 21A and 21B), when constructed from $SiO_2$ is optically transparent to optical radiation with wavelengths ranging from the very-short 150-nm of ultraviolet radiation to the very-long 5000-nm of infrared radiation.

(k) The present invention's mono-structural polyhedral prism waveguide 87 (FIGS. 19A and 19B), 34 (FIGS. 20A and 20B), 90 (FIGS. 21A and 21B), when constructed from $SiO_2$ will optically transmit optical radiation with wavelengths ranging from the very-short 150-nm of ultraviolet radiation to the very-long 5000-nm of infrared radiation.

(l) The present invention's mono-structural polyhedral prism waveguide 87 (FIGS. 19A and 19B), 34 (FIGS. 20A and 20B), 90 (FIGS. 21A and 21B), when constructed from $SiO_2$ is also totally and internally reflecting to optical radiation with wavelengths ranging from the very-short 150-nm of ultraviolet radiation to the very-long 5000-nm of infrared radiation.

(m) The present invention's mono-structural polyhedral prism waveguide 87 (FIGS. 19A and 19B), 34 (FIGS. 20A and 20B), 90 (FIGS. 21A and 21B), has a mono-structural geometry that gives it the ability to internally redirect a 180° all optical radiation entering its plane-parallel, flat-horizontal, and circular top front-face surface 87C (FIGS. 19A and 19B), 34D (FIGS. 20A and 20B), 90B (FIGS. 21A and 21B).

(n) The present invention's mono-structural polyhedral prism waveguide 87 (FIGS. 19A and 19B), 34 (FIGS. 20A and 20B), 90 (FIGS. 21A and 21B) will increase the present invention's modal discrimination by extending its optical-cavity length, using the polyhedral prism waveguide as the means.

Moreover, the previously mentioned waveguide, because it lengthens a frequency-doubled FCSEL's optical-cavity, works by increasing the diffraction loss to high-order transverse optical-modes therein, increasing gain to the frequency-doubled FCSEL's fundamental and lower-order transverse optical-modes.

Much attention has been given recently to (VCSEL) "Vertical Cavity Surface-Emitting Lasers" (e.g., refer to "Surface Emitting Lasers" by Kenichi Iga and Fumio Koyama: Ohmusha, Ltd., 1990). These surface emitting lasers are used as, for example:

(a) A light source used for writing and reading data to and from magneto-optic disc media, (b) A light source used for medical equipment, which utilize photoluminescence to analysis compounds, and (c) A light source used in video displays, which utilize a laser.

For example, such surface emitting lasers are constructed in a way as to include a vertical cavity containing an active-region 28B (FIGS. 1, 2, and 3), which is constructed on a [100] substrate (i.e., a crystal base plate whose surface orientation matches the One-Zero-Zero crystallographic axis direction), and reflectors 24, 32, 33 (FIGS. 1, 2, and 3), which are formed on both ends of the vertical cavity and have a high reflectivity. Further, the reflectors 24, 32 (FIGS. 1, 2, and 3) generally, are constructed using semiconductor multi-layer films or dielectric multi-layer films. At room temperatures, such surface emitting lasers exhibit single mode lasing with a single wavelength up to an output power of only a few milliwatts. Interestingly, the light intensity inside a VCSEL's cavity is estimated to be over 100-times the output power, which is typically around a few hundred milliwatts.

The present invention uses a highly efficient and simultaneous execution of intracavity SFG and extracavity SHG; moreover, both being nonlinear second-order optical processes, which will frequency-double a frequency-doubled FCSEL's laser emissions, and in a direction that is perpendicular to a frequency-doubled FCSEL's first contact and primary semiconductor crystal growing substrate-base layer. Moreover, the frequency-doubling is accomplished by using two properly positioned semiconductor superlattice structures, which because of small cross-sectional areas that occur within the structures of the semiconductor superlattices, when power is applied to such structures, they will produce large powerful optical densities.

However, large powerful optical densities are necessary if the nonlinear optical interactions that occur within the semiconductor superlattice structures are to become efficient. Consequently, such nonlinear optical interactions can be used to produce nonlinear second-order optical harmonics (i.e., sometimes called spatial harmonics). For example, using nonlinear second-order optical processes such as 'second harmonic generation', 'parametric oscillation', and 'sum frequency generation' (i.e., sometimes called frequency up-conversion) to produce nonlinear second-order optical harmonics.

There is a problem, however, when using certain cubic semiconductor materials in the production of second-order nonlinear harmonics, and that problem is while many semiconductor materials have the necessary nonlinear coefficient properties used to produce nonlinear second-order harmonics, they can never be used to do so simply because the light-rays that propagate within and through them (i.e., cubic semiconductor materials) while involved in nonlinear interactions, will never become phase-matched (i.e., will never become phase matched meaning, light-rays that travel through such materials will have velocities that cause destructive interference to nonlinear second-order harmonic production). Therefore, such cubic semiconductor materials, when deposited in a single bulk form, as a single bulk layer, will never work in the production of nonlinear second-order harmonics.

Consequently, in order too generate new waves (i.e., sometimes called spatial harmonics) with new phase velocities, the before mentioned cubic semiconductor materials must somehow be made to become phase-matched. Moreover, the necessary phase-matching of the cubic semiconductor materials is accomplished when such materials are deposited as multilayered structures. To explain this further, Zinc-blend cubic semiconductor materials such as binary GaAs and binary GaP are examples of cubic semiconductor materials that are commonly used in light emitting diodes and semiconductor lasers. These materials possess the necessary nonlinear optical-coefficients used in the production of nonlinear second-order harmonics, but can never be made to phase-match using conventional birefringent techniques.

Therefore, to achieve phase-matching within binary GaAs and binary GaP these cubic semiconductor materials must be MBE deposited as multilayered waveguide structures (i.e., sometimes called a superlattice). Further, the semiconductor superlattices will consist of both odd and even numbered layers; whereby, one odd-numbered layer and one even-number layer will form a layered-pair, and will have its nonlinear optical-coefficient appropriately modulated, where optimum performance is achieved when the polarity of nonlinear optical-coefficients of the even numbered layers that comprise half of the semiconductor superlattice structure are in opposition to the nonlinear optical-coefficients of the odd numbered layers comprising the other half of the semiconductor superlattice structure.

In addition, as illustrated in FIGS. 16, 17, and 18, the operation of the preferred embodiment of the present invention consists of the combined usage of (SFG) "Sum Frequency Generation" and (SHG) "Second Harmonic Generation" into a single device. Such a device is accomplished, when two nonlinear second-order processes are used together in the production of frequency-doubled output laser emissions. To explain further, there are two very different kinds of nonlinear second-order processes being produced within a frequency-doubled FCSEL's two multilayered semiconductor superlattice structures 38, 44 (FIGS. 7, 8, 9, 10, and 11). Further, by combining the second-order processes of (SFG) "Sum Frequency Generation" and (SHG) "Second Harmonic Generation" into a single method of frequency-doubling, the generation of the shortest possible wavelengths of amplified optical radiation every to be emitted by a VCSEL semiconductor device is accomplished.

Furthermore, by placing one 32-layer semiconductor superlattice 38 (FIGS. 7, 8, 9, 10, and 11) between two vertically positioned double-heterostructure MQW semiconductor light-emitting diodes 36, 40 (FIGS. 7, 8, 9, 10, and 11); wherein, each of the two light-emitting diodes produces a contra-propagating emission having the same wavelength 79, 81, 82 (FIG. 18). Whereby, each LED produced emission is amplified through their numerous oscillations, which is made to occur between a frequency-doubled FCSEL's two light reflecting structures 34, 42 (FIGS. 7, 8, 9, 10, and 11). Wherein, each of the two light reflecting structures 34, 42 (FIGS. 7, 8, 9, 10, and 11) are deposited upon each light-emitting diodes' negative conducting contact-layer 35, 41 (FIGS. 7, 8, 9, 10, 11, and 18).

Moreover, by using the nonlinear second-order process of SFG, this structural arrangement will create from two fundamental laser beams a single frequency-doubled output emission 84A, 83A (FIG. 18) of lased light that is to be ultimately emitted in a direction perpendicular to a frequency-doubled FCSEL's first contact-layer of GaAs 35 (FIGS. 7, 8, 9, 10, and 11). Further, a frequency-doubled FCSEL's first frequency-doubled and extracted laser emission 83A, 84A (FIG. 18) is next, projected into a frequency-doubled FCSEL's extracavity positioned structure 43, 44, 45 (FIGS. 7, 8, 9, 10, and 11), whose center contains a frequency-doubled FCSEL's second semiconductor superlattice structure 44 (FIGS. 7, 8, 9, 10, and 11), which is designed to be both confine and convert frequency specific optical radiation. Wherein, a frequency-doubled FCSEL's first extracted and frequency-doubled laser emission 83A, 84A (FIG. 18) is converted, through the nonlinear second-order process of SHG, into a frequency-doubled FCSEL's second frequency-doubled laser emission 85, 86 (FIG. 18). Moreover, a frequency-doubled FCSEL's second frequency-doubled emission of laser light 85, 86 (FIG. 18) is extracted through a frequency-doubled FCSEL's third and final dielectric quarterwave mirror-stack assembly 45 (FIGS. 7, 8, 9, 10, and 11).

Furthermore, a frequency-doubled FCSEL's two semiconductor superlattice structures 38, 44 (FIGS. 7, 8, 9, 10, 11, and 18), because of the small cross-sectional areas that are present in their multilayered structures 38, 44 (FIGS. 7, 8, 9, 10, 11, and 18) will begin to produce, when power is applied to their structures, large-power optical densities. Consequently, the production of large-power optical densities made to occur within a frequency-doubled FCSEL's two before mentioned semiconductor superlattice structures 38, 44 (FIGS. 7, 8, 9, 10, 11, and 18) are necessary for the efficient production of nonlinear optical interactions. More importantly, such nonlinear optical interactions can be used to easily produce nonlinear second-order harmonics (i.e., sometimes called spatial harmonics), such as nonlinear second-order harmonic processes, like second-harmonic generation, parametric oscillation, and sum-frequency generation (i.e., sometimes called frequency up-conversion).

The problem, however, is that although many semiconductor materials have large nonlinear optical properties they cannot be used directly in bulk form to produce second-order harmonics. Unfortunately, this is because the optical wavefronts that propagate through such bulk semiconductor materials, while involved in nonlinear optical interactions are not phase-matched; i.e., light-rays that travel through such materials have velocities that cause destructive interference to second-order harmonic production, and therefore are found to be destructive to second-order nonlinear harmonics.

Furthermore, most crystalline materials are birefringent (i.e., a material that possesses a molecular crystalline structure that produces from one fundamental light-ray two light-rays of opposing polarity, also called double-refraction), which also means that crystals can become phase-matched through a well-known birefringent technique. However, Zinc-blend semiconductor crystals, which have a cubic shaped molecular structure and therefore no center of symmetry are not very birefringent, but tend to be isotropic; i.e., a property wherein all incidental light-waves propagating through the Zinc-blend material will exhibit the same polarization in all directions. Therefore, the process of phase-matching through a birefringence technique within Zinc-blend cubic semiconductor materials is not possible. Examples of two such Zinc-blend semiconductor materials are (GaAs) "Gallium-Arsenide" and (GaP) "Gallium-Phosphide".

Furthermore, it is a requirement of nonlinear physics that the Zinc-blend semiconductor materials must somehow become phase-matched in order to generate new waves with new phase velocities, which in turn will cause the production of nonlinear second-order optical interactions like SFG and SHG to occur within a frequency-doubled FCSEL device. Further, some of the semiconductor materials that are commonly used in LEDs and semiconductor lasers, materials such as (GaAs) "Gallium-Arsenide" and (GaP) "Gallium-Phosphide", being Zinc-blend materials, possess large nonlinear optical-coefficients, which is necessary in the production of second-order nonlinear harmonics.

Furthermore, phase-matching within Zinc-blend semiconductor materials can be achieved if the semiconductor crystals used in the construction of a frequency-doubled FCSEL's two semiconductor superlattices are deposited within a frequency-doubled FCSEL device as vertically stacked multilayered waveguide structures 38, 44 (FIGS. 7, 8, 9, 10, 11, and 18) (i.e., sometimes called a superlattice). Further, such a semiconductor superlattice waveguide, which consists of odd and even numbered layers; wherein, each which consists of odd and even numbered layers; wherein, each layer within a single layer-pair has its nonlinear optical-coefficient appropriately modulated. Moreover, a frequency-doubled FCSEL's two semiconductor superlattices can achieve optimum phase-matching and performance when the polarity of nonlinear optical-coefficients within a superlattice's even numbered semiconductor layers are opposite in their polarity to the nonlinear optical-coefficients within the odd numbered semiconductor layers of the superlattice.

Furthermore, phase-matching within a frequency-doubled FCSEL's two multilayered semiconductor superlattice structures will occur simply because the alternating layers of undoped semiconductor materials used in the construction of a superlattice's multilayered structure will have alternatively different band-gap; alternating from wide to narrow band-gaps. Therefore, in such structures the electrons and holes occurring within the Zinc-blend semiconductor layers are confined to the layers exhibiting the smaller band-gap energies. Further, due to the multilayered structure of the two superlattices, the electrons and the holes, when optically excited by oscillating photons, are condensed into a high density by the band filling effect, which ultimately produces for the frequency-doubled FCSEL's two semiconductor superlattices second-order nonlinear emission.

Moreover, to describe this nonlinear process further, lets assume that quantum levels are formed in each of the before mentioned semiconductor layers causing therein, excitons to be formed by the pair-bonding of both electrons and holes located in the same quantum level. Consequently, the before mentioned excitons, thus formed will increase the optical nonlinearity occurring within each of a frequency-doubled FCSEL's two semiconductor superlattices, through a nonlinear polarization effect, which in turn takes place within each of the two superlattices when they are intensely and optically irradiated (i.e. as in irradiated by laser emission).

Furthermore, in order to understand the differences between the nonlinear optical mechanics used in prior-art solid-state lasers and the nonlinear optical mechanics used in frequency-doubled FCSEL laser-diodes, we must first understand the nonlinear optical mechanics behind Type-I phase-matching. Wherein, Type-I phase-matching is the geometry most frequently used in prior art solid-state SFG and SHG lasers. Further, solid-state SFG lasers are basically active solid-state laser designs; consisting of two intracavity and contra-propagating LED light sources, which are simultaneously used to pump frequency specific optical-radiation into the light amplifying cavity of prior-art solid-state SFG lasers.

Moreover, an active solid-state SFG laser design will consist of one intracavity uniaxially-negative birefringent crystal 47 (FIG. 16), two intracavity positioned diode-pumped (Nd:YAG) "Neodymium:Yttrium-Aluminum-Garnet" lasers 53, 54 (FIG. 16), one totally-reflecting mirror structure 51 (FIG. 16) that reflects all optical radiation generated within a solid-state SFG laser's intracavity, and one partially-reflecting mirror structure 52 (FIG. 16) that reflects the optical radiation created by the two intracavity positioned Nd:YAG lasers, while being transparent and nonreflecting to a prior-art solid-state SFG laser's frequency-doubled laser emissions 60 (FIG. 16), which are created within the uniaxially-negative birefringent crystal 59 (FIG. 16), through a nonlinear second-order optical process called (SFG) "Sum Frequency Generation".

Furthermore, as illustrated in FIG. 16, the process of Type-I phase-matching, which is the phase-matching geometry typically used in prior-art solid-state SFG and SHG laser designs is essentially one of two possible mixing geometries used to initiate the frequency-doubling process of SFG (i.e., the nonlinear process wherein two low-energy photons having the same polarization and frequency are combined to produce a single sum-frequency generated high-energy photon of the other polarization) to occur within prior-art solid-state laser designs.

Moreover, the frequency-doubling process of solid-state SFG begins when two pump sources comprising O-wave polarized laser-light 55, 57 (FIG. 16) are provided by two intracavity positioned diode-pumped Nd:YAG lasers 53, 54 (FIG. 16) as contra-propagating light-beams 56, 58 (FIG. 16) having a fundamental wavelength of 800-nm 56, 58 (FIG. 16) are used to optically pump the solid-state SFG laser. Further, optical pumping commences when the two contra-propagating 800-nm light-beams 56, 58 (FIG. 16) are made to simultaneously enter two contra-positioned facets of the device's birefringent crystal 48, 49 (FIG. 16); whereby, the production of nonlinear second-order harmonics 59 (FIG. 16), through the process of SFG, begins to form along a common path of propagation within the solid-state SFG laser's uniaxially-negative birefringent crystal 47 (FIG. 16).

Moreover, the crystal face facets 48, 49 (FIG. 16) are positioned perpendicular to a birefringent crystal's propagation-direction; wherein, one crystal-face facet is located on either end of a solid-state SFG laser's uniaxially-negative birefringent crystal 47 (FIG. 16). Further, these crystal facets 48, 49 (FIG. 16) are cut 90° perpendicular to a birefringent crystal's phase-matching direction 50 (FIG. 16); wherein, a birefringent crystal's 47 (FIG. 16) optical-axis 64 (FIG. 16) is aligned along a common axis with said crystal's ordinary and extraordinary intersecting k surfaces.

Therefore, the nonlinear second-order harmonics 59 (FIG. 16) that occur within a solid-state SFG laser's light amplifying cavity, as the result of phase-matching, will sum-frequency generate a frequency-doubled laser emission of E-wave polarized laser light 59 (FIG. 16), which in turn will pass through a solid-state SFG laser's partially-reflecting mirror structure 52 (FIG. 16) as extracted and collimated laser light having a frequency-doubled wavelength of 400-nm 60 (FIG. 16).

In addition, the Type-I phase-matching that is used in prior-art solid-state SFG laser devices can also be used in prior-art solid-state SHG lasers as well. Moreover, a solid-state SHG laser device, as presented here is a passive rather than active extracavity positioned SHG laser device. Moreover, such a device would have its light amplifying cavity optically pumped by an externally positioned mono-source of laser-light, which would be typically provided by a diode-pumped Nd:YAG laser.

Furthermore, a passive solid-state extracavity positioned SHG laser device will consist of one uniaxially-negative birefringent crystal 65 (FIG. 17), one optically unidirectional total-reflecting mirror structure 69 (FIG. 17) that allows E-wave polarized laser-light 71 (FIG. 17) to enter a solid-state SHG laser's light-amplifying and wavelength-conversion cavity 65 (FIG. 17), while totally-reflected optical emissions that is made incident within a solid-state SHG laser's light-amplifying and wavelength-conversion cavity 65 (FIG. 17), and one optically unidirectional partially-reflecting mirror structure 70 (FIG. 17) that only reflects within a solid-state SHG laser's light-amplifying and wavelength-conversion cavity 65 (FIG. 17) the optical emissions 71 (FIG. 17) entering through a solid-state SHG laser's first mirror structure 69 (FIG. 17) along with any fundamental laser emissions 76 (FIG. 17) not yet converted by the process of SHG.

Moreover, the solid-state SHG laser's second mirror structure 70 (FIG. 17) will transmit a solid-state SHG laser's frequency-doubled 74 (FIG. 17) laser emissions of O-wave polarized laser light 75 (FIG. 17) outside said solid-state SHG laser's light-amplifying and wavelength-conversion cavity 65 (FIG. 17). Further, the frequency-doubled laser emissions of O-wave polarized laser light is typically created within a solid-state SHG laser's Type-I phased-matched uniaxially negative birefringent crystal 65 (FIG. 17) through the nonlinear second-order optical process of (SHG) "Second Harmonic Generation".

Furthermore, as illustrated in FIG. 17, the process of Type-I phase-matching, which is the mixing geometry used in prior-art solid-state SHG laser devices to cause the frequency-doubling process of SHG (i.e., the nonlinear process wherein two incident photons of one polarization are converted into a single photon of the other polarization at the frequency-doubled second-harmonic) to occur within the before mentioned prior-art solid-state SHG laser device. Moreover, the nonlinear second-order and frequency-doubling process of SHG begins with a single source of E-wave polarized laser light 71 (FIG. 17) having a fundamental wavelength of 400-nm 72 (FIG. 17) and is provided for by a single source of laser emissions; moreover, laser emissions sourced from the SFG device's extracted laser emissions 60 (FIG. 16), which is used to pump the solid-state SHG laser's wavelength-conversion cavity.

For example, the nonlinear second-order and frequency-doubling process of SHG begins when one source of E-wave polarized laser light 71 (FIG. 17) having a fundamental wavelength of 400-nm 72 (FIG. 17), which is provided by the SFG laser's extracted output emissions 60 (FIG. 16) or from one externally positioned diode pumped ND:YAG laser 71 (FIG. 17) is made to enter a solid-state SHG laser's birefringent crystal's crystal face facet 66 (FIG. 17) the production of nonlinear second-order harmonics 74 (FIG. 17) begins to occur through the process of SHG, and will begin to form along a light-ray's path of propagation 68 (FIG. 17) as it passes through a solid-state SHG laser's uniaxially-negative birefringent crystalline material 65 (FIG. 17). Moreover, the uniaxially-negative birefringent crystal 65 (FIG. 17) is positioned perpendicular to a crystal's propagation-direction 68 (FIG. 17). Wherein, one crystal facet, being located on either end of the solid-state SHG laser's uniaxially-negative birefringent crystal 65 (FIG. 17) is cut 90° perpendicular to the crystal's phase-matching direction 68 (FIG. 17). Whereby, the crystal's 78 (FIG. 17) optical-axis is aligned along a common axis 78 (FIG. 17) with the crystal's ordinary and extraordinary intersecting k surfaces.

Therefore, the second-order nonlinear harmonics 74 (FIG. 17) that occur within a solid-state SHG laser's conversion cavity, as the result of phase-matching, will harmonically generate a frequency-doubled laser emission of O-wave polarized laser-light 75 (FIG. 17), which passes through a solid-state SHG laser's partially-reflecting mirror structure 70 (FIG. 17) as extracted and collimated laser light having a frequency-doubled wavelength of 200-nm 75 (FIG. 17). Additionally, to eliminate what is referred to as beam walk-off (i.e., second harmonic generated rays will propagate at an angle different from the fundamental), and to maximize the production of nonlinear second-order harmonics, the nonlinear crystals used in solid-state SFG and SHG laser devices must have their thermal states maintained at a temperature that will optimize a nonlinear crystal's condition of phase-matching. Moreover, the phase-matching temperature of prior-art solid-state SFG and SHG lasers is typically controlled by an external temperature-sensing heating element, which itself is normally controlled through sensory feed-back circuitry.

In addition, the uniaxial (i.e., negative and positive) birefringent crystals typically used in solid-state SFG and SHG laser devices in the production of nonlinear second-order harmonics have to be cut and shaped at angles that are radically different from the crystal's original growth axis'. Consequently, the nonlinear crystals after they have been processed will have their crystallographic growth axes disposed along and into parallel directions with the solid-state SFG or SHG laser's angle of light propagation. Whereby, an incident energy beam of fundamental laser radiation will be linearly polarized in a direction that is perpendicular to the crystallographic growth X-axis, and/or linearly polarized in a direction that is parallel to the crystal's Y-axis; producing second-order nonlinear harmonics.

Furthermore, the angle between a particular uniaxial birefringent crystal's original growth-axis 50 (FIG. 16), 68 (FIG. 17), and the crystal's phase-matching direction will change for different nonlinear crystalline materials that might be used in a solid-state SFG or SHG laser device configuration. Consequently, uniaxial birefringent crystals because of their need for special thermal conditions and expensive processing make them impractical and expensive for usage in semiconductor laser-diodes.

In addition, as illustrated in FIGS. 7, 8, 9, 10, and 11, the phase-matching used to execute the frequency-doubling process of (SFG) "Sum Frequency Generation" within a frequency-doubled FCSEL's vertical cavity is accomplished through a modulation of the nonlinear optical-coefficients existing within the Zinc-blend semiconductor materials used in the construction of a frequency-doubled FCSEL's two semiconductor superlattice structures. Moreover, a frequency-doubled FCSEL's sum-frequency generating cavity will contain the first of two semiconductor superlattice structures 38 (FIGS. 7, 8, 9, 10, and 11) used within the frequency-doubled FCSEL design scheme.

Moreover, a frequency-doubled FCSEL's vertical cavity will consist of one intracavity semiconductor superlattice structure 38 (FIGS. 7, 8, 9, 10, and 11), two intracavity double-heterostructure lower mid-frequency producing laser-diodes 36, 40 (FIGS. 7, 8, 9, 10, and 11), one totally-reflecting corner-cube prism waveguide 34 (FIGS. 7, 8, 9, 10, and 11) that reflects all laser emissions generated within a frequency-doubled FCSEL's vertical cavity, and one first partially-reflecting quarterwave mirror-stack assembly 42 (FIGS. 7, 8, 9, 10, and 11), which reflects the two contra-propagating 800-nm laser emissions created by a frequency-doubled FCSEL's two double-heterostructure lower mid-frequency producing laser diodes 38, 40 (FIGS. 7, 8, 9, 10, and 11) while transmitting a frequency-doubled FCSEL's frequency-doubled and extracted 400-nm laser emission 83A, 84A (FIG. 18) created within a frequency-doubled FCSEL's first semiconductor superlattice structure 38 (FIGS. 7, 8, 9, 10, and 11) through the nonlinear second-order optical process of (SFG) "Sum Frequency Generation".

Furthermore, as illustrated in FIGS. 7, 8, 9, 10, 11, and 18, the phase-matching that occurs within a frequency-doubled FCSEL's first semiconductor superlattice structure 38 (FIGS. 7, 8, 9, 10, and 11) will cause the generation of the nonlinear process of SFG (i.e., the process wherein two low-energy photons having the same polarization are combined to produce one sum frequency generated high-energy photon of the other polarization) to occur within a frequency-doubled FCSEL's vertical cavity.

Nevertheless, because the semiconductor materials used to construct a frequency-doubled FCSEL's two LED active-regions are optically polarizing, while the semiconductor materials used in the construction of the frequency-doubled FCSEL's two semiconductor superlattices will not induce double-refraction, the well known birefringence technique of phase-matching can not be used within the frequency-doubled FCSEL's two semiconductor superlattices. However, when two LED produced plane-waves of linearly polarized light enter a frequency-doubled FCSEL's first semiconductor superlattice, the two electric vectors that occur within the two plane-waves will combine to form a single displacement vector having a single velocity and therefore, will have a magnitude that is phase-matched.

Essentially, a frequency-doubled FCSEL's frequency-doubling nonlinear second-order process of SFG begins with two contra-propagating sources 79, 81, 82 (FIG. 18) of diode produced and linearly-polarized laser emissions having a fundamental wavelength of 800-nm 79, 81, 82 (FIG. 18) are created by the frequency-doubled FCSEL's two intracavity positioned double-heterostructure LEDs 36, 40 (FIGS. 7, 8, 9, 10, and 11) is made to enter the frequency-doubled FCSEL's first semiconductor superlattice 38 (FIGS. 7, 8, 9, 10, and 11) from opposite directions 79D, 81A, 82A (FIG. 18) (i.e., contra-propagating) as it passes back and forth between the frequency-doubled FCSEL's corner-cube prism waveguide 34 (FIGS. 7, 8, 9, 10, and 11) and the frequency-doubled FCSEL's first quarterwave mirror-stack assembly 42 (FIGS. 7, 8, 9, 10, and 11) where it begins to oscillate and amplify into 800-nm laser-light emissions 80, 80F, 80E (FIG. 18).

Figure 27A:
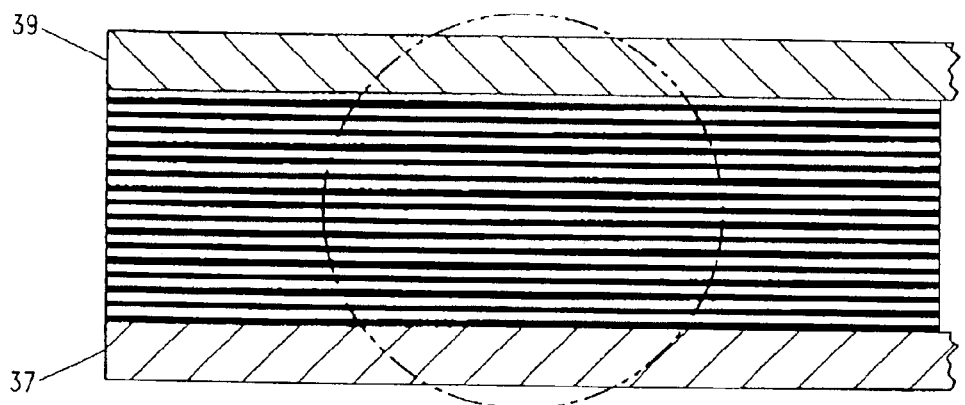
FIG. 27A shows a close-up side-view of a frequency-doubled FCSEL's first semiconductor superlattice structure, which is used to perform the frequency-doubled FCSEL's SFG process of wavelength conversion.
Figure 27B:
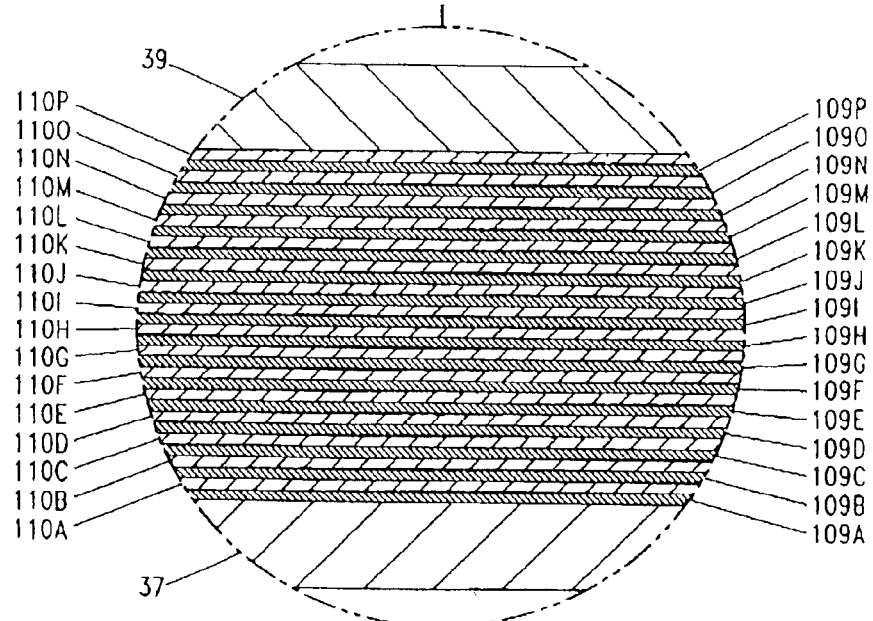
FIG. 27B shows an auxiliary close-up side-view of a frequency-doubled FCSEL's first semiconductor superlattice structure, displaying details of its 32-odd and even numbered undoped semiconductor AlGaAs layers.
Figure 28A:
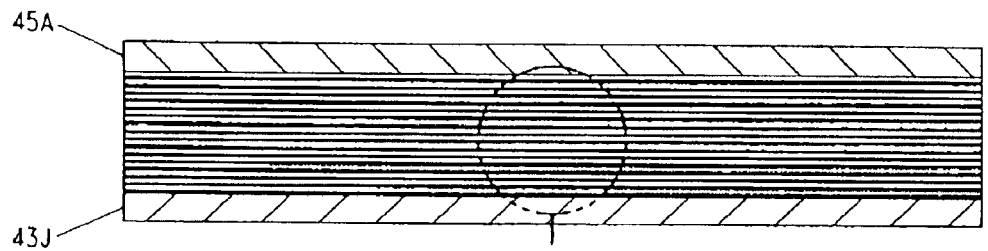
FIG. 28A shows a close-up side-view of a frequency-doubled FCSEL's second semiconductor superlattice structure, which is used to perform the frequency-doubled FCSEL's SHG process of wavelength conversion.
Figure 28B:
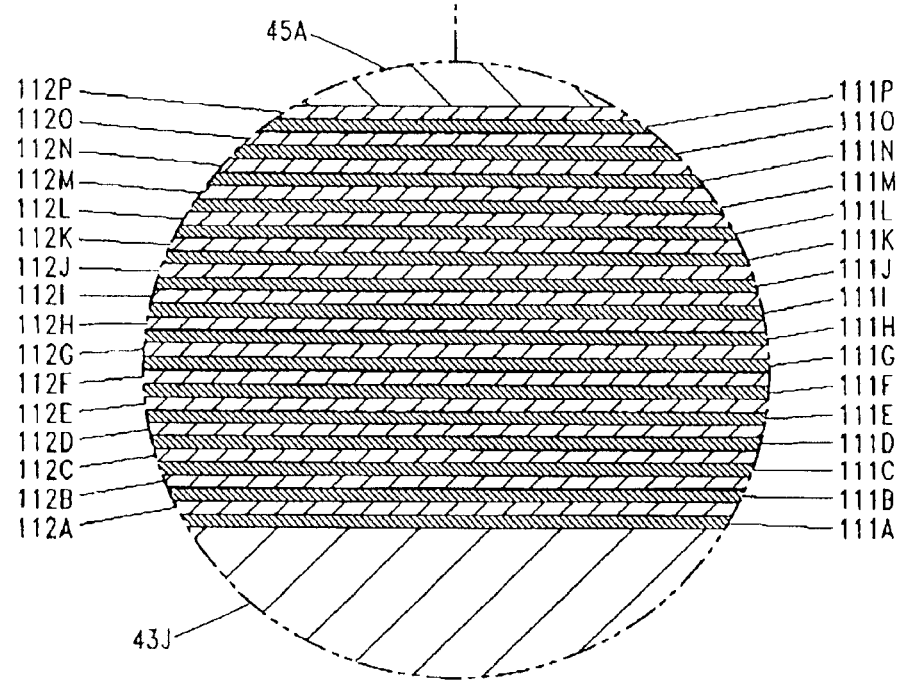
FIG. 28B shows an auxiliary close-up side-view of a frequency-doubled FCSEL's second semiconductor superlattice structure, displaying details of its 32-odd and even numbered, undoped, semiconductor AlGaAs layers.

Furthermore, the diode-produced plane-waves are made to be contra-propagating toward a frequency-doubled FCSEL's first semiconductor superlattice 38 (FIGS. 7, 8, 9, 10, and 11). Moreover, this is because the light generated by a frequency-doubled FCSEL's two double-heterostructure LEDs will tend to propagate from said LEDs' active-areas toward the frequency-doubled FCSEL's two polarity positive contact-layers 37, 39. Further, this why a frequency-doubled FCSEL's two LEDs 36, 40 (FIGS. 7, 8, 9, 10, and 11) have their positive contact-layers 37, 39 facing the frequency-doubled FCSEL's first semiconductor superlattice structure's first and last layers 109A, 110P (FIG. 27B).

However, some of the LED generated 800-nm plane-wave light 79E, 81B, 82B (FIG. 18) will propagate in an opposite direction; away from a frequency-doubled FCSEL's polarity positive contact-layers, toward the frequency-doubled FCSEL's polarity negative contact-layers 35, 41 (FIGS. 7, 8, 9, 10, and 11), toward the frequency-doubled FCSEL's first semiconductor superlattice structure 38, and toward the frequency-doubled FCSEL's corner-cube prism waveguide 34 (FIGS. 7, 8, 9, 10, and 11) away from the frequency-doubledFCSEL's first dielectric quarterwave mirror-stack assembly 42 (FIGS. 7, 8, 9, 10, and 11). Wherein, LED generated plane-wave light will begin to oscillate between a frequency-doubled FCSEL's first two vertical cavity mirror structures and become amplified into 800-nm laser-light emissions 83B, 84B (FIG. 18).

Moreover, a frequency-doubled FCSEL's two 800-nm vertical cavity produced laser-light emissions 79A, 81B, 80C (FIG. 18) will contra-propagate from and into opposite directions, until they propagate and pass into and through a multitude of semiconductor layers 79, 81, 82 (FIG. 18) that makeup the frequency-doubled FCSEL's first semiconductor superlattice 38 (FIGS. 7, 8, 9, 10, and 11). Wherein, through the nonlinear second-order process of (SFG) "Sum Frequency Generation", the first semiconductor superlattice 38 will produce a second-order harmonic, which will begin to form along the 800-nm laser emission's pathway of propagation 83A, 84A (FIG. 18).

Consequently, the nonlinear second-order harmonics 83, 84 (FIG. 18) that occur within a frequency-doubled FCSEL's first semiconductor superlattice structure 38 (FIGS. 7, 8, 9, 10, and 11), as the result of phase-matching, will generate a frequency-doubled 400-nm laser emission 83, 84 (FIG. 18). Wherein, the first frequency-doubled laser emission 83A, 84A, 84B (FIG. 18) is to be extracted 83A (FIG. 18) from a frequency-doubled FCSEL's first dielectric quarterwave mirror-stack assembly 42 (FIGS. 7, 8, 9, 10, and 11) as collimated laser-light emissions having a frequency-doubled wavelength of 400-nm 83A, 84A (FIG. 18).

In addition, the phase-matching that occurs within a frequency-doubled FCSEL's second semiconductor superlattice structure 44 is essentially that which causes the frequency-doubling process of (SHG) "Second Harmonic Generation" to form. Moreover, a frequency-doubled FCSEL's second semiconductor superlattice structure 44 (FIGS. 7, 8, 9, 10, and 11) is the second of two nonlinear second-order harmonic producing semiconductor superlattice structures 38, 44 (FIGS. 7, 8, 9, 10, and 11) that are built into and employed by every frequency-doubled FCSEL device.

In addition, a frequency-doubled FCSEL's second semiconductor superlattice structure 44 is an extracavity (i.e., extracavity meaning externally positioned to a frequency-doubled FCSEL's vertical cavity) positioned multi-layered semiconductor device. Further, this second superlattice is comprised as a 32-layered semiconductor structure 44 (FIGS. 7, 8, 9, 10, and 11) one refraction-reversed unidirectional totally reflecting mirror-stack assembly 43 (FIGS. 7, 8, 9, 10, and 11), which is designed to directionally transmit then confine through a frequency specific reflection the frequency-doubled FCSEL's first frequency-doubled and extracted 400-nm laser emissions 83A, 84B (FIG. 18).

Wherein, A second partially reflecting dielectric mirror-stack assembly 45 (FIGS. 7, 8, 9, 10, and 11) is also designed to reflect any unconverted 400-nm laser emissions 83B (FIG. 18) back into a frequency-doubled FCSEL's second semiconductor superlattice 44 for a further frequency-doubling wavelength conversion. Further, the second partially reflecting mirror-stack assembly 45 (FIGS. 7, 8, 9, 10, and 11) also has the function of extracting a frequency-doubled 200-nm laser emission 86 (FIG. 18). Whereby, the frequency-doubled FCSEL's second frequency-doubled laser emission 85, 86 (FIG. 18) additionally generated using the process of SHG, are made to occur, within the frequency-doubled FCSEL's second semiconductor superlattice structure 44 (FIGS. 7, 8, 9, 10, and 11). Moreover, as illustrated in FIG. 18, the process of phase-matching that does occur within a frequency-doubled FCSEL's extracavity positioned semiconductor superlattice structure 44 (FIGS. 7, 8, 9, 10, and 11) will facilitate the frequency-doubling process of (SHG) "Second Harmonic Generation" (i.e., a nonlinear process wherein two incident photons are converted into a single photon at the frequency-doubled second harmonic).

Essentially, the frequency-doubling process of SHG is made to occur within a frequency-doubled FCSEL's second semiconductor superlattice 44 when a single source of laser emissions (i.e., the frequency-doubled FCSEL's first frequency-doubled and extracted laser emissions having a wavelength of 400-nm) are made to pass through the frequency-doubled FCSEL's second semiconductor superlattice 44 (FIGS. 7, 8, 9, 10, and 11). Further, these laser emissions 83A, 84A (FIG. 18) were previously created by the frequency-doubled FCSEL's first semiconductor superlattice structure 38 (FIGS. 7, 8, 9, 10, and 11) using a frequency-doubling nonlinear second-order process called SFG.

In summation, when a frequency-doubled FCSEL's first frequency-doubled laser emissions 83A, 84A (FIG. 18) of 400-nm laser-light 83, 84 (FIG. 18) enters a frequency-doubled FCSEL's second semiconductor superlattice structure 44 (FIGS. 7, 8, 9, 10, and 11) from a frequency-doubled FCSEL's first semiconductor superlattice 38 (FIGS. 7, 8, 9, 10, and 11) the second semiconductor superlattice structure 44 will generate the frequency-doubled FCSEL's second frequency-doubled laser emission 85, 86 (FIG. 18) using the nonlinear second-order harmonic process called SHG. Wherein, a wavelength of 200-nm will result and begin to form along the 400-nm 85, 86 (FIG. 18) laser emission's pathway of propagation.

Consequently, the nonlinear second-order harmonics 85, 86 (FIG. 18) that occur within the multitude of semiconductor layers that comprise a frequency-doubled FCSEL's second semiconductor superlattice structure 44 (FIGS. 7, 8, 9, 10, and 11), as the result of phase-matching, will generate the frequency-doubled FCSEL's second frequency-doubled laser emissions 85, 86 (FIG. 18), and extract it through the frequency-doubled FCSEL's third dielectric quarterwave mirror-stack assembly 45 (FIGS. 7, 8, 9, 10, and 11) as collimated laser light, but having a frequency-doubled wavelength of 200-nm 85, 86 (FIG. 18). Further, to date, a 200-nm laser emission would have the shortest wavelength for any laser emission ever output by a VCSEL or similar laser-diode.

In addition, regarding the operation of the preferred embodiment of the present invention the following properties for a frequency-doubled FCSEL, based upon III–V compound semiconductor material, are noted below:

(a) The efficiency of converting fundamental waves to a second harmonic is in proportion to the power of the fundamental waves, therefore if the second harmonic can be generated inside the folded cavity of the frequency-doubled FCSEL the light intensity of the fundamental waves should be extremely favorable to generation of that second harmonic, (b) The frequency-doubled FCSEL includes one reflector, one of which may be characterized as to also transmit the second harmonic, and (c) The crystals comprising the frequency-doubled FCSEL's superlattices have a large non-linear coefficient.

Moreover, a phase-matching layer formed inside the frequency-doubled FCSEL's vertical cavity can contribute to the manufacture of a second harmonic generating device that is smaller, has low energy consumption, and has low production cost. Further, a frequency-doubled FCSEL device according to the present invention is based on the above mentioned facts, and comprises a cavity, an active-layer composed of compound semiconductors formed from elements found in columns III–V, the spacer-layers found on each side of two active-areas, and at least one reflector that is constructed and positioned upon the frequency-doubled FCSEL's folded cavity side opposite from the frequency-doubled FCSEL's mode discriminating waveguide prism, where it transmit the second harmonic at a certain rate.

Moreover, a frequency-doubled FCSEL device, such as the one described above, must have the [100] direction of its semiconductor crystals that make up its structure exhibit an angle of 5° or more with relation to the direction of intra-cavity propagating light-rays. Preferably, one of the [111], [211] and [110] directions of the semiconductor crystals located within the frequency-doubled FCSEL's folded cavity will roughly match the direction of propagating light-rays.

In addition, the principle behind second harmonic generation in the context of the present invention is summarized below. Generally, a non-linear optical crystal is used when generating a second harmonic from a fundamental wave. In accordance with the present invention, a Zinc-blend type crystalline structure, such as GaAs, etc., may be used as such a crystal. When two laser light beams of the same polarization are propagated through a Zinc-blend crystal a secondary (i.e., twice the fundamental frequency) non-linear polarization PNL is induced in the crystal and consequently a second harmonic is first generated through what is called (SFG) "Sum Frequency Generation", which has an electrical field in proportion to the size of the polarization PNL.

Further, the amount of the generated second harmonic depends upon the orientation of the semiconductor crystal located in the frequency-doubled FCSEL's folded cavity (including the phase-matching layer). Further, since this orientation is usually the same as that of the crystal semi-conducting material that makes up the substrate, the relationship between the substrate orientation and the fundamental wave is actually the relationship between the crystal orientations making up the frequency-doubled FCSEL's folded cavity and the fundamental wave. Consequently, the substrate orientation is also treated as the crystal orientation of the frequency-doubled FCSEL's folded cavity.

In addition, if the x-axis of an x-y-z orthogonal coordinate system is set along the direction normal to the substrate surface and a fundamental wave is propagated in the direction of the x-axis, then the x, y, and z components of the polarization $P_{NL}$; i.e., $P_{NLx}$, $P_{NLy}$, and $P_{NLz}$ may be expressed as follows—Equation 1:

$$\begin{pmatrix} P_{NLx} \\ P_{NLy} \\ P_{NLz} \end{pmatrix} = \begin{pmatrix} d_{11} d_{12} d_{13} d_{14} d_{15} d_{16} \\ d_{21} d_{22} d_{23} d_{24} d_{25} d_{26} \\ d_{31} d_{32} d_{33} d_{34} d_{35} d_{36} \end{pmatrix} \begin{pmatrix} E_x E_x \\ E_y E_y \\ E_z E_z \\ 2E_y E_z \\ 2E_z E_x \\ 2E_x E_y \end{pmatrix}$$

Wherein, PNLx, PNLy, and PNLz represent the x, y and z components of the polarization PNL, and the matrix elements dmn (m=1, 2, 3; n=1, 2, 3, 4, 5, 6) represent the coefficients relating the non-linear polarization to the electric field of the fundamental wave. Further, the electric field components Ex, Ey, Ez are the x, y and z components of the fundamental wave.

Therefore, the fundamental waves that are propagated along the direction of the x-axis, $E_x$ can be set to zero. Further matrices, which include the symbol dmn are often only defined for the case where the x-axis is [100], the y-axis is [010] and the z-axis is [001]. Therefore, the definition is here generalized in order to use the same symbol for any arbitrary set of orthogonal axes x, y and z. For example, having a substrate where [100] is directed to represent the x-axis, [010] to represent the y-axis, and [001] to represent the z-axis. In this substrate the matrix element dmn holds non-zero values for $d_{14}=d_{25}=d_{36}$; this is set to 1.000 for convenience of explanation, while the other elements of the matrix are zero.

Moreover, if fundamental light is propagated along the x-axis located within the substrate $P_{NLy}$ and $P_{NLz}$ both become zero and therefore, the generated second harmonic is not made to propagate along the x-axis (i.e., the direction perpendicular to the substrate surface). Further, when the substrate crystal is rotated −45° around the x-axis, that is when [100] is directed to represent the x-axis, [011] to represent the y-axis, and [0-11] to represent the z-axis, then the second harmonic is not propagated along the x-axis as is clear from the matrix elements.

In addition, the change in efficiency of generating the second harmonic will be studied by using a few representative embodiments; wherein, the substrate is rotated around the z-axis (or [0-11] axis) from the x direction to the y direction. For example, when the angles of rotation are around −5°, −35.3°, and −54.7°, respectively; then, the x-axis is parallel to [211], the y-axis is parallel to [−111] and the z-axis is parallel to [0-11], while the x-axis is parallel to [111], the y-axis is parallel to [−211] and the z-axis is parallel to [0-11]. Further, as is clear from these matrix elements if $E_x=0$ represents the previously described rotation operation, then the non-linear polarization $P_{NLy}$ and $P_{NLz}$, which contributes to a second harmonic made to propagate along the x-axis may be expressed as follows—Equation 2:

$$P_{NLy}=d_{22}E_y E_y + d_{23}E_z E_z$$

$$P_{NLz}=2d_{23}E_y E_z \text{ (Note that } d_{34}=d_{23})$$

In simple terms, in this rotation, since $-d_{22} \geq d_{23} \geq 0$, the polarization parallel to the y-z plane $P_{NL}=(P_{NLy}^2+P_{NLz}^2)^{1/2}$ under the constant fundamental wave $E=(E_y^2+E_z^2)^{1/2}$ has its maximum value when the fundamental wave is polarized along the y-axis (that is when $E_z=0$, $E=E_y$). Additionally, if the fundamental wave is polarized along the y-axis, as the angle of rotation is larger, $P_{NL}$ increases and has a maximum value. Further, when the angle of rotation is further increased it decreases again, but since $-d_{22}=d_{23}$, then consequently $P_{NL}=-d_{22}E^2$, providing a very favorable property such that the efficiency of the second harmonic generation is independent of the polarization of the fundamental wave.

However, the actual calculation is not included here, but if the ratio is taken of the square of $P_{NL}$, then $(0.260/0.816)^2=0.1$. Further, equation 4 supports that when the [100] direction of the substrate (i.e., the [100] direction of the semiconductor crystals within the cavity) makes a 5° angle with respect to direction of the light ray propagation, it is possible to obtain roughly 10% of the second harmonic generation obtained when the substrate has a [111] direction (i.e., the [111] direction of the semiconductor crystals within the cavity) matches the direction of the light ray propagation. Consequently, if such a 10% efficiency can be achieved, then an adequate practical use thereof is apparent, and this explains why the [100] direction of the semiconductor crystals within the frequency-doubled FCSEL's cavity makes an angle of 5° or more with respect to the direction of the light ray propagation.

In addition, regarding particular cases where the rotation is in a direction different from the one described above or where the rotation is around the y-axis (not described herein), but basically and with these cases as well, the following statements are true:

(a) As the angle between the x-axis and the [100] direction increases, so does $P_{NL}$, (b) When the x-axis is in the direction [211] or in the direction [110], efficiency is maximized if the polarization of the fundamental wave is appropriate, or (c) When the x-axis is in the direction [111], an efficiency is achievable which is slightly less than that in (b) above, but is not dependent upon the polarization of the fundamental wave.

Moreover, some prior studies disclose the substrate's [100] direction oriented at an angle of about 4° with respect to the direction of the light rays. However, this is based on the fact that such an angle is favorable to the growth of the crystals, and is not based on the generation of a second harmonic. Therefore, the devices disclosed in these studies are not constructed so that the reflectors transmit the second harmonic.

In addition, since technology does not exist for generating the second harmonic using a frequency-doubled FCSEL, there has been no attempt to take a phase-match for second harmonic generation. Further, as described above if a second harmonic generating device is constructed such that the [100] direction of the semiconductor crystals within the folded cavity makes an angle of 5° or more with respect to the direction of the light rays (i.e., the bearing of the substrate surface), or such that any one of the [100], [211], or [100] bearings of the crystals within the cavity roughly matches the direction of the light rays, it is possible to make a highly efficient extraction of the second harmonic.

In addition, if material with a large non-linear coefficient, such as GaAs, etc., is used as a zinc blend structure crystal, then an even higher generation efficiency of the second harmonic achievable. Further, regarding generation of the second harmonic, when a phase-match is not taken inside the cavity, then the second harmonic generation is not very efficient due to negative phase interference, etc. Moreover, in order to prevent this the present invention provides a phase-matching layer constructed using material elements taken from columns III–V or columns II–VI to form a compound semiconductor material used to comprised two superlattice structures, which is to be constructed between the present invention's two active-regions, or between the present invention's active region and top reflector. Further, a variety of methods may be utilized to create the phase-matching layer according to the present invention, including a method, which modulates the value of the non-linear coefficient, and a method, which inverts the sign—etc.

Moreover, when phase-matching is done by modulation of the non-linear coefficient, the superlattice structure is alternately laminated with different compositions, i.e., an III–V compound semiconductor (such as AlGaAs, InGaAs, AlGaInP, GaInAsP, etc.), and a II–VI group compound semiconductor (such as ZnCdSSe, ZnSSe, ZnCdS, etc.) In this manner, it is possible to reduce the negative phase interference of the second harmonic. When creating a phase-matching layer using an II–VI compound semiconductor, it is possible from its high transmission of the second harmonic to widen the thickness of the phase-matching layer to a degree (e.g., about 30-$\mu$m) allowable by the fabrication process and which supports the lasing of the fundamental wave in the surface emitting laser.

Furthermore, it is further possible to form the spacer-layer at the second harmonic output side, as well as active-regions and both of the spacer-layers, using a superlattice of an III–V compound semiconductor functioning as a phase-matching layer. In such a case, when the number of laminations used to comprise the superlattice is increased the efficiency of generation of the second harmonic is improved. Further, the following is a more concrete description of the above principle. Along with the two fundamental waves (for example a wavelength $\lambda_1=870$-nm) the second harmonic (i.e., blue light with a wavelength of $\lambda_2=\lambda_1/2$) is also generated inside the frequency-doubled FCSEL's folded cavity.

Furthermore, as the fundamental waves are reflected inside the frequency-doubled FCSEL's folded cavity between a reflector with a high reflectivity for the fundamental wave (for example a reflectivity of 99% or over) and a cavity folding waveguide prism, the power of the wave becomes higher. On the other hand, the second harmonic is emitted out of the device by the output terminal reflector, which transmits the second harmonic (for example with a transmissivity of 50% or over). Moreover, the power of the fundamental waves is rather high in a vertical cavity surface emitting laser. The efficiency, however, of generation of the second harmonic is proportional efficiency, however, of generation of the second harmonic is proportional to the power of the two fundamental waves, and thus a high-power second harmonic is generated. Additionally, when the second harmonic is not phase-matched inside the cavity the generated light is not efficiently amplified. It is therefore favorable to include a phase-matching layer inside the frequency-doubled FCSEL's folded cavity, or to have the spacer-layer and the active-layer composed of a superlattice co-functioning as a phase-matching layer. Therefore, a frequency-doubled FCSEL provided in accordance with the present invention generates a second harmonic with high efficiency.

In addition, the method of modulation used for the non-linear coefficient described above is based upon the non-linear coefficient changes in a rectangular shape and each layer takes one half of the phase shift (a phase shift occurring between a second harmonic wave that is propagating and a second harmonic wave that is being generated); other ways of modulation may be used—for example, the modulation of a continuously changing non-linear coefficient or each layer not taking one half of the phase shift, etc.; as long as negative phase interference can be effectively prevented.

Furthermore, due to the finite thickness of the phase-matching layers, the period of modulation for the non-linear coefficient has a broad spectrum and accompanies a corresponding tolerance. It is also possible to introduce a super-lattice structure into the spacer-layer or the active-layer in order to fulfill the phase-matching condition, combining the function of these layers with that of the phase-matching layer (they may also be utilized as the phase-matching layer).

Consequently, by utilizing (i) the spacer-layer, (ii) the spacer-layer or the active-layer on the second harmonic output side, and (iii) both the spacer-layer and active-layer combined as the phase-matching layer, it is possible to reduce the thickness of the phase-matching layer or eliminate it altogether. Further, an additional embodiment of the present invention employs both a spacer-layer and an active-layer as the phase-matching layer. In this case, the thickness of the layer functioning as the phase-matching layer is adjusted to be a few times as great as the reciprocal of the absorption coefficient.

As explained above, introduction of the superlattice being used as the phase-matching layer into the spacer-layer or one of the two the active-layers can cause an increase in the electrical resistance of the laser-diode, resulting in a trade-off with efficiency of the second harmonic generation. Nevertheless, the following statements are true:

(a) A phase-matching layer such as the one described above either becomes unnecessary or may be constructed more thinly, and (b) Absorption loss of the fundamental wave is reduced due to well-unified modes.

Furthermore, a superlattice composed of two types of AlGaAs with different contents of Aluminum (i.e., an $Al_xGa_{1-x}As/Al_yGa_{1-y}As$—superlattice, x=y, etc.) is used for the spacer-layers, while a superlattice composed of GaAs and AlGaAs (i.e., a $GaAs/Al_zGa_{1-z}As$—superlattice) is used for the active-layer. Moreover, when the active-layer is AlGaAs, it is formed by a superlattice composed of two types of AlGaAs with different contents of Aluminum.

In addition, there are relative possibilities with regard to the present invention's choice of light emitting active-regions, one of which is the frequency-doubled FCSEL's novel approach to a double-heterostructure semiconductor LED design 36 (FIGS. 7, 8, 9, 10, and 11), which is based upon a structural enhancement of its cladding-layer design, and effectively increases the amount of recombined 'electron/hole' radiation, or what is generally called 'radiative recombination' that occurs within the frequency-doubled FCSEL's active-region 36B (FIGS. 7, 8, 9, 10, and 11).

Furthermore, the present frequency-doubled FCSEL invention, as illustrated in FIG. 9, effectively displays a sectional view of the frequency-doubled FCSEL's many different layers of semiconductor and optical materials used in the frequency-doubled FCSEL's construction. Moreover, the previously mentioned layers used to construct a frequency-doubled FCSEL's double-heterostructure LED active-region, a frequency-doubled FCSEL's polyhedral prism waveguide, and a frequency-doubled FCSEL's quarterwave mirror-stack assembly, are altogether built-up layer-upon-layer, using various well-known methods of epitaxial and sputtered deposition.

For example, the layers of optical and semiconductor materials that make up a frequency-doubled FCSEL device can be constructed by using the widely excepted methods of material deposition like MBE, MOCVD, and/or what is generally referred to by those well versed in the art as Sputtering.

The present frequency-doubled FCSEL invention, as illustrated in FIGS. 7, 8, and 9, is generally an index-guided semiconductor surface emitting laser that has totally eliminated substrate positioned multilayered quarterwave mirror-stack assemblies typically found in prior-art VCSEL design 24, 32 (FIG. 3), and replaced it with a single layered polyhedral shaped waveguide structure 87 (FIGS. 19A and 19B), 34 (FIGS. 20A and 20B), 90 (FIGS. 21A and 21B).

However, regardless of any changes that might be made to a semiconductor laser's optical cavity, light amplifying processes via stimulated-emission can only occur within any semiconductor laser, if the fundamental light-waves produced by the laser's diode 28 (FIG. 3), 36, 40 (FIGS. 7, 8, 9, 10, and 11) are made to oscillate between two light reflecting structures 24, 32 (FIG. 3), 34, 38 (FIGS. 7, 8, 9, 10, and 11), each being contra-positioned at opposite ends of an optical cavity's active-region 28 (FIG. 3) 36, 40 (FIGS. 7, 8, 9, 10, and 11).

Moreover, the present frequency-doubled FCSEL invention, as illustrated in FIGS. 7, 8, and 9, amplifies light (via the process of stimulated-emission) when light-waves produced by its active-regions 36, 40 (FIGS. 7, 8, 9, 10, and 11) are made to oscillate between the previously mentioned light reflecting structures 34, 38 (FIGS. 7, 8, 9, 10, and 11). Consequently, as the previously mentioned oscillations occur light-waves pass through the previously mentioned optical cavity's active-region 36, 40 (FIGS. 7, 8, 9, 10, and 11), and the multiple quantum-well structures that make-up the active-regions' active-area 36B, 40B (FIGS. 7, 8, 9, 10, and 11).

However, within the present frequency-doubled FCSEL invention, the previously mentioned light-wave oscillations do not occur between two contra-reflecting mirror structures located at opposite ends of an optical cavity's active-region 24, 32 as illustrated in FIGS. 1, 2, and 3, but occur only between a single light reflecting structure 42 (FIGS. 7, 8, 9, 10, and 11), which is located at only one end of the frequency-doubled FCSEL's optical cavity's two active-regions 36, 40 (FIGS. 7, 8, 9, 10, and 11), (FIG. 10).

For example, the present frequency-doubled FCSEL invention, by replacing a substrate 22 (FIG. 3) positioned and total reflecting quarterwave mirror-stack assembly 24 (FIG. 3) with a single total internal reflecting polyhedral prism waveguide 87 (FIGS. 19A and 19B), 34 (FIGS. 20A and 20B), 90 (FIGS. 21A and 21B) the optical cavity of the frequency-doubled FCSEL is folded backwards a 180° upon itself; whereby, light-waves of fundamental light created by the frequency-doubled FCSEL's active-regions 36, 40 (FIGS. 7, 8, 9, 10, and 11) are made to oscillate, using a folded optical cavity, back and forth through the active-regions' active-areas 36B, 40B (FIGS. 7, 8, 9, 10, and 11), between a single partial-reflecting structure 42 (FIGS. 7, 8, 9, 10, and 11).

Furthermore, the oscillating light-waves that occur within a frequency-doubled FCSEL's folded optical cavity, while propagating through the frequency-doubled FCSEL's polyhedral shaped prism waveguide 87 (FIGS. 19A and 19B), 34 (FIGS. 20A and 20B), 90 (FIGS. 21A and 21B), will have angles of incidence that are equal to or greater than the critical angle of internal reflection for the polyhedral prism waveguide's prism facets 34A, 34B, 34C, which are located at the base of every frequency-doubled FCSEL polyhedral prism waveguide 87 (FIGS. 19A and 19B), 34 (FIGS. 20A and 20B), 90 (FIGS. 21A and 21B).

Moreover, the oscillating light-waves 80A (FIG. 18) that propagate 80B in a direction away from the frequency-doubled FCSEL's active-region 36 (FIGS. 7, 8, 9, 10, and 11) into the frequency-doubled FCSEL's polyhedral prism waveguide 87 (FIGS. 19A and 19B), 34 (FIGS. 20A and 20B), 90 (FIGS. 21A and 21B) are ultimately turned and redirected by a prism facet 34A (FIGS. 7, 8, 9, 10, and 11) of the polyhedral prism waveguide 34 (FIGS. 7, 8, 9, 10, and 11) into a first transverse horizontal direction 80A (FIG. 18) until they are turned and redirected again by a second prism facet 34B (FIGS. 7, 8, 9, 10, and 11) into a second transverse horizontal direction 80B, until they are turned and redirected again by a third prism facet 34C (FIGS. 7, 8, 9, 10, and 11) of the polyhedral prism waveguide 34, but into a longitudinal vertical direction 80C (FIG. 18) toward the frequency-doubled FCSEL's active-regions 36, 40 (FIGS. 7, 8, 9, 10, and 11).

Whereby, oscillating light-waves 80F (FIG. 18) propagating toward the frequency-doubled FCSEL's first light reflecting structure 42 (FIGS. 7, 8, 9, 10, and 11) will stimulate further emission as they pass through the active-regions' active-areas 36B, 40B (FIGS. 7, 8, 9, 10, and 11), until they reach the frequency-doubled FCSEL's first partial-reflecting structure 42, where they 80F will be made to start a new oscillation cycle. Moreover, creating an optical cavity that is folded backward upon itself, which is capable during light-wave oscillation of the amplification of fundamental diode produced light via the process of stimulated-emission.

Furthermore, as illustrated in FIGS. 13, 14, 15, 16, 17, and 18, a frequency-doubled FCSEL's polyhedral prism waveguide 87 (FIGS. 19A and 19B), 34 (FIGS. 20A and 20B), 90 (FIGS. 21A and 21B) are constructed as monolithic polyhedral shaped devices, and are conducive to the total internal reflection of intracavity produced optical radiation using an optical material with an absolute lattice mismatch to other semiconductor materials used in the construction of the frequency-doubled FCSEL's remaining semiconductor layers.

Therefore, within the frequency-doubled FCSEL design, an internal reflecting polyhedral prism waveguide 87 (FIGS. 19A and 19B), 34 (FIGS. 20A and 20B), 90 (FIGS. 21A and 21B), which redirect all optical radiation entering its top plane-parallel and flat horizontal front-face surface 87C, 34D, 90B backwards toward the frequency-doubled FCSEL's first partially reflecting quarterwave mirror-stack assembly 42 (FIGS. 7, 8, 9, 10, and 11). Moreover, as illustrated in FIGS. 2 13, 14, 15, 16, 17, and 18, a frequency-doubled FCSEL's polyhedral prism waveguide 87 (FIGS. 19A and 19B), 34 (FIGS. 20A and 20B), 90 (FIGS. 21A and 21B), if constructed from $SiO_2$ or some other suitable frequency-specific material, will promote the redirected transmission of all optical radiation incidental upon its top plane-parallel and flat horizontal front-face surface.

Furthermore, depending upon the optical material used to construct a frequency-doubled FCSEL's polyhedral prism waveguide 87 (FIGS. 19A and 19B), 34 (FIGS. 20A and 20B), 90 (FIGS. 21A and 21B) it will have the capability of transmitting all optical radiation having wavelengths that range from the ultraviolet (i.e., having a wavelength of 105-nm) to the far infrared (i.e., having a wavelength of 10,000-nm).

Although the frequency-doubled FCSEL invention has been described in detail with references to specific embodiments, various modifications can be made without departing from the scope of the invention.

For example, in order to increase the energy, while decreasing the wavelength per photon of emitted light, the active-regions 36, 40 (FIGS. 7, 8, 9, 10, and 11) could contain Phosphorus in an amount that will form a lattice-matched quaternary (InGaAsP) "Indium-Gallium-Arsenic-Phosphide" based material, while another option could be that the frequency-doubled FCSEL's first quarterwave mirror-stack assembly 42 (FIGS. 7, 8, 9, 10, and 11), could be comprised of alternating layers of binary (AlAs) "Aluminum-Arsenide" and ternary (InGaP) "Indium-Gallium-Phosphide" materials, where the choice between one semiconductor or optical material over another for constructing the first quarterwave mirror-stack assembly 42 (FIGS. 7, 8, 9, 10, and 11) of the frequency-doubled FCSEL is frequency determined rather than structurally.

Furthermore, the various semiconductor and optical materials, along with their distribution sizes are frequency specific and interchangeable within this design; indicating that the frequency-doubled FCSEL design has novelty that is independent of any one kind of material or any one kind of material size that could or might be used in its construction. Consequently, the present invention produces the following effects:

(a) A second harmonic may be emitted from a surface emitting device with high efficiency. Additionally, a wavelength from green to violet may be generated. Further, a wavelength from red to ultraviolet may be generated by modifying the materials, the substrate orientation, and the composition of the reflectors.

(b) A second harmonic generating device having a small size, low energy consumption, and low manufacturing cost may be provided by utilizing the inherent advantages of the frequency-doubled FCSEL. Consequently, since a circular, single mode second harmonic may be generated, it may be efficiently coupled into fibers, etc. Additionally, multiple devices can be easily arrayed, and it is possible to emit different monochrome wavelengths from each of the arrayed devices.

Although the present invention has been described herein with respect to certain embodiments, those of ordinary skill in the art will recognize that many modifications and variations of the present invention may be implemented. For example, the materials and processes disclosed are illustrative, but are not exhaustive. Other materials and processes may also be used to make devices embodying the present invention. In addition, the described sequences of the processing may also be varied. The foregoing description and the following claims are intended to cover all such modifications and variations.

What is claimed is:

1. A surface emitting laser, comprising:
    first and second active regions, wherein each active region includes:
        a first graded confinement cladding layer;
        a second graded confinement cladding layer; and
        an active gain area between the first and second graded confinement cladding layers;
    an internally reflecting reflector assembly adjacent the first active region; and
    a first semiconductor superlattice structure adjacent the second active region for doubling the frequency of intra-cavity photonic radiation of the surface emitting laser.

2. The surface emitting laser of claim 1, wherein the internally reflecting reflector assembly includes a corner-cube prism waveguide.

3. The surface emitting laser of claim 1, further comprising at least one mirror stack adjacent the semiconductor superlattice structure.

4. The surface emitting laser of claim 1, wherein the first and second active regions each include a double-heterojunction diode structure.

5. The surface emitting laser of claim 1, wherein the first semiconductor superlattice structure is between the first and second active regions.

6. The surface emitting laser of claim 5, further comprising a second semiconductor superlattice structure, wherein the second active region is between the first and second semiconductor superlative structures.

7. The surface emitting laser of claim 5, further comprising a first quarter-wave mirror stack assembly adjacent the second active region.

8. The surface emitting laser of claim 7, further comprising a second quarter-wave mirror stack assembly adjacent the first quarter-wave mirror stack assembly.

9. The surface emitting laser of claim 8, further comprising a second semiconductor superlattice structure adjacent the second quarter-wave mirror stack assembly.

10. The surface emitting laser of claim 9, further comprising a third quarter-wave mirror stack assembly adjacent the second semiconductor superlattice structure.

11. The surface emitting laser of claim 5, wherein the each of the active gain areas of the first and second active areas includes a multi-quantum well.

12. The surface emitting laser of claim 11, wherein:
    the first graded confinement layer of the first active region includes an upper surface and a lower surface, wherein the upper surface is adjacent the active gain area of the first active region and the lower surface is adjacent the internally reflecting reflector assembly, and wherein the first graded confinement layer includes Gallium-Aluminum-Arsenide, wherein the concentration of Gallium increases from the lower surface to the upper surface and the concentration of Aluminum decreases from the lower surface to the upper surface; and
    the second graded confinement layer of the first active region includes an upper surface and a lower surface, wherein the upper surface is adjacent the first semiconductor superlattice structure and the lower surface is adjacent the active gain area of the first active region, and wherein the second graded confinement layer includes Gallium-Aluminum-Arsenide, wherein the concentration of Gallium increases from the upper surface to the lower surface and the concentration of Aluminum decreases from the upper surface to the lower surface.

13. The surface emitting laser of claim 12, wherein:
    the first graded confinement layer of the second active region includes an upper surface and a lower surface, wherein the upper surface is adjacent the active gain area of the second active region and the lower surface is adjacent the first semiconductor superlattice structure, and wherein the first graded confinement layer includes Gallium-Aluminum-Arsenide, wherein the concentration of Gallium increases from the lower surface to the upper surface and the concentration of Aluminum decreases from the lower surface to the upper surface; and
    the second graded confinement layer of the second active region includes an upper surface and a lower surface, wherein the lower surface is adjacent the active gain area of the second active region and the upper surface is opposite the lower surface, and wherein the second graded confinement layer includes Gallium-Aluminum-Arsenide, wherein the concentration of Gallium increases from the upper surface to the lower surface and the concentration of Aluminum decreases from the upper surface to the lower surface.

14. The surface emitting laser of claim 13, further comprising a first quarter-wave mirror stack assembly adjacent the second active region.

15. The surface emitting laser of claim 14, further comprising a second quarter-wave mirror stack assembly adjacent the first quarter-wave mirror stack assembly.

16. The surface emitting laser of claim 15, further comprising a second semiconductor superlattice structure adjacent the second quarter-wave mirror stack assembly.

17. The surface emitting laser of claim 16, further comprising a third quarter-wave mirror stack assembly adjacent the second semiconductor superlattice structure.

18. The surface emitting laser of claim 17, further comprising:
    a first negative contact layer between the internally reflecting reflector assembly and the first active region;
    a first positive contact layer between the first active region and the first semiconductor superlattice structure;
    a second positive contact layer between the first semiconductor superlattice structure and the second active region; and
    a second negative contact layer between the second active region and the second semiconductor superlattice structure.

19. The surface emitting laser of claim 18, wherein the internally reflecting reflector assembly includes a corner-cube prism waveguide.

20. The surface emitting laser of claim 19, wherein:
    the multi-quantum well of the first active region includes interleaved layers of Gallium-Arsenide and Gallium-Aluminum-Arsenide; and
    the multi-quantum well of the second active region includes interleaved layers of Gallium-Arsenide and Gallium-Aluminum-Arsenide.

21. The surface emitting laser of claim 20, wherein the first semiconductor superlattice structure includes interleaved layers of Aluminum-Gallium-Arsenide where the concentration of Aluminum is between 50% and 90% and layers of Aluminum-Gallium-Arsenide where the concentration of Aluminum is between 10% and 50%.

22. The surface emitting laser of claim 21, wherein the second semiconductor superlattice structure includes interleaved layers of Aluminum-Gallium-Arsenide where the concentration of Aluminum is between 50% and 90% and layers of Aluminum-Gallium-Arsenide where the concentration of Aluminum is between 10% and 50%.

23. The surface emitting laser of claim 2, wherein the corner-cube prism waveguide includes fused silica.

24. The surface emitting laser of claim 23, wherein the corner-cube prism waveguide includes a right-angle prism shaped polyhedral prism waveguide.

25. The surface emitting laser of claim 23, wherein the corner-cube prism waveguide includes a conical shaped polyhedral prism waveguide.

26. The surface emitting laser of claim 1, wherein the internally reflecting reflector assembly includes a roof prism waveguide.

27. The surface emitting laser of claim 1, wherein the internally reflecting reflector assembly includes a cone prism waveguide.

28. A device, comprising an array of surface emitting lasers, wherein each surface emitting laser includes:
   first and second active regions, wherein each active region includes:
      a first graded confinement cladding layer;
      a second graded confinement cladding layer; and
      an active gain area between the first and second graded confinement cladding layers;
   an internally reflecting reflector assembly adjacent the first active region; and
   a first semiconductor superlattice structure adjacent the second active region for doubling the frequency of intra-cavity photonic radiation of the surface emitting laser.

29. The array of claim 28, wherein the internally reflecting reflector assembly includes a corner-cube prism waveguide.

30. The array of claim 28, wherein the internally reflecting reflector assembly includes a roof prism waveguide.

31. The array of claim 28, wherein the internally reflecting reflector assembly includes a cone prism waveguide.

32. The array of claim 28, wherein the first semiconductor superlattice structure is between the first and second active regions.

33. The array of claim 32, further comprising a second semiconductor superlattice structure, wherein the second active region is between the first and second semiconductor superlattice structures.

* * * * *